(12) United States Patent
Nishiki et al.

(10) Patent No.: US 7,586,131 B2
(45) Date of Patent: Sep. 8, 2009

(54) TRANSISTOR ARRAY AND ACTIVE-MATRIX SUBSTRATE

(75) Inventors: Hirohiko Nishiki, Kashiba (JP); Kazuki Kobayashi, Izumi (JP)

(73) Assignee: Sharp Kabushiki Kaisha, Osaka (JP)

( * ) Notice: Subject to any disclaimer, the term of this patent is extended or adjusted under 35 U.S.C. 154(b) by 381 days.

(21) Appl. No.: 11/042,406

(22) Filed: Jan. 25, 2005

(65) Prior Publication Data
US 2005/0127455 A1 Jun. 16, 2005

Related U.S. Application Data

(63) Continuation of application No. 10/389,883, filed on Mar. 18, 2003, now Pat. No. 6,885,028.

(30) Foreign Application Priority Data

Mar. 25, 2002 (JP) ............... 2002-082590

(51) Int. Cl.
*H01L 29/74* (2006.01)
(52) U.S. Cl. ............... 257/202; 257/624; 257/E29.143; 257/E21.046; 257/E21.062
(58) Field of Classification Search ................. 349/143, 349/43; 324/754; 257/72, 202, 624, E29.143, 257/E21.046, E21.062; 174/2
See application file for complete search history.

(56) References Cited

U.S. PATENT DOCUMENTS

| | | | |
|---|---|---|---|
| 3,953,925 A | | 5/1976 | Wilson |
| 4,605,814 A | * | 8/1986 | Gillem ............................ 174/2 |
| 5,285,301 A | | 2/1994 | Shirahashi et al. .......... 349/143 |
| 5,892,558 A | * | 4/1999 | Ge et al. ........................ 349/43 |
| 6,429,057 B1 | | 8/2002 | Hong et al. |
| 6,529,258 B2 | | 3/2003 | Watanabe et al. |
| 6,531,392 B2 | | 3/2003 | Song et al. |
| 6,539,616 B1 | | 4/2003 | Nakahira et al. |

(Continued)

FOREIGN PATENT DOCUMENTS

CN 1251914 A 5/2000

(Continued)

OTHER PUBLICATIONS

Official Communication dated Nov. 18, 2005, issued in the corresponding Chinese Patent Application No. 03107395.6.

*Primary Examiner*—Leonardo Andújar
*Assistant Examiner*—Monica D Harrison
(74) *Attorney, Agent, or Firm*—Keating & Bennett, LLP

(57) ABSTRACT

A transistor array includes conductor lines, function lines, and transistors. Each of the conductor lines includes a core and a conductor layer that covers the core. Each of the function lines includes a core, at least the surface of which is electrically conductive, an insulating layer that covers the core, and a semiconductor layer that covers the insulating layer. Each of the function lines contacts with, and crosses, the conductor lines. Each of the transistors includes a first ohmic contact region, which is defined by a region where one of the conductor lines crosses one of the function lines and which makes an ohmic contact with the semiconductor layer, a second ohmic contact region, which also makes an ohmic contact with the semiconductor layer, and a channel region, which is defined in the semiconductor layer between the first and second ohmic contact regions.

8 Claims, 33 Drawing Sheets

U.S. PATENT DOCUMENTS

| | | |
|---|---|---|
| 6,603,259 B1 | 8/2003 | Kiryuschev et al. |
| 6,630,688 B2 * | 10/2003 | Kong et al. ............. 257/72 |
| 6,661,563 B2 | 12/2003 | Hayashi et al. |
| 6,693,301 B2 * | 2/2004 | Takemura ............. 257/72 |
| 6,741,087 B2 * | 5/2004 | Kimura et al. ........... 324/754 |
| 6,831,318 B2 | 12/2004 | Yonekura et al. |
| 2001/0047584 A1 | 12/2001 | Kawamura et al. |
| 2002/0106847 A1 | 8/2002 | Kazlas et al. |

FOREIGN PATENT DOCUMENTS

| | | |
|---|---|---|
| CN | 1257304 A | 6/2000 |
| CN | 1280308 A | 1/2001 |
| JP | 09-203910 | 8/1997 |
| JP | 09-266315 | 10/1997 |
| JP | 10-091097 | 4/1998 |

* cited by examiner

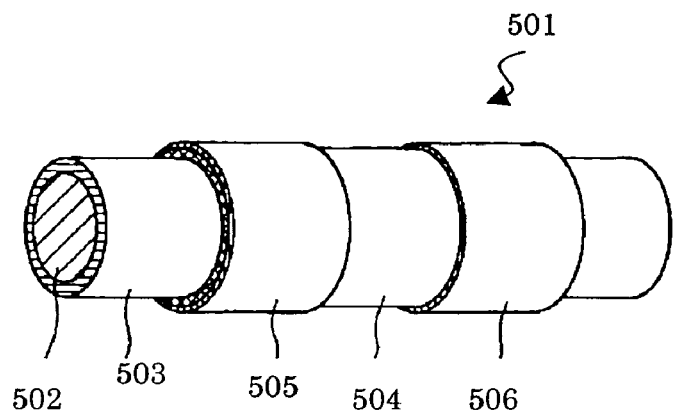
*FIG.63A*
PRIOR ART
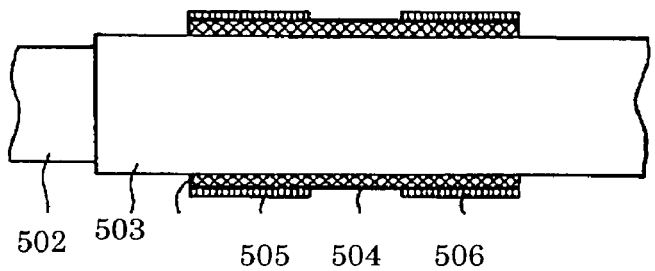
*FIG.63B*
PRIOR ART
*FIG.64*
PRIOR ART
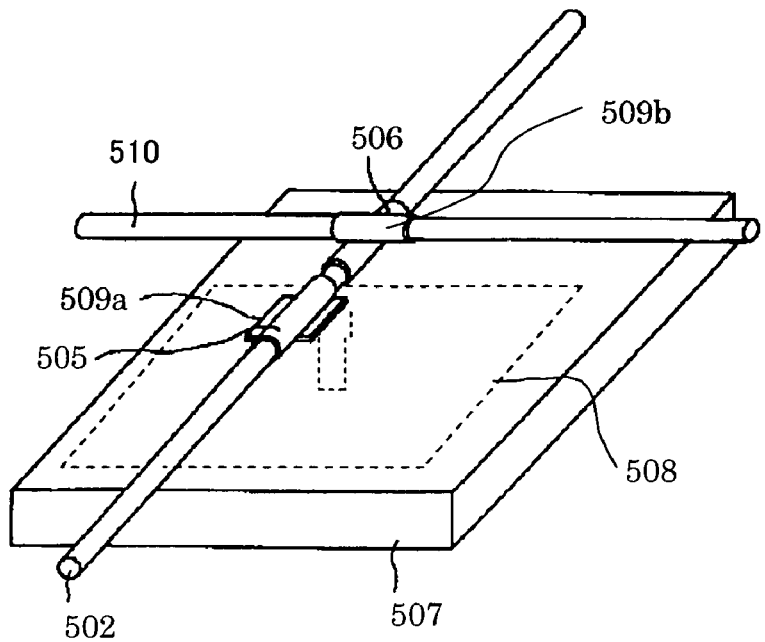

US 7,586,131 B2

TRANSISTOR ARRAY AND ACTIVE-MATRIX SUBSTRATE

This application is a Continuation of U.S. patent application Ser. No. 10/389,883 filed Mar. 18, 2003, now U.S. Pat. No. 6,885,028.

BACKGROUND OF THE INVENTION

1. Field of the Invention

The present invention relates to a transistor array for use in a liquid crystal display, an organic EL display, an x-ray sensor, a memory and other electronic apparatuses, and also relates to an active-matrix substrate including such a transistor array and a display device including the active-matrix substrate. The present invention further relates to a jig assembly used for making the transistor array and a method of fabricating the transistor array.

2. Description of the Related Art

An active-matrix-addressed liquid crystal display (LCD), which uses thin-film transistors (TFTs) as its switching elements, achieves a display quality which is at least comparable to, and often superior to, that of the conventional cathode-ray tube (CRT) display. Also, an active-matrix-addressed LCD is a thin and lightweight display device that realizes a high resolution with significantly reduced power dissipation. Furthermore, an active-matrix-addressed LCD is also implementable as a display device with a huge screen. Having all of these advantageous features, the active-matrix-addressed LCD is currently being popularized rapidly in various fields of applications and is expected to be a next-generation image display device that replaces the conventional CRT in the very near future. Meanwhile, an organic EL display, which uses an organic electroluminescent material as a display medium, has also attracted much attention in the art recently and is also considered to be among potential next-generation image display devices.

Recently, these next-generation image display devices are not just used as alternatives to the conventional CRTs but are also the objects of vigorous research and development to realize so-called "electronic paper". That is to say, these display devices are currently under modification so as to provide replacements for conventional paper-printed materials. For that purpose, those image display devices should be made as "flexible displays", which never experience failure even when folded or rolled and which are readily portable at any time.

To make such a flexible display by conventional manufacturing technologies that have been applied to fabricate an LCD or an organic EL display, glass, which has been used extensively as a substrate material, needs to be replaced with some elastic substrate material that is deformable even at room temperature (e.g., plastic or stainless steel). However, such an elastic material poorly resists the heat. For example, when exposed to intense heat, a plastic substrate may deteriorate, emit a toxic gas, or be deformed or warped excessively. Also, even if a heat-resistant plastic or stainless steel is used as a substrate material, the substrate made of such a material is also deformed or warped due to a non-negligible difference in thermal expansion coefficients between that substrate and a thin film to be deposited on the substrate. Accordingly, to avoid these unwanted situations, a substrate made of such a poorly heat resistant material should not be exposed to heat in excess of about 200° C.

However, some of the conventional manufacturing and processing steps that have been carried out to fabricate an image display device require a processing temperature that exceeds about 200° C. For example, in the manufacturing and processing step of making an amorphous silicon TFT, which is used as a switching element for an image display device, the gate insulating film and amorphous silicon film of the TFT are normally formed at temperatures exceeding about 300° C. Accordingly, if the heat resistant plastic or stainless steel is used as a substrate material, the conventional manufacturing process cannot be used as it is.

Stated otherwise, the plastic or stainless steel may be used as a substrate material for an image display device if the gate insulating film and amorphous silicon film of the amorphous silicon TFT can be formed at temperatures of less than about 200° C. In that case, however, a high quality gate insulating film or amorphous silicon film (e.g., a film exhibiting good dielectric strength, in particular) is very hard to obtain. Also, when a TFT is made of those poor quality films, the threshold value of the TFT will change significantly after long hours of operation.

Recently, an LCD that uses polysilicon TFTs as its switching elements has been researched and developed vigorously. An image display device of this type is partly characterized by providing a circuit for controlling a drive signal for the display device on a glass substrate. Thus, compared to the LCD that uses amorphous silicon TFTs as its switching elements, the LCD including the polysilicon TFTs achieves a higher resolution.

In an LCD including polysilicon TFTs, however, the driver thereof (e.g., a CMOS inverter) needs to be made of a polysilicon with an electron mobility typically exceeding about 100 cm$^2$/V·S. It is not easy to deposit such a polysilicon on a glass substrate. For example, the silicon on the glass substrate should be fused with the temperature of the glass substrate maintained at about 600° C. or less by some special technique such as a laser annealing process. Accordingly, it is difficult to apply the technique requiring such a high-temperature process to an image display device that uses plastic or stainless steel as a substrate material.

To overcome these problems, Japanese Laid-Open Publication No. 10-91097 discloses a display device including a string of transistors. In the transistor string, a number of transistors are arranged along the length of a conductor core on which an insulating film, a silicon film and an n$^+$-type ohmic contact layer are stacked in this order. In this technique, the gate insulating film and the silicon film that require high-temperature processing are included in the transistor string, which is bonded onto a substrate after those films have been stacked on the conductor core. Thus, the substrate is never exposed to heat. For that reason, a substrate having a low distortion point (e.g., a plastic substrate) may be used.

Japanese Laid-Open Publication No. 9-203910 also discloses a similar technique of making a display device by using a string of transistors that are arranged along the length of a metal core. FIGS. 63A and 63B show one of the TFTs 501 disclosed in Japanese Laid-Open Publication No. 9-203910. As shown in FIGS. 63A and 63B, the TFT 501 includes a metal core 502, an insulating film 503 that covers the metal core 502, an amorphous silicon layer 504 that covers the insulating film 503, and a source electrode 506 and a drain electrode 505 on the amorphous silicon layer 504. Although not shown in FIG. 63A or 63B, a number of such TFTs 501 are arranged along the length of the metal core 502.

FIG. 64 illustrates how the TFT 501 shown in FIGS. 63A and 63B may be used as a switching element for an active-matrix substrate. As shown in FIG. 64, a pixel electrode 508 on the back surface of a substrate 507 is connected to an electrode 509a by a metal connecting member, and the electrode 509a is electrically in contact with the drain electrode 505 of the TFT 501. Also, a source line 510 having an electrode 509b is arranged so as to cross, and be electrically connected to, the source electrode 506 of the TFT 501.

In the active-matrix substrate shown in FIG. 64, the transistor string needs to be disposed such that the electrode 509a on the substrate 507 is accurately aligned with the drain electrode 505 of the TFT 501. To make an active-matrix substrate, normally hundreds of transistor strings need to be arranged. Also, each of those transistor strings includes hundreds of TFTs 501. Accordingly, in each of those hundreds of TFTs 501 included in a single transistor string, the drain electrode 505 thereof needs to be accurately aligned with its associated electrode 509a. It is also necessary to accurately align the electrode 509b of the source line 510 with the source electrode 506 of each TFT 501.

To carry out these alignments, the transistor strings and the source lines 510 need to be arranged accurately with respect to the substrate 507. Thus, the positioning accuracy to be achieved in such an alignment process is far inferior to the accuracy to be achieved by the conventional photolithographic process. For that reason, it is very difficult to prepare an active-matrix substrate by the conventional method described above.

SUMMARY OF THE INVENTION

In order to overcome the problems described above, preferred embodiments of the present invention provide a transistor array that is obtained by arranging multiple transistors in columns and rows so as to be accurately positioned relative to each other on a substrate which is deformable elastically at room temperature without having to perform any aligning steps, and also provide an active-matrix substrate including such a transistor array and a display device including the active-matrix substrate. Preferred embodiments of the present invention further provide a jig assembly used to make the transistor array and a method of fabricating the transistor array.

A transistor array according to a preferred embodiment of the present invention preferably includes a plurality of conductor lines, a plurality of function lines, and a plurality of transistors. Each of the conductor lines preferably includes a core and a conductor layer that covers the core. Each of the function lines preferably includes a core, at least the surface of which is electrically conductive, an insulating layer that covers the surface of the core, and a semiconductor layer that covers the surface of the insulating layer. Each of the function lines preferably contacts with, and crosses, the conductor lines. Each of the transistors preferably includes a first ohmic contact region, a second ohmic contact region, and a channel region. The first ohmic contact region is preferably defined in a region where one of the conductor lines crosses an associated one of the function lines and preferably makes an ohmic contact with the semiconductor layer. The second ohmic contact region also preferably makes an ohmic contact with the semiconductor layer. The channel region is preferably defined in the semiconductor layer by and between the first and second ohmic regions.

According to preferred embodiments of the present invention, the first and second ohmic contact regions are automatically or inherently aligned with the source lines by virtue of the first and second ohmic contact regions being defined by a region where each respective one of the source lines crosses an associated one of the function lines. For that reason, there is no need to perform any additional processing steps required in the prior art for aligning each of the first and second ohmic contact regions or layers with the source lines, or more generally, aligning each of the function lines with the source lines. In this sense, the first and second ohmic contact regions are "self-aligned" in that they do not require any alignment process at all since the accurate positioning of the first ohmic contact region and the second ohmic contact region is automatically or inherently achieved by the crossing of the source lines and function lines.

In a specific preferred embodiment of the present invention, the first and second ohmic contact regions may be defined by first and second ohmic contact layers.

In one preferred embodiment of the present invention, the first ohmic contact layer may be provided between the semiconductor layer of the function line and the conductor line.

In an alternative preferred embodiment, the first ohmic contact layer may be formed in the semiconductor layer of the function line.

In another preferred embodiment, the conductor layer preferably has a melting point of about 100° C. to about 400° C.

In this particular preferred embodiment, the conductor layer preferably includes a connecting portion that covers the region where the associated conductor line crosses the associated function line.

In still another preferred embodiment, the first and second ohmic contact layers preferably sandwich the core of the function line.

In yet another preferred embodiment, the transistor preferably further includes a third ohmic contact layer, which makes an ohmic contact with the semiconductor layer, surrounds the second ohmic contact layer, and is electrically connected to the conductor layer.

In yet another preferred embodiment, the transistor array may further include a plurality of storage capacitor lines. Each of the storage capacitor lines preferably includes a core, at least the surface of which is electrically conductive, and an insulating layer that covers the surface of the core. Each of the storage capacitor lines preferably crosses the conductor lines. The function lines and the storage capacitor lines are preferably arranged alternately.

In yet another preferred embodiment, the transistor array may further include a plurality of dummy lines, at least the surface of which is electrically insulating and which crosses the function lines. The conductor lines and the dummy lines are preferably arranged alternately.

In yet another preferred embodiment, the function lines and the conductor lines are preferably woven together.

In yet another preferred embodiment, the function lines, the storage capacitor lines and the conductor lines are preferably woven together.

In yet another preferred embodiment, the function lines, the conductor lines and the dummy lines are preferably woven together.

In yet another preferred embodiment, the transistor array may further include a plurality of storage capacitor lines and a plurality of dummy lines. Each of the storage capacitor lines preferably includes a core, at least the surface of which is electrically conductive, and an insulating layer that covers the surface of the core. The storage capacitor lines preferably cross the conductor lines. At least the surface of the dummy lines is preferably electrically insulating. The dummy lines preferably cross the function lines. The function lines and the storage capacitor lines are preferably arranged alternately, and the conductor lines and the dummy lines are preferably arranged alternately.

In this particular preferred embodiment, the function lines, the storage capacitor lines, the conductor lines and the dummy lines are preferably woven together.

In yet another preferred embodiment, the transistor array may further include a protective coating that covers the function lines.

In this particular preferred embodiment, the protective coating preferably includes at least one compound that is selected from the group consisting of $SiN_x$, $SiO_2$ and SiON.

In yet another preferred embodiment, the transistor array may further include an opaque layer that covers the function lines.

A transistor array according to another preferred embodiment of the present invention preferably includes a first group of conductor lines, a second group of conductor lines, a first group of function lines, a second group of function lines, a first group of transistors, and a second group of transistors. Each of the conductor lines in the first and second groups preferably includes a core and a conductor layer that covers the core. The first and second groups of conductor lines are preferably arranged alternately. Each of the function lines in the first and second groups preferably includes a core, at least the surface of which is electrically conductive, an insulating layer that covers the surface of the core, and a semiconductor layer that covers the surface of the insulating layer. Each of the function lines preferably contacts with, and crosses, the first and second groups of conductor lines. The first and second groups of function lines are preferably arranged alternately. Each of the transistors in the first group preferably includes a first ohmic contact layer, a second ohmic contact layer and a channel region. The first ohmic contact layer is preferably defined in a region where one of the conductor lines in the first group crosses an associated one of the function lines in the first group, and preferably makes an ohmic contact with the semiconductor layer. The second ohmic contact layer also preferably makes an ohmic contact with the semiconductor layer. The channel region is preferably defined in the semiconductor layer by the first and second ohmic contact layers. Each of the transistors in the second group also preferably includes a first ohmic contact layer, a second ohmic contact layer and a channel region. The first ohmic contact layer is preferably defined in a region where associated one of the conductor lines in the second group crosses associated one of the function lines in the second group, and preferably makes an ohmic contact with the semiconductor layer. The second ohmic contact layer also preferably makes an ohmic contact with the semiconductor layer. The channel region is preferably defined in the semiconductor layer by the first and second ohmic contact layers.

In one preferred embodiment of the present invention, the first and second groups of conductor lines and the first and second groups of function lines are preferably woven together.

An active matrix substrate according to still another preferred embodiment of the present invention preferably includes the transistor array according to any of the preferred embodiments of the present invention described above, a plurality of pixel electrodes, each of which is connected to the second ohmic contact layer of an associated one of the transistors, and a structure for fixing the transistor array thereon.

An active matrix substrate according to yet another preferred embodiment of the present invention preferably includes the transistor array according to any of the preferred embodiments of the present invention described above, a first group of pixel electrodes, a second group of pixel electrodes, and a structure for fixing the transistor array thereon. Each of the pixel electrodes in the first group is preferably electrically connected to the second ohmic contact layer of associated one of the transistors in the first group. Each of the pixel electrodes in the second group is preferably electrically connected to the second ohmic contact layer of associated one of the transistors in the second group.

In one preferred embodiment of the present invention, the active-matrix substrate preferably further includes at least one light-emitting or light-guiding illumination line, which is disposed between two of the conductor lines or between one of the conductor lines in the first group and one of the conductor lines in the second group.

In this particular preferred embodiment, the illumination line preferably includes a core, at least the surface of which is electrically conductive, and a hole transport layer, a light-emitting layer, an electron transport layer and a transparent conductive layer, which are stacked in this order on the core.

A display device according to yet another preferred embodiment of the present invention preferably includes the active-matrix substrate according to any of the preferred embodiments of the present invention described above, a counter substrate, and a display medium that is sandwiched between the active-matrix substrate and the counter substrate.

A jig assembly according to yet another preferred embodiment of the present invention preferably includes a first fixing jig and a second fixing jig. The first fixing jig preferably has a frame structure that includes multiple grooves to hold a first group of fine wires at both ends thereof with a predetermined tension applied thereto. The first group of fine wires is preferably arranged at a predetermined pitch. The second fixing jig also preferably has a frame structure that includes multiple grooves to hold a second group of fine wires at both ends thereof with a predetermined tension applied thereto. The second group of fine wires is preferably arranged at another predetermined pitch. The first and second fixing jigs preferably include at least one pair of engaging portions that defines the positions of the first and second fixing jigs such that the first and second groups of fine wires cross and contact with each other.

In one preferred embodiment of the present invention, an adhesive layer or a cushion layer is preferably provided inside of the grooves of the first and second fixing jigs.

Yet another preferred embodiment of the present invention provides a method for fabricating a transistor array. The method preferably includes the step of arranging a plurality of conductor lines and a plurality of function lines such that the conductor lines and the function lines cross and contact with each other. Each of the conductor lines preferably includes a core and a conductor layer that covers the surface of the core. Each of the function lines preferably includes a core, at least the surface of which is electrically conductive, an insulating layer that covers the surface of the core, and a semiconductor layer that covers the surface of the insulating layer. The method preferably further includes the step of fixing the conductor lines onto the function lines at their intersections by melting and solidifying the conductor layer of the conductor lines.

In one preferred embodiment of the present invention, each of the function lines preferably further includes an ohmic contact layer on the surface of the semiconductor layer. In that case, the method preferably further includes the step of selectively removing the ohmic contact layer from the function lines by using, as a mask, portions of the conductor layer, which have expanded on the surface of the ohmic contact layer when the conductor layer is melted and solidified.

In another preferred embodiment of the present invention, the conductor layer preferably includes a material that either alloys with the semiconductor layer or lowers the resistance of the semiconductor layer. In that case, the step of fixing the conductor lines onto the function lines preferably includes the step of forming an ohmic contact layer in the semiconductor layer.

In yet another preferred embodiment, the step of arranging the conductor lines and the function lines preferably includes the step of weaving the conductor lines and the function lines together.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIGS. 63A and 63B are respectively a perspective view and a cross-sectional view illustrating a conventional transistor provided around a metal core.

FIG. 64 is a perspective view illustrating the structure of an active-matrix substrate including the transistor shown in FIGS. 63A and 63B.

DETAILED DESCRIPTION OF PREFERRED EMBODIMENTS

Hereinafter, a transistor array and an active-matrix substrate according to a first specific preferred embodiment of the present invention will be described.

An active-matrix substrate according to the first preferred embodiment preferably includes an array of transistors that are arranged in columns and rows, and pixel electrodes that are connected to the associated transistors. To make the structures of the transistor array and active-matrix substrate easily understandable, the first preferred embodiment of the present invention will be described following the order in which the transistor array and the active-matrix substrate are fabricated.

Figure 1:
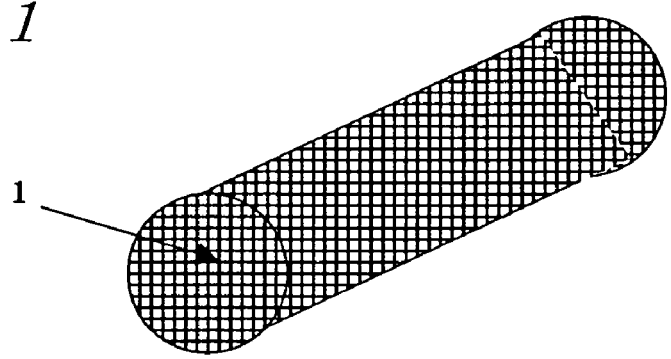
FIGS. 1 and 2 are perspective views showing two processing steps performed to make a function line for use in a first specific preferred embodiment of the present invention.
Figure 2:
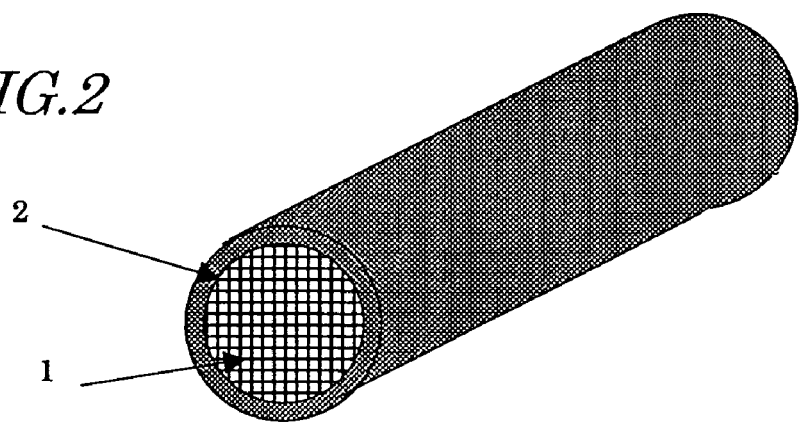
Figure 3:
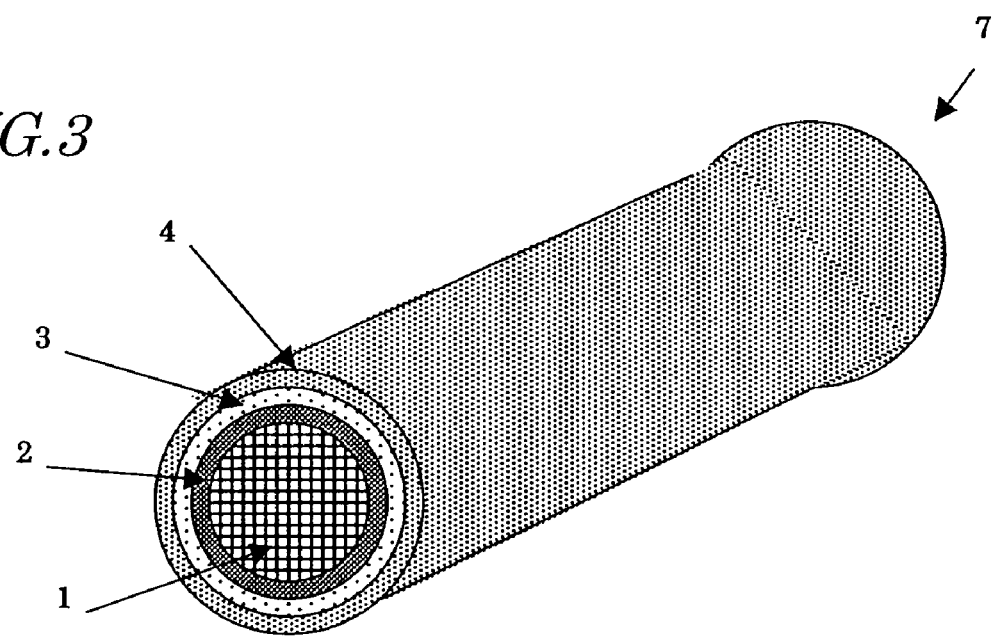
FIG. 3 is a perspective view illustrating the function line for use in the first preferred embodiment of the present invention.

First, as shown in FIGS. 1, 2 and 3, a function line 7 is prepared. The function line 7 preferably includes a core 1, at least the surface of which is electrically conductive, an insulating layer 2 that covers the surface of the core 1, a semiconductor layer 3 that covers the surface of the insulating layer 2, and an ohmic contact layer 4 that covers the surface of the semiconductor layer 3.

In FIGS. 1, 2 and 3, the core 1 is illustrated as having a substantially circular cross section. However, the cross section of the core 1 may also be substantially elliptical, substantially triangular, substantially rectangular or polygonal, for example. Also, the function line 7 shown in FIG. 3 preferably has a concentric structure. Alternatively, the function line 7 may also have an eccentric structure. Furthermore, the insulating layer 2 or the semiconductor layer 3 may cover its inner layers either entirely or just partially.

The core 1 may be either a conductor such as a metal or an electrically insulating or conductive fine wire that is coated with a conductor layer. The core 1 preferably exhibits sufficient heat resistance and preferably has a melting point of at least about 600° C., more preferably about 1,000° C. or more. Examples of preferred materials for the core 1 include tungsten, tantalum, aluminum, titanium, chromium, molybdenum, copper and stainless steel. The core 1 preferably has a diameter of about 10 μm to about 300 μm, for example. It should be noted, however, that when the transistor array of this preferred embodiment is applied to an active-matrix substrate for a high-definition display device, the core 1 may have a diameter of less than about 10 μm.

The insulating layer 2 may be made of any of various insulators that are normally used in semiconductor device processing. Examples of preferred insulators include silicon dioxide ($SiO_2$), silicon nitride ($SiN_x$) and silicon oxynitride (SiON). The insulating layer 2 may be made by any of various known manufacturing techniques including a plasma enhanced CVD process, a thermal CVD process, a thermal oxidation process and a nitrification process, or other suitable processes.

The semiconductor layer 3 preferably has a thickness of about 10 nm to about 300 nm, for example. The semiconductor layer 3 may be made of any of various semiconductor materials including amorphous silicon, polysilicon, crystallized silicon and gallium arsenide, or other suitable material. Optionally, the semiconductor layer 3 may also be made of a transparent semiconductor material (e.g., zinc oxide), which is transparent to visible radiation. Even when exposed to visible radiation, a transparent semiconductor causes just a slight variation in resistivity and hardly deteriorates. Accordingly, if the semiconductor layer 3 is made of such a transparent semiconductor, the function line 7 rarely causes a leakage failure or exhibits deteriorated semiconductor properties even when exposed to light.

The ohmic contact layer 4 is preferably made of a material that can make an ohmic contact with the semiconductor layer 3. For example, where the semiconductor layer 3 is made of amorphous silicon or polysilicon, the ohmic contact layer 4 is preferably made of $n^+$-type silicon that is heavily doped with phosphorus.

Hereinafter, a specific method of making the function line 7 will be described.

First, an insulating layer 2 of silicon nitride is deposited by a plasma enhanced CVD process on the surface of a core 1 that is made of a stainless steel and has a diameter of about 20 μm. Specifically, the core 1 is held between an anode electrode and a cathode electrode with the temperature on the core 1 and the temperature inside the chamber both kept at about 300° C. and with a tension applied to the core 1. In this state, nitrogen gas, ammonia gas and silane gas are supplied into the chamber at flow rates of about 1,000 sccm, about 100 sccm, and about 50 sccm, respectively, and the pressure inside the chamber is maintained at about 150 Pa. Then, an electric discharge is started with an RF power of about 1,000 W applied, thereby depositing the insulating layer 2 of silicon nitride to a thickness of about 350 nm on the surface of the core 1.

Thereafter, with the vacuum maintained inside the chamber, hydrogen gas and silane gas are supplied into the chamber at flow rates of about 2,000 sccm and about 200 sccm, respectively, thereby decreasing the pressure inside the chamber to about 60 Pa. Then, an RF power of about 100 W is applied so as to deposit the semiconductor layer 3 of amorphous silicon to a thickness of about 150 nm on the surface of the insulating layer 2.

Subsequently, with the vacuum maintained inside the chamber, hydrogen gas and silane gas including about 5% of phosphine are supplied into the chamber at flow rates of about 1,000 sccm and about 50 sccm, respectively, thereby decreasing the pressure inside the chamber to about 60 Pa. Then, an RF power of about 200 W is applied so as to deposit the ohmic contact layer 4 to a thickness of about 50 nm on the surface of the semiconductor layer 3. In this manner, the function line 7 is obtained.

In these manufacturing and processing steps, the geometric shapes and arrangements of the chamber and discharge electrodes need to be carefully defined such that those layers are uniformly stacked on the core 1. Those layers may be continuously deposited to constant thicknesses around the core 1 in the following manner. Specifically, an inductively coupled plasma discharge electrode may be disposed on the outer surface of a cylindrical chamber and the core 1 may be continuously let out from one end and reeled up at the other end such that the core 1 is always located around the center axis of the cylindrical chamber. Alternatively, those layers may also be deposited sufficiently uniformly even by using a conventional diode parallel plate plasma enhanced CVD system as long as the process pressures and gas flows are optimized.

Figure 4:
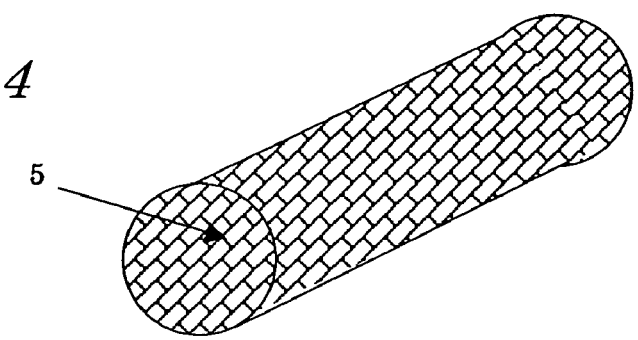
FIG. 4 is a perspective view showing a processing step to make a source line for use in the first preferred embodiment of the present invention.
Figure 5:
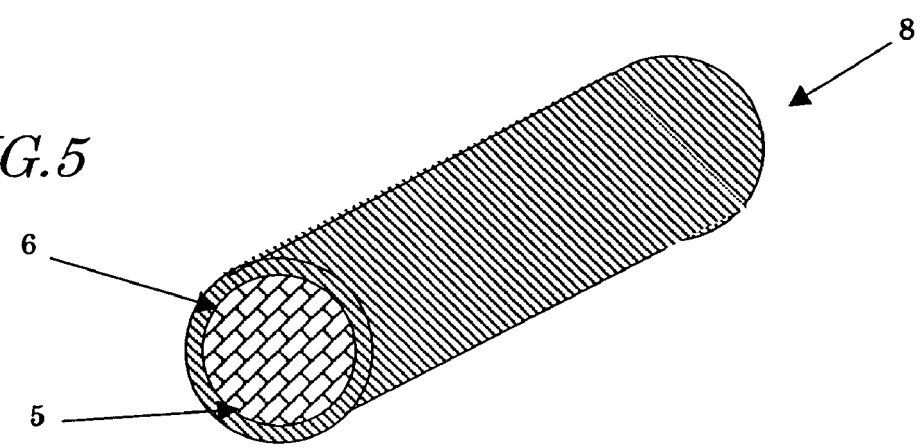
FIG. 5 is a perspective view illustrating the source line for use in the first preferred embodiment of the present invention.

Next, as shown in FIGS. 4 and 5, a source line 8, which includes a core 5 and a conductor layer 6 that covers the surface of the core 5 and which functions as a conductor line, is prepared. The core 5 may be either electrically conductive or electrically insulating. When the core 5 is made of a conductor, any of the exemplary materials for the core 1 may be used. Examples of insulators for use to make an insulating core 5 include various heat-resistant fibers such as an alumina fiber, a glass fiber, silicon carbide fiber and a fluorine fiber, and other suitable materials.

The conductor layer 6 is made of either a conductor material having a melting point of about 100° C. to about 400° C. or a material to be alloyed with the semiconductor layer 3 or the ohmic contact layer 4 of the function line 7 at a temperature of about 100° C. to about 400° C. Examples of conductors having a melting point of about 100° C. to about 400° C. include Sn—Bi—Ag alloys and Pb—Sn alloys. In any case, the melting point or the alloying temperature is preferably higher than any process temperature to which the source line 8 will be subjected later.

In this preferred embodiment, a core 5 that is made of a stainless steel and has a diameter of about 20 μm is prepared as shown in FIG. 4. Then, the core 5 is held inside a chamber with a tension applied thereto. Thereafter, the chamber is evacuated to a vacuum of about $1 \times 10^{-3}$ Pa and a conductor layer 6 of an Sn—Bi—Ag alloy or a Pb—Sn alloy is deposited thereon to a thickness of about 50 nm to about 2,000 nm. Alternatively, the material of the conductor layer 6 may be heated and melted in a crucible, for example, and the core 5 may be rapidly brought into contact with the molten material. Even so, the conductor layer 6 may also be formed around the core 5. In that case, if the rate of contact of the core 5 with the molten material is adjusted, then the thickness of the resultant conductor layer 6 may also be controlled. In this manner, the source line 8 is obtained.

Figure 6:
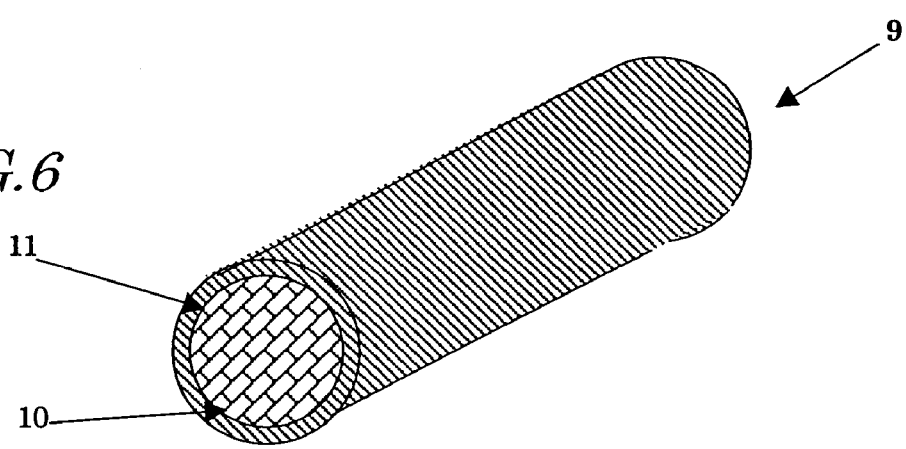
FIG. 6 is a perspective view illustrating a storage capacitor line for use in the first preferred embodiment of the present invention.
Figure 7:
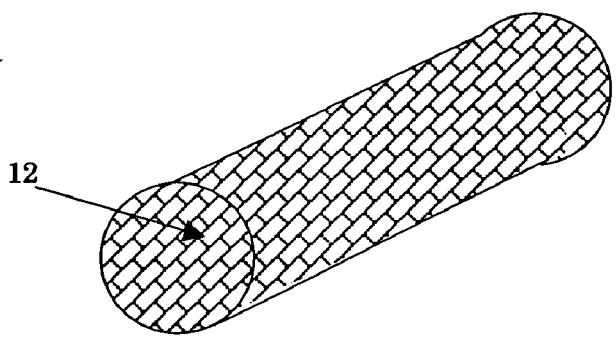
FIG. 7 is a perspective view illustrating a dummy line for use in the first preferred embodiment of the present invention.

Furthermore, a storage capacitor line 9, including a core 10, at least the surface of which is electrically conductive, and an insulating layer 11 that covers the surface of the core 10, is prepared as shown in FIG. 6. A dummy line 28 including a core 12 only is also prepared as shown in FIG. 7. At least the surface of the core 12 is preferably electrically insulating. The storage capacitor line 9 and the dummy line 28 may also be formed by the same method as the function line 7 or the source line 8.

Figure 8:
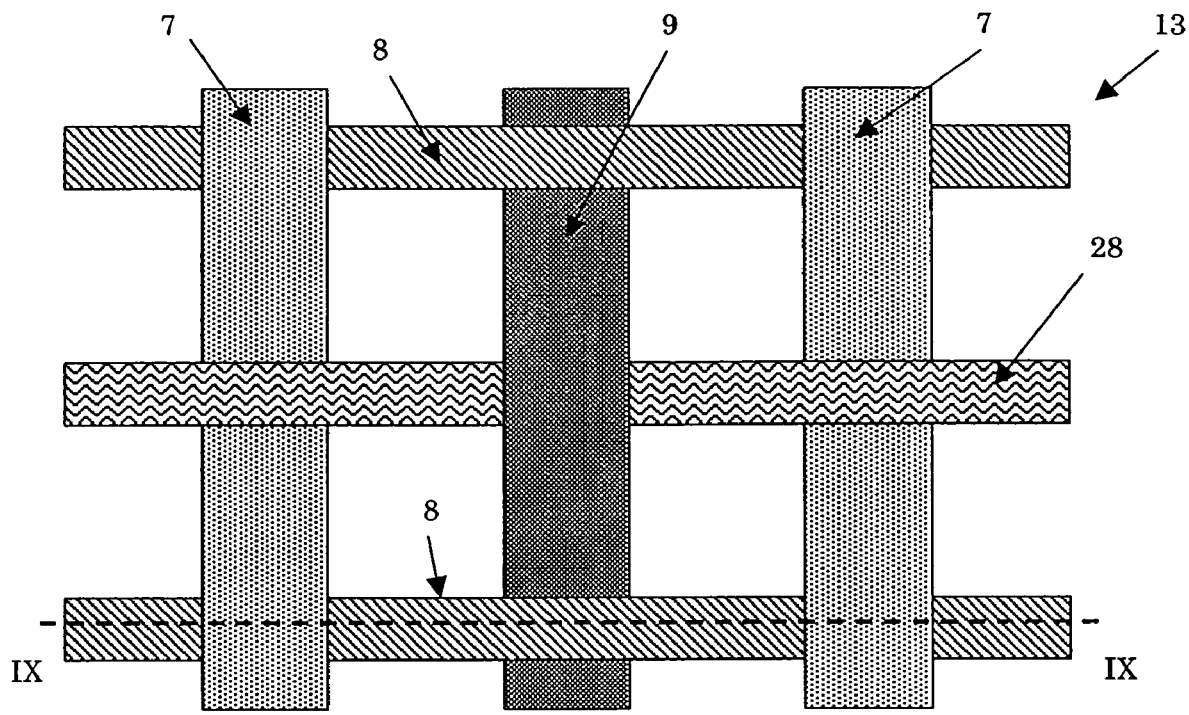
FIG. 8 is a plan view showing a processing step to make an active-matrix substrate according to the first preferred embodiment of the present invention.
Figure 9:
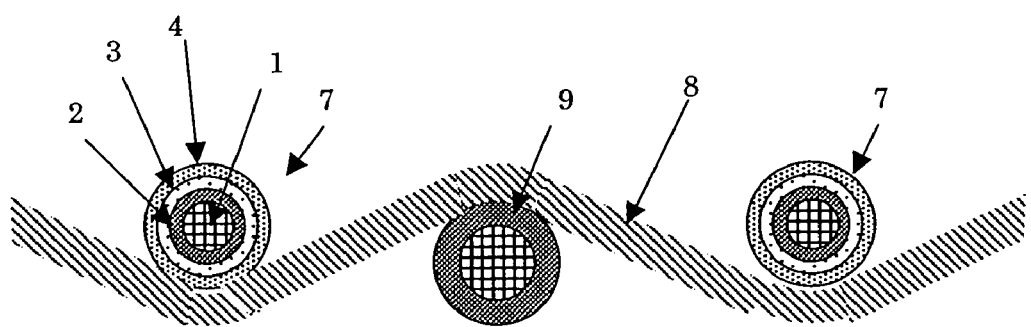
FIG. 9 is a cross-sectional view thereof as viewed along the plane IX-IX shown in FIG. 8.

Subsequently, the function lines 7, source lines 8, storage capacitor lines 9 and dummy lines 28, which have been separately prepared by the methods described above, are woven together into the network structure 13 shown in FIGS. 8 and 9. FIG. 8 is a plan view of the network structure 13. FIG. 9 is a cross-sectional view of the network structure 13 as viewed on the plane IX-IX shown in FIG. 8.

Hereinafter, it will be described how to create this network structure 13.

First, multiple function lines 7 and multiple storage capacitor lines 9 are alternately arranged so as to be substantially parallel to each other. In the same way, multiple source lines 8 and multiple dummy lines 28 are also alternately arranged so as to be substantially parallel to each other. Then, the function lines 7 and storage capacitor lines 9 as the warp, for example, and the source lines 8 and dummy lines 28 as the woof, for example, are woven together, thereby arranging these lines 7, 8, 9 and 28 such that the function lines 7 and storage capacitor lines 9 contact with, and cross substantially at right angles, the source lines 8 and dummy lines 28.

These lines 7, 8, 9 and 28 are preferably woven by a so-called "plain weaving" technique, in which warp and woof threads are woven together such that each single warp thread is located over every other woof thread and that each single woof thread is disposed over every other warp thread. More specifically, as shown in FIG. 9, the source line 8 as a woof thread intersects with, and is located under, the function line 7 as a warp thread and then intersects with, and is located over, the storage capacitor line 9 as another warp thread. That is to say, each single woof thread is alternately located either under or over the warp threads that cross the woof thread. In other words, the vertical level relationship between each pair of woof and warp threads switches every intersection thereof. In the same way, as shown in FIG. 8, the dummy line 28 as a woof thread intersects with, and is located over, the function line 7 as a warp thread and then intersects with, and is located under, the storage capacitor line 9 as another warp thread. In this manner, the vertical level relationship between a pair of warp and woof threads at an intersection is always opposite to the vertical level relationship between another pair of warp and woof threads at the next intersection.

The function lines 7, source lines 8, storage capacitor lines 9 and dummy lines 28 may be woven together by any known manufacturing technique that is used to make a metal mesh such as a stainless steel screen door or a screen printing mesh.

As shown in FIG. 8, the function lines 7 and storage capacitor lines 9 are alternately arranged and the source lines 8 and dummy lines 28 are also alternately arranged in this preferred embodiment. Accordingly, even though the network structure 13 is created by the plain weaving technique, the function line 7 is always located over any source line 8 at each intersection between the function line 7 and the source line 8.

Figure 10:
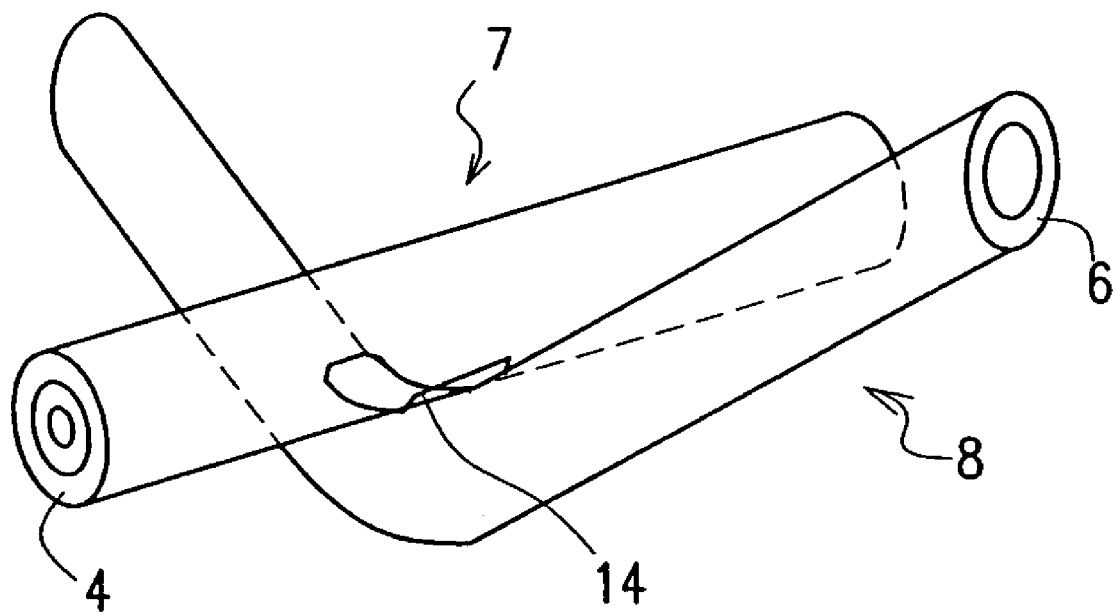
FIG. 10 is a perspective view illustrating an intersection between a source line and a function line in the structure shown in FIG. 8.

In the network structure 13 shown in FIG. 8, however, the respective lines 7, 8, 9 and 28 are just woven together. For that reason, the degree of electrical contact or mechanical bonding between the function lines 7 and the source lines 8 may be insufficient. Thus, the network structure 13 is preferably subjected to a heat treatment to ensure good electrical contact between the function lines 7 and the source lines 8. More specifically, the network structure 13 shown in FIG. 8 is preferably heated to, and maintained at, the melting point of the conductor layer 6 of the source lines 8, thereby melting the conductor layer 6. Then, as shown in FIG. 10, a portion of the conductor layer 6 is melted at the intersection between the function line 7 and the source line 8, and the molten portion of the conductor layer 6 contacts with the ohmic contact layer 4 of the function line 7. Thereafter, when the network structure 13 is cooled down to room temperature, the molten portion of the conductor layer 6 is solidified to form a connecting portion 14 between the source line 8 and the function line 7. Since the connecting portion 14 is a portion of the conductor layer 6 of the source line 8, the connecting portion 14 ensures a good electrical contact between the source line 8 and the ohmic contact layer 4 of the function line 7. In addition, the connecting portion 14 also firmly bonds the source line 8 and the function line 7 together mechanically at the intersection thereof, thereby preventing the meshes of the network structure 13 from being loosened and increasing the stability of the network structure 13.

Figure 11:
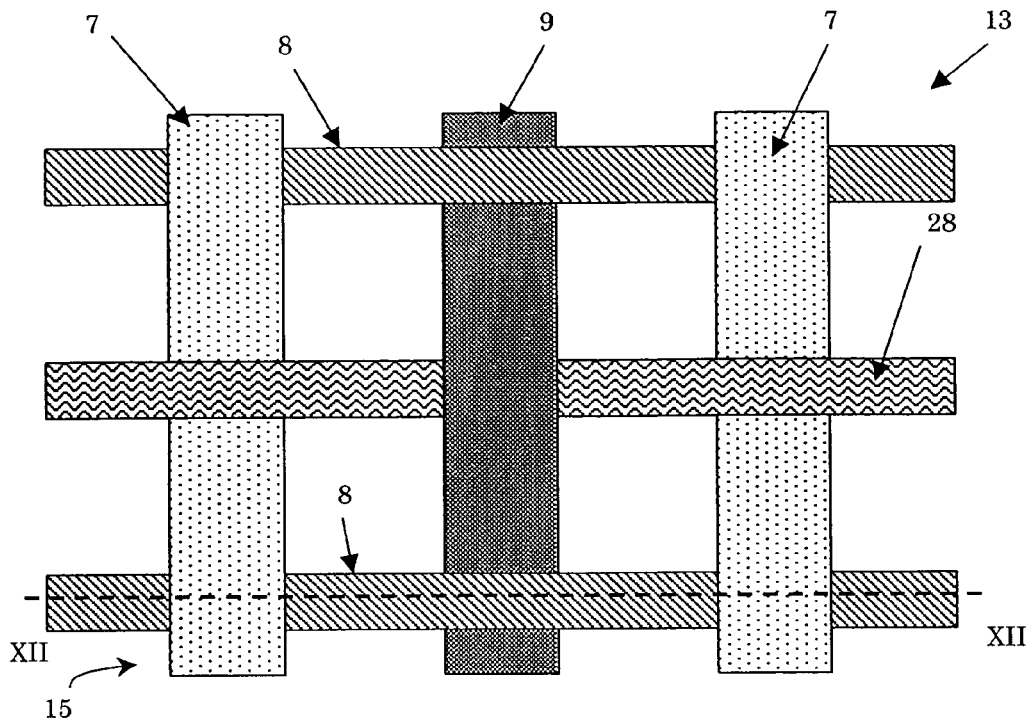
FIG. 11 is a plan view showing another processing step to make the active-matrix substrate of the first preferred embodiment of the present invention.
Figure 12:
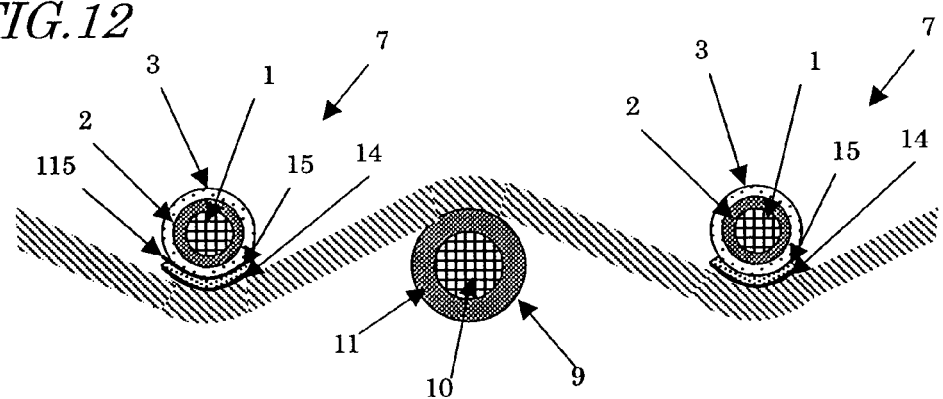
FIG. 12 is a cross-sectional view thereof as viewed along the plane XII-XII shown in FIG. 11.

Subsequently, the network structure 13 is subjected to a dry or wet etching process, for example, thereby selectively removing the ohmic contact layer 4 from the function line 7. In this processing step, there is no need to separately prepare any mask for the dry etching process. The reason is that the connecting portions 14, which have been formed at the intersections between the source lines 8 and the function lines 7, function as a mask so to speak and protect portions of the ohmic contact layer 4 that are covered with the connecting portions 14. Accordingly, the ohmic contact layer 4 remains only at the intersections between the source lines 8 and the function lines 7 as shown in FIGS. 11 and 12, thereby defining a first ohmic contact layer 15. The first ohmic contact layer 15 will define source electrodes for transistors to be formed later. Also, a fist ohmic contact region 115 is defined between the first ohmic contact layer 15 and the semiconductor layer 3, and a current can flow between the first ohmic contact layer 15 and the semiconductor layer 3 through the fist ohmic contact region 115. In this manner, the first ohmic contact layers 15 and the first ohmic contact regions 115 are located at the respective regions that are defined by the connecting portions 14 at the intersections between the source lines 8 and the function lines 7. Thus, the first ohmic contact layer 15, and the first ohmic contact region 115, may be regarded as being automatically or inherently aligned with the source lines 8 by virtue of the first ohmic contact regions 115 being defined by a region where each respective one of the source lines 8 crosses an associated one of the function lines 7. For that reason, there is no need to perform an additional processing step of aligning each of the first ohmic contact layers 15 with the source lines 8, or more generally, aligning each of the function lines 7 with the source lines 8. In this sense, the first ohmic contact regions 115 are "self-aligned" in that they do not require any alignment process at all since the accurate positioning of the first ohmic contact region 115 is automatically or inherently achieved by the crossing of the source lines 8 and function lines 7.

Figure 13:
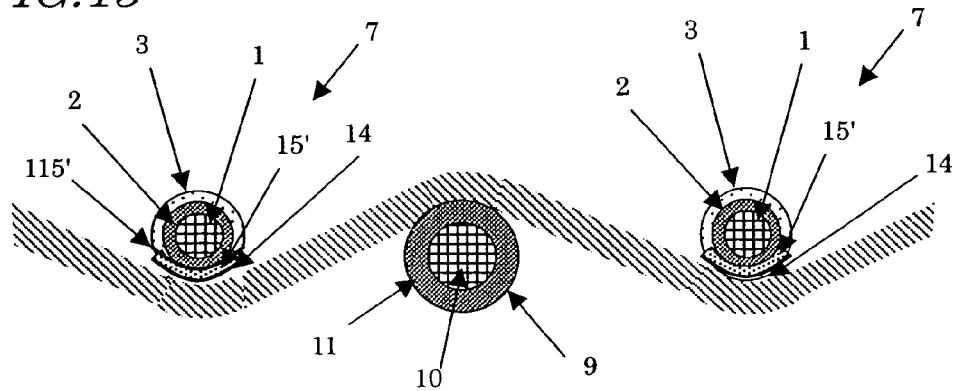
FIG. 13 is a cross-sectional view of a modified example as also viewed along the plane XII-XII shown in FIG. 11.

The function line 7 shown in FIG. 3 preferably includes the ohmic contact layer 4. However, the ohmic contact layer 4 may be omitted from the function line 7. If the function line 7 includes no ohmic contact layer 4, then the conductor layer 6 of the source line 8 is preferably doped with a dopant that will diffuse toward the semiconductor layer 3 of the function line 7 and define a low-resistivity layer as an ohmic layer in the semiconductor layer 3. Alternatively, the conductor layer 6 of the source line 8 may also include a material to be alloyed with the semiconductor layer 3 and define a low-resistivity layer therein. In the former case, when the connecting portions 14 are formed by heat-treating the network structure 13 and melting the conductor layer 6 of the source lines 8, the dopant diffuses from the connecting portions 14 into the semiconductor layer 3 of the function lines 7. As a result, a first ohmic contact layer 15' is formed in the semiconductor layer 3 as shown in FIG. 13. In the latter case, the connecting portions 14 are alloyed with the semiconductor layer 3 to define the first ohmic contact layer 15' in the semiconductor layer 3, too. A first ohmic contact region 115' is also defined between the first ohmic contact layer 15' and the semiconductor layer 3.

The alternative first ohmic contact layer 15' and the alternative first ohmic contact region 115' are located at the respective regions that are defined by the connecting portions 14 at the intersections between the source lines 8 and the function lines 7. Thus, the alternative first ohmic contact layer 15', and the alternative first ohmic contact region 115', may be regarded as being automatically or inherently aligned with the source lines 8 by virtue of the first ohmic contact regions 115' being defined by a region where each respective one of the source lines 8 crosses an associated one of the function lines 7. For that reason, there is no need to perform an additional processing step of aligning each of the alternative first ohmic contact layers 15' with the source lines 8, or more generally, aligning each of the function lines 7 with the source lines 8. Thus, similar to the first ohmic contact layer 15 or first ohmic contact region 115, the alternative first ohmic contact layer 15' is considered to be "self-aligned."

To improve the characteristics or reliability of transistors to be formed later, the overall network structure 13 may be covered with a protective coating (e.g., an insulating film) after the first ohmic contact layer 15 or 15' has been formed. For example, after the ohmic contact layer 4 has been selectively removed, the overall network structure 13 may be covered with a silicon nitride film or a silicon dioxide film by a plasma enhanced CVD process.

Figure 14:
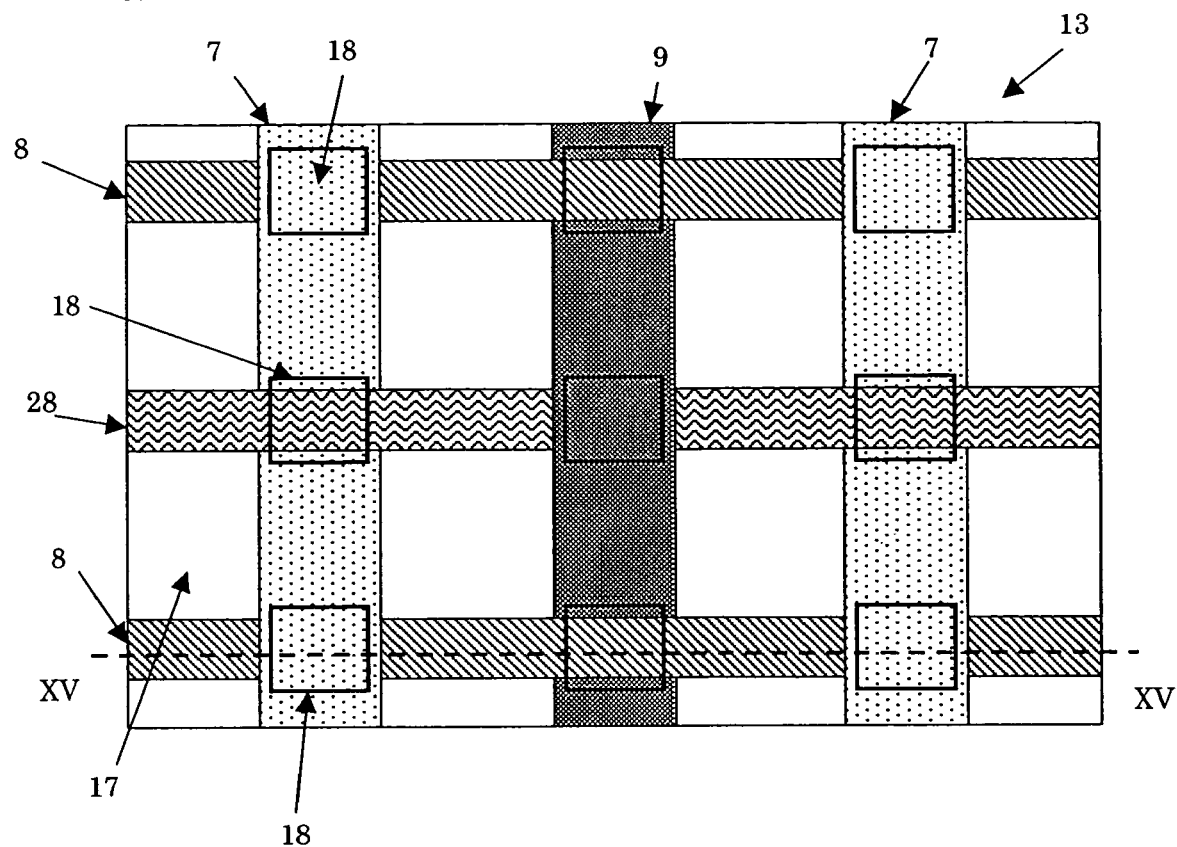
FIG. 14 is a plan view showing another processing step to make the active-matrix substrate of the first preferred embodiment of the present invention.
Figure 15:
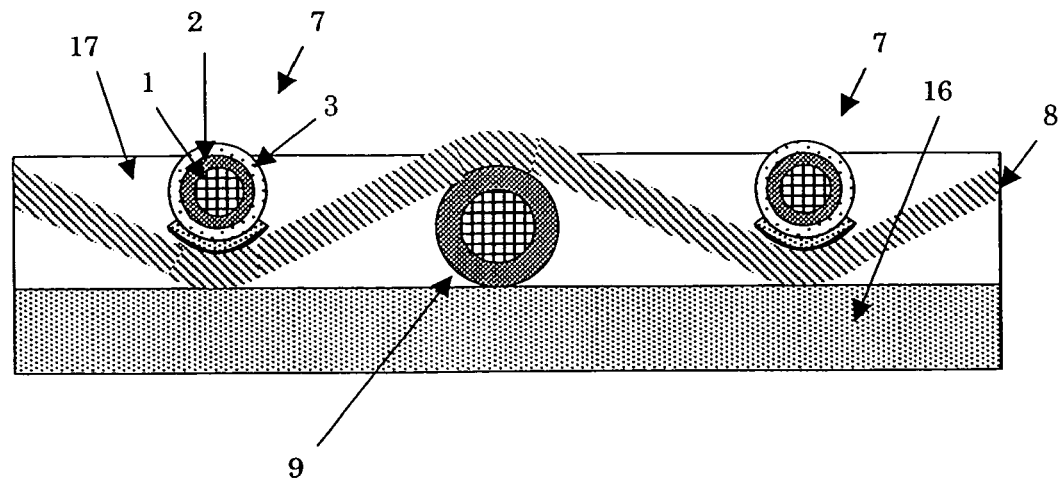
FIG. 15 is a cross-sectional view thereof as viewed along the plane XV-XV shown in FIG. 14.

Next, as shown in FIGS. 14 and 15, the network structure 13 is preferably secured onto a substrate 16 with a planarizing layer 17. The substrate 16 may be made of polyether sulfone (PES), for example, which is transparent, hardly deforms at about 200° C. and exhibits a small linear expansivity and little temperature dependence. Accordingly, the PES substrate 16 can maintain its size with good stability, and therefore, can be used effectively to make a flexible display device. Optionally, to make a reflective display device, the substrate 16 may be made of a stainless steel. As another alternative, a glass substrate may also be used. The planarizing layer 17 may be made of an epoxy resin, an acrylic resin or any other suitable resin. Also, the planarizing layer 17 may be provided after the network structure 13 has been bonded onto the substrate 16 via an adhesive layer (not shown). In this preferred embodiment, the planarizing layer 17 also functions as an adhesive layer. The adhesive layer may or may not be necessary depending on the material, thickness and application method of the planarizing layer.

Specifically, in this preferred embodiment, after the network structure 13 has been placed on the substrate 16, the network structure 13 is preferably coated with the planarizing layer 17 thickly enough to be buried in the planarizing layer 17 almost entirely. Thereafter, when the planarizing layer 17 is cured, the surface of the planarizing layer 17 is flattened and made smooth by a chemical mechanical polishing (CMP) process. In the network structure 13, the intersections between the warp and woof threads are thicker than the other portions. Accordingly, when the planarizing layer 17 is etched deep, those intersections will be exposed to define openings 18. If the entire surface of the network structure 13 has been covered with a protective coating, portions of the protective coating that are exposed at those openings 18 are also etched away. In this manner, the semiconductor layer 3 is exposed at the openings 18 that are located at the intersections between the function lines 7 and the source lines 8. According to this method, there is no need to perform a patterning process to form contact holes and the openings 18 can be formed so as to be automatically or inherently aligned with the intersections between the function lines 7 and the source lines 8. Alternatively, as in the prior art, a masking pattern defining the openings 18 may be formed by a photolithographic process over the planarizing layer 17 that covers network structure 13 and then the planarizing layer 17 may be selectively etched away by using the masking pattern.

In this preferred embodiment, the substrate 16 and the planarizing layer 17 preferably function as a structure for fixing the network structure 13. Alternatively, the substrate 16 may be omitted if the network structure 13 can be fixed only by the planarizing layer 17.

Figure 16:
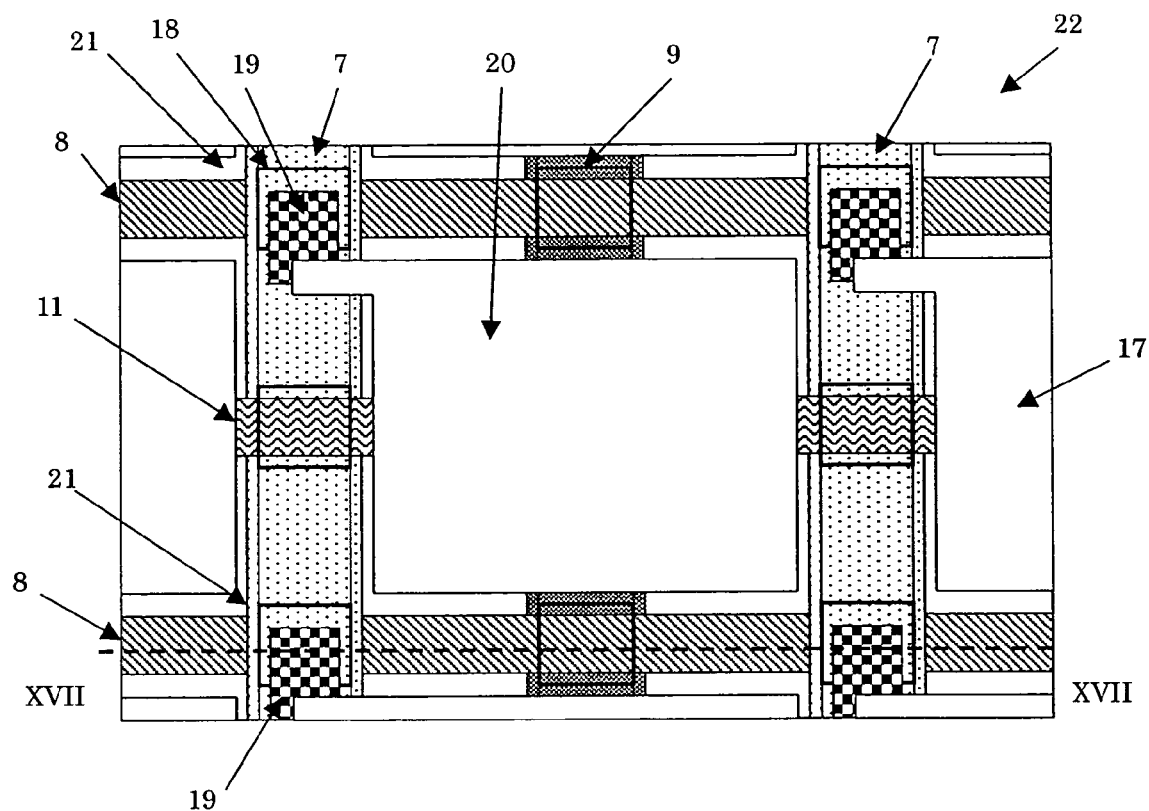
FIG. 16 is a plan view illustrating the active-matrix substrate of the first preferred embodiment of the present invention.
Figure 17:
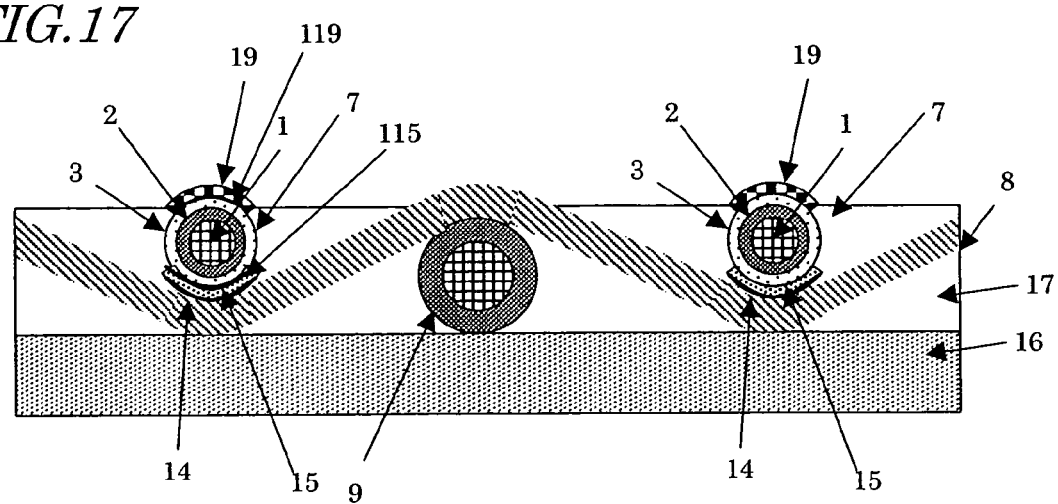
FIG. 17 is a cross-sectional view thereof as viewed along the plane XVII-XVII shown in FIG. 16.

Thereafter, as shown in FIGS. 16 and 17, a second ohmic contact layer 19 is formed so as to contact with the semiconductor layer 3 of the function lines 7 that was exposed at the openings 18. The second ohmic contact layer 19 may be obtained by depositing an n$^+$-type silicon film by a conventional plasma enhanced CVD process, for example, and then patterning the silicon film by a conventional photolithographic process, for example. A second ohmic contact region 119 is defined between the second ohmic contact layer 19 and the semiconductor layer 3, and a current flows between the second ohmic contact layer 19 and the semiconductor layer 3, through the second ohmic contact region 119. Subsequently, pixel electrodes 20 are formed so as to electrically contact with the second ohmic contact layer 19. The pixel electrodes 20 may be made of either a metal film or a transparent conductive film of ITO, for example.

Figure 18:
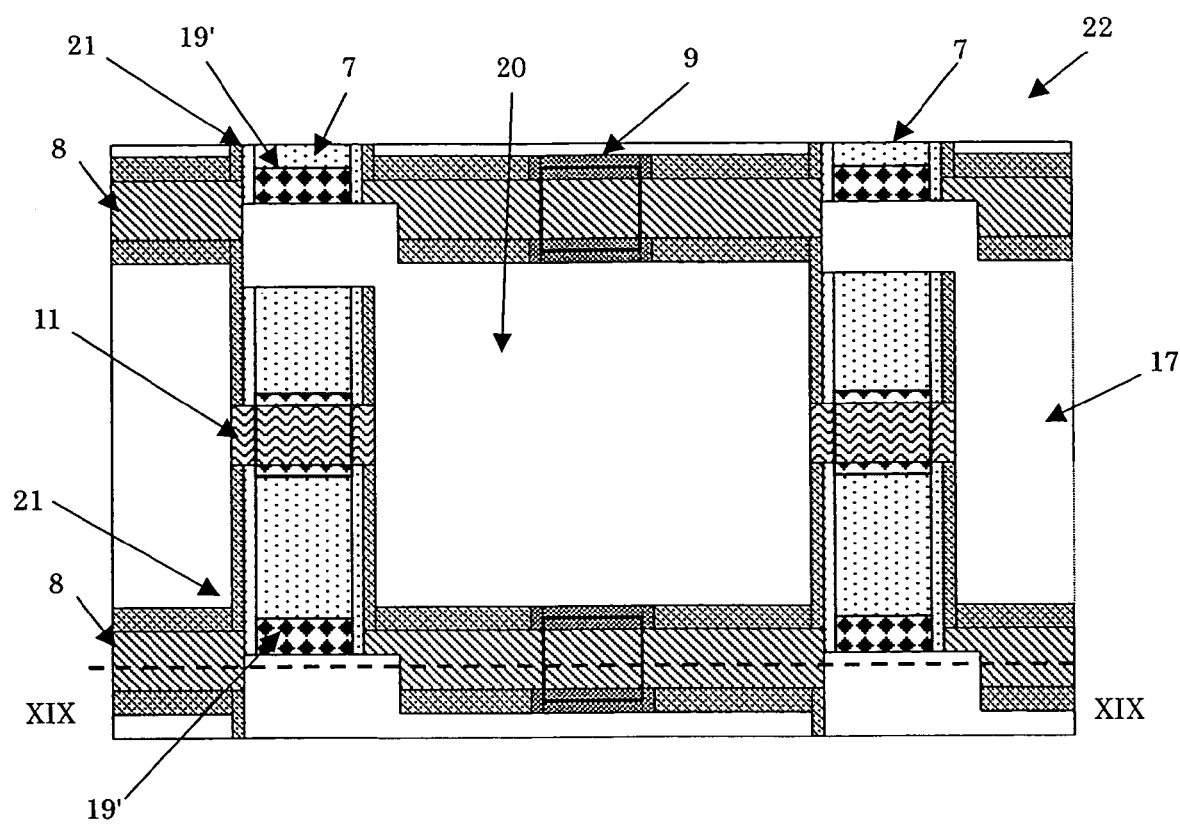
FIG. 18 is a plan view illustrating a modified example of the active-matrix substrate of the first preferred embodiment of the present invention.
Figure 19:
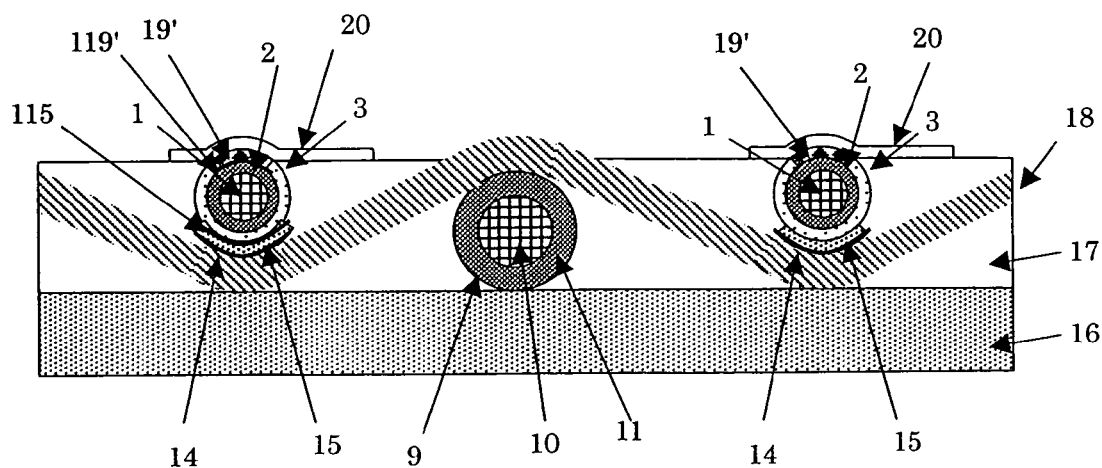
FIG. 19 is a cross-sectional view thereof as viewed along the plane XIX-XIX shown in FIG. 18.

Optionally, the second ohmic contact layer 19 may also be defined in the semiconductor layer 3 of the function lines 7 as shown in FIGS. 18 and 19. To form such an alternative second ohmic contact layer 19', dopant ions may be implanted or diffused into the semiconductor layer 3 of the function lines 7 that is exposed at the openings 18. The alternative second ohmic contact layer 19' may also be formed by depositing a metal film on the semiconductor layer 3 that is exposed at the openings 18 and then alloying the metal film with the semiconductor layer 3. In this case, a second ohmic contact region 119' is defined between the second ohmic contact layer 19' and the semiconductor layer 3.

In this manner, a transistor array, in which multiple transistors 21 are arranged in columns and rows at the intersections between the function lines 7 and source lines 8, is obtained. Also, an active-matrix substrate 22, on which each of those transistors 21 is connected to its associated pixel electrode 20, is also completed.

Figure 20:
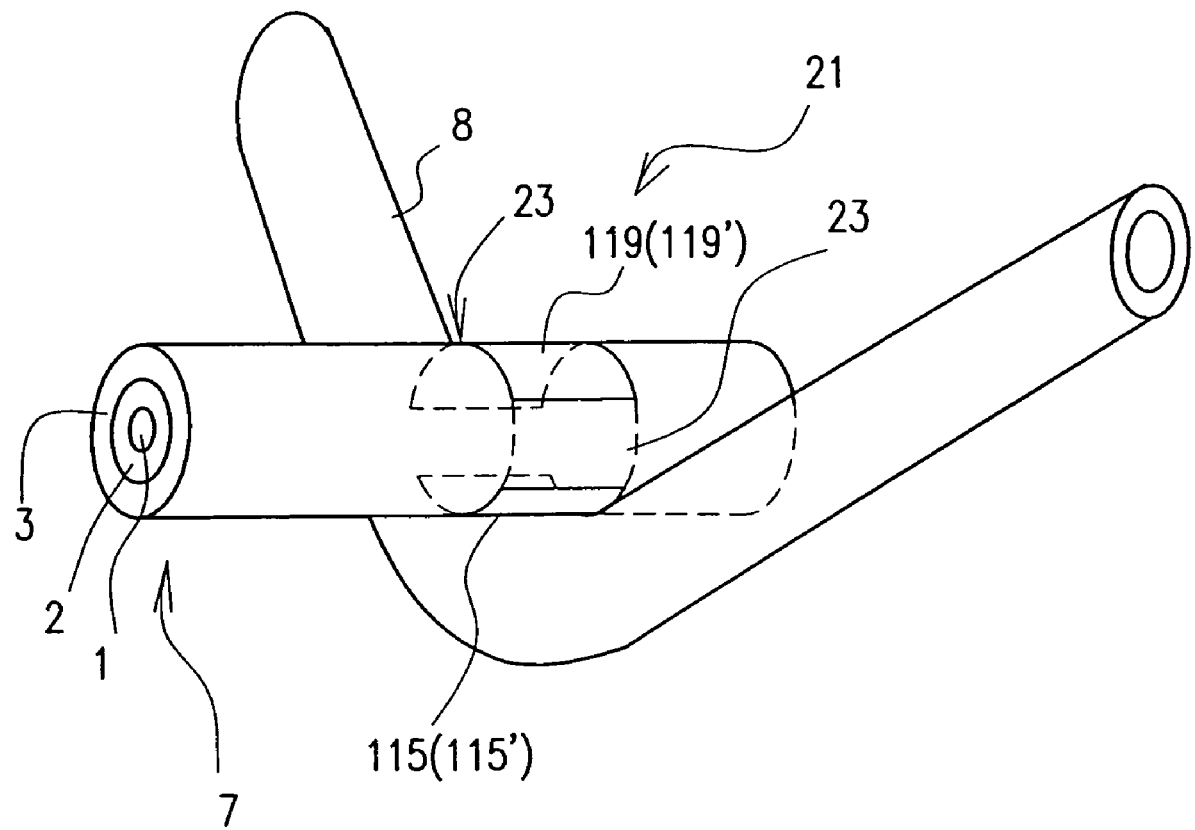
FIG. 20 is a perspective view illustrating the structure of an intersection between a source line and a function line shown in FIG. 18.

FIG. 20 is a perspective view schematically illustrating one transistor 21 that is included in the transistor array of the active-matrix substrate 22 shown in FIGS. 16 and 17 or in FIGS. 18 and 19. As shown in FIG. 20, the transistor 21 includes the first ohmic contact region 115 (or the alternative first ohmic contact region 115' shown in FIG. 13), the second ohmic contact region 119 (or the alternative second ohmic contact region 119' shown in FIG. 19) and a channel region 23, which is defined in a portion of the semiconductor layer 3 by the first and second ohmic contact regions 115 and 119 (or 115' and 119'). Although not shown in FIG. 20 to show the first ohmic contact region 115 or 115' definitely, the connecting portion 14, which is a portion of the conductor layer 6 of the source line 8, is located between the first ohmic contact layer 15 or 15' and the source line 8. The core 1 of the function line 7, which is sandwiched between the first ohmic contact layer 15 or 15' and the second ohmic contact layer 19 or 19' and which is adjacent to the semiconductor layer 3 with the insulating layer 2 interposed between them, functions as the gate electrode of the transistor 21. On the other hand, the first ohmic contact region 115 or 115' which may include the first ohmic contact layer 15 or 15' and the second ohmic contact region 119 or 119' which may include the second ohmic contact layer 19 or 19' respectively function as the drain electrode and the source electrode of the transistor 21.

As described above, the first ohmic contact region 115 or 115' and the first ohmic contact layer 15 or 15' are formed so as to be automatically and inherently located at and aligned with the intersection between the function line 7 and the source line 8. Accordingly, even without performing any alignment process, the source line 8 can be connected to the first ohmic contact layer 15 or 15' at the first ohmic contact region 115 or 115' exactly as intended. Thus, the transistor 21 can be controlled by way of the core 1 of the function line 7 and the source line 8.

Figure 21:
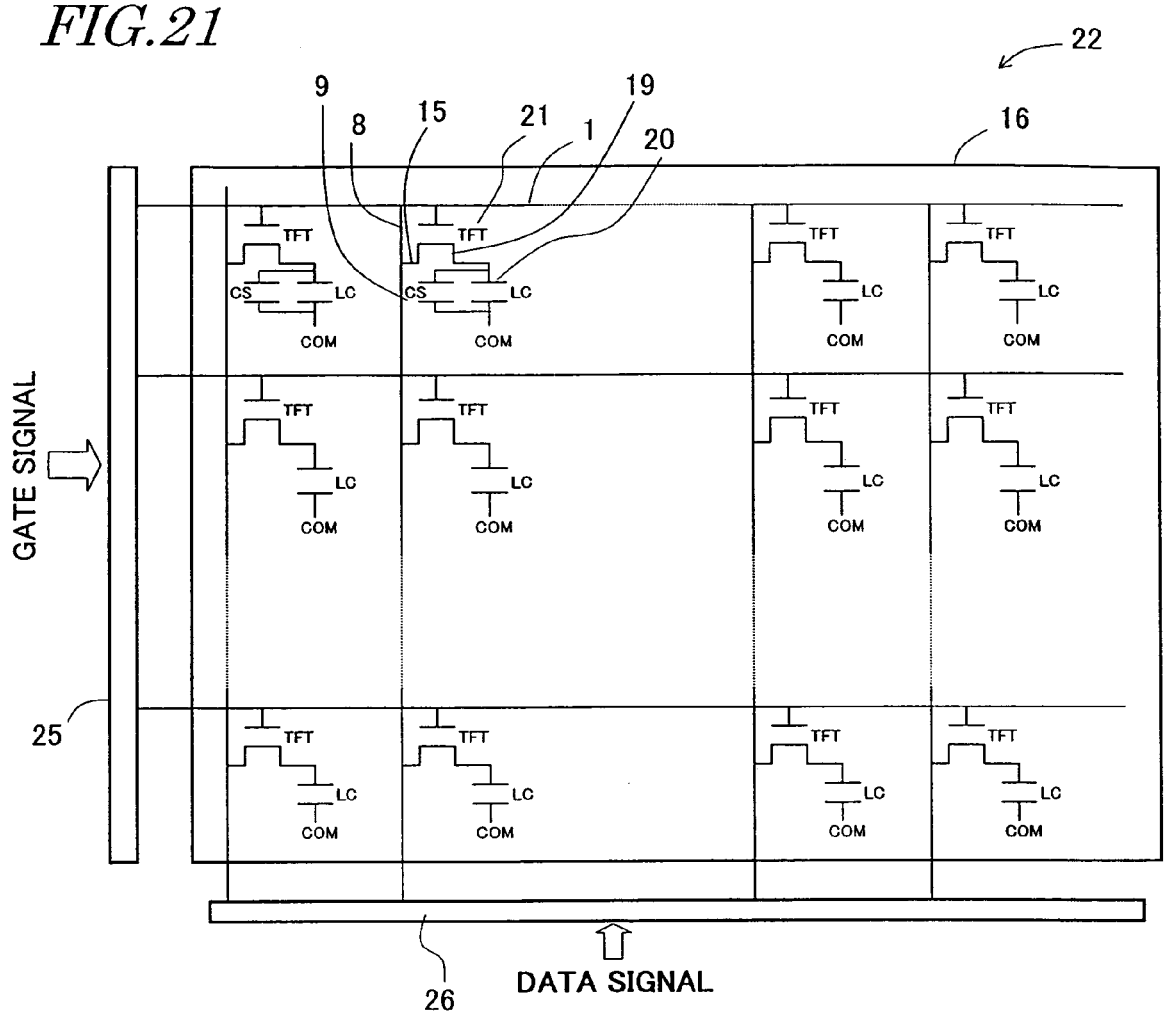
FIG. 21 is an equivalent circuit diagram of the active-matrix substrate of the first preferred embodiment of the present invention.

FIG. 21 is an equivalent circuit diagram of the overall active-matrix substrate 22. As shown in FIG. 21, each of the pixel electrodes 20 is connected to the second ohmic contact region 119 or 119' and/or the second ohmic contact layer 19 or 19' (i.e., the drain electrode) of its associated transistor 21. On the other hand, the first ohmic contact region 115 or 115' and/or the first ohmic contact layer 15 or 15' (i.e., the source electrode) of each transistor 21 is connected to its associated source line 8. The core 1 of the function line 7 functions as not only the gate electrode of the transistor 21 but also a gate line for the active-matrix substrate 22. The core 10 of each storage capacitor line 9 is connected to a common potential. Thus, the core 10, the pixel electrode 20 and the insulating layer 11 create a storage capacitance. By using the storage capacitor line 9, a so-called "DC offset", i.e., a variation in pixel potential, can be minimized.

When the cores 1 for defining the gate lines are connected to a gate line driver IC 25 and the source lines 8 are connected to a source line driver IC 26, the transistors 21, which are connected to one core (or gate line) 1 that has been selected responsive to a gate signal, are turned ON. As a result, a data signal is applied to one of the pixel electrodes 20, which is connected to one of the ON-state transistors 21, by way of a source line 8.

In the transistor array and active-matrix substrate of this preferred embodiment, the insulating layer 2 for defining the gate insulating film of the transistor 21 and the semiconductor layer 3 are formed in advance for the function line 7. Accordingly, if the insulating layer 2 and semiconductor layer 3 are formed at sufficiently high temperatures, the insulating layer 2 can exhibit a high dielectric strength and the semiconductor layer 3 can exhibit a high mobility and a low defect density. However, the substrate 16 is never exposed to the high heat to which the insulating layer 2 and the semiconductor layer 3 have been exposed. Thus, a transistor, including a semiconductor layer and an insulating layer that have been formed at processing temperatures exceeding about 1,000° C., can be provided on a plastic substrate, for example, having a heat resistance of about 200° C. or less. As a result, a flexible (i.e., freely bendable) active-matrix substrate and a flexible TFT liquid crystal display device or organic EL display device are realized.

Also, as already described above, the first ohmic contact layer 15 is formed so as to be automatically and inherently located at and aligned (i.e. "self-aligned"), with the region, i.e. the first ohmic contact region 115. As noted above, the first ohmic contact region 115 is defined by an area of the intersection between the source line 8 and the function line 7. In addition, the first ohmic contact region 115 and the first ohmic contact layer 15 make electrical contact with the source line 8 exactly as intended and at the exact desired location. Furthermore, it is not until the source lines 8 and the function lines 7 have been woven together that the second ohmic contact layer 19 or a second ohmic contact region 119' is formed. Accordingly, a transistor array and an active-matrix substrate, in which a huge number of transistors are arranged exactly as intended and not misaligned at all, can be obtained without worrying about misalignment while the function lines 7 and the source lines 8 are arranged.

Also, in the conventional manufacturing process, a substrate having a low heat resistance expands every time it is subjected to a high-temperature process to be carried out at a temperature exceeding its highest resistible temperature. Once the substrate has expanded, the substrate cannot recover its original shape and has increased sizes instead. For that reason, even if one tries to make an active-matrix substrate on a substrate with such a low heat resistance, it has been very difficult in the prior art to arrange interconnections, electrodes and other components on the substrate exactly as designed once the substrate has expanded due to such high-temperature processes.

In contrast, in the transistor array and active matrix substrate according to this preferred embodiment of the present invention, the substrate 16 is never exposed to such a high heat. For that reason, misalignment due to the excessive thermal expansion of the substrate 16 is prevented and the pattern can be defined exactly as designed. Accordingly, the production yields of the transistor array and active matrix substrate also increase. That is to say, even when a substrate having a high thermal expansion coefficient (e.g., a plastic substrate) is used, active matrix substrates having a desired pattern can be manufactured with a very high yield. Furthermore, since the source lines 8 and the function lines 7 are supported by the network structure, misalignment is prevented from occurring between the source lines 8 and the function lines 7 even when the substrate 16 expands or shrinks. This is because the network structure is hardly affected by the expansion or shrinkage of the substrate 16.

In addition, since the network structure is formed by weaving the source lines 8 and the function lines 7 together, the transistor array can have a consolidated structure that is much more densely packed and miniaturized as compared to that of the prior art devices. In each intersection between the source lines 8 and the function lines 7 of this network structure, the first and second ohmic contact regions 115 and 119 are defined, and the first and second ohmic contact layers 15 and 19 are arranged so as to sandwich the core 1 of the function line 7 between them. That is to say, the first ohmic contact layer 15, which makes an electrical contact with the source line 8, is located under the core 1 of the function line 7. On the other hand, the second ohmic contact layer 19, which makes an electrical contact with the pixel electrode 20, is located over the core 1 of the function line 7. Accordingly, even though the intersection between the source line 8 and the function line 7 creates some level difference, that difference can be eliminated by the planarizing layer 11. Thus, the pixel electrodes 20 will not be affected by the level difference.

The preferred embodiment of the present invention described above relates to an active matrix substrate 22. The active matrix substrate 22 can be used effectively in a liquid crystal display device, for example. A liquid crystal display device according to a preferred embodiment of the present invention may be fabricated in the following manner. First, a counter substrate including a counter electrode and a color filter layer is prepared. Next, an alignment film is provided on the surface of the active matrix substrate and on the surface of the counter substrate, and then subjected to a rubbing treatment. Thereafter, the two substrates are bonded together with a seal member such that the rubbed surfaces thereof are opposed to each other. Finally, a liquid crystal material is injected into the gap between the substrates to obtain the liquid crystal display device.

The active matrix substrate according to preferred embodiments of the present invention may also find application in any of various other types of display devices, not just the liquid crystal display device. Specifically, in that case, a material that causes a variation in its optical property or emits radiation upon the application of a voltage thereto may be used as a material for a display medium layer, and the display medium layer is interposed between the counter substrate and the active matrix substrate of the present invention. For example, the active matrix substrate according to preferred embodiments of the present invention can also be used effectively in an organic EL display device of which the display medium layer is made of an organic fluorescent material.

If the active matrix substrate 22 of the preferred embodiment described above is affected by the incidence of light onto the semiconductor layer 3 of the function lines 7, then some appropriate light blocking element or elements may be provided for the active matrix substrate 22. For example, where a reflective image display device is formed on the active matrix substrate 22, the planarizing layer 11 may be made of an opaque material such as a black resin. On the other hand, when a transmissive image display device is formed, an opaque layer may be disposed so as to coat the function lines 7.

Figure 22:
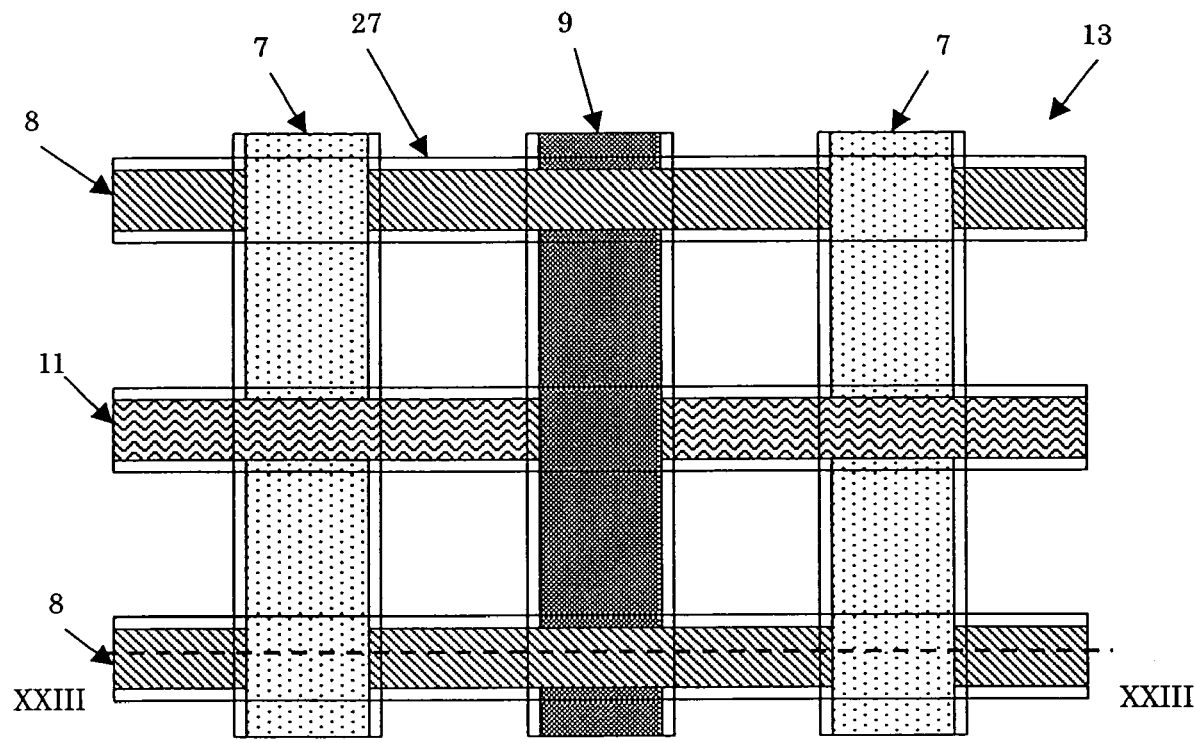
FIG. 22 is a plan view showing a processing step to make a modified example of the active-matrix substrate of the first preferred embodiment of the present invention.
Figure 23:
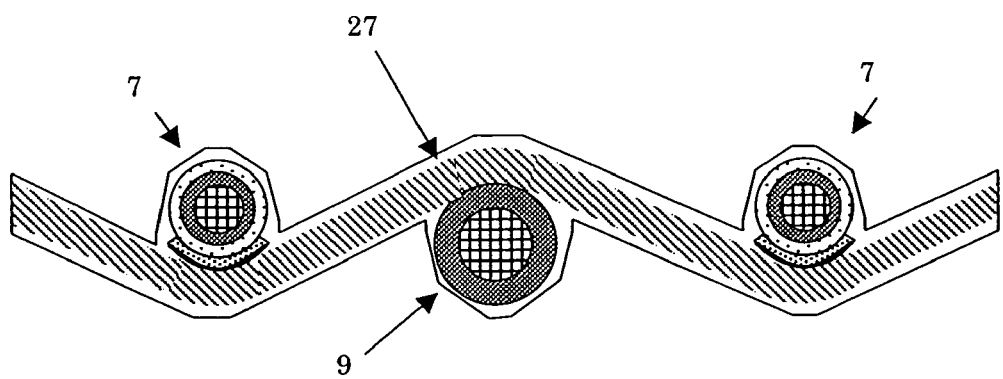
FIG. 23 is a cross-sectional view thereof as viewed along the plane XXIII-XXIII shown in FIG. 22.
Figure 24:
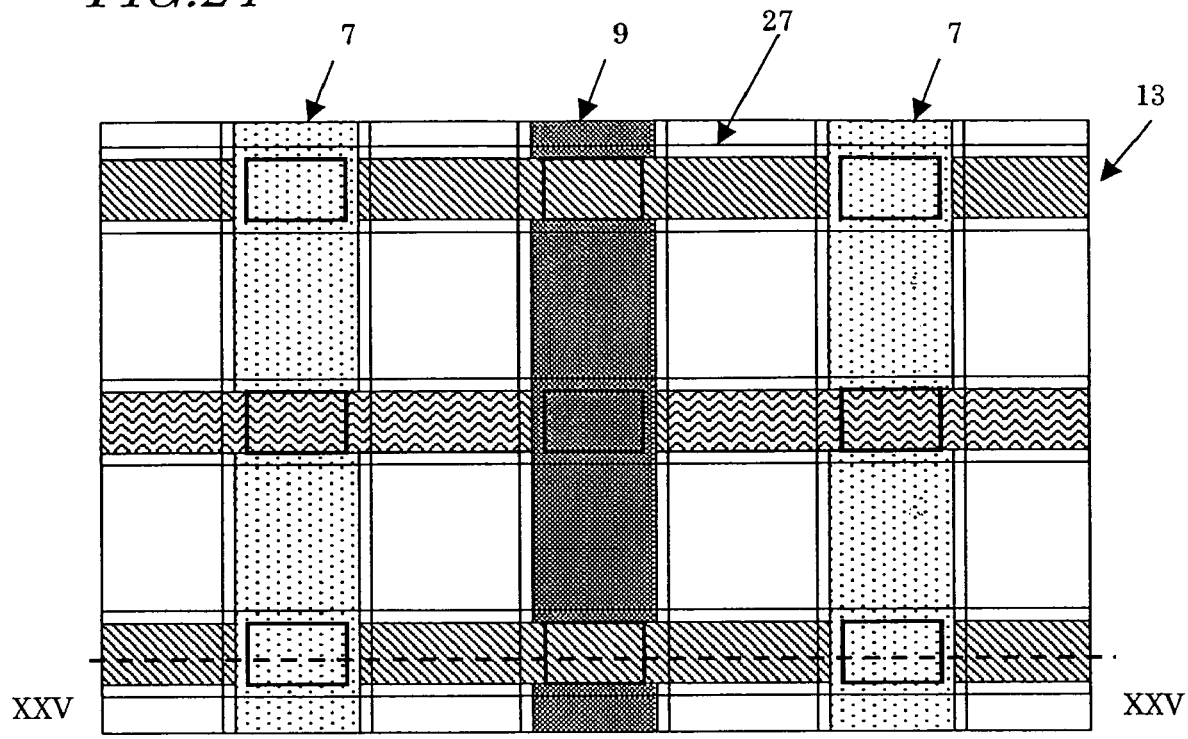
FIG. 24 is a plan view showing another processing step to make the modified example of the active-matrix substrate of the first preferred embodiment of the present invention.
Figure 25:
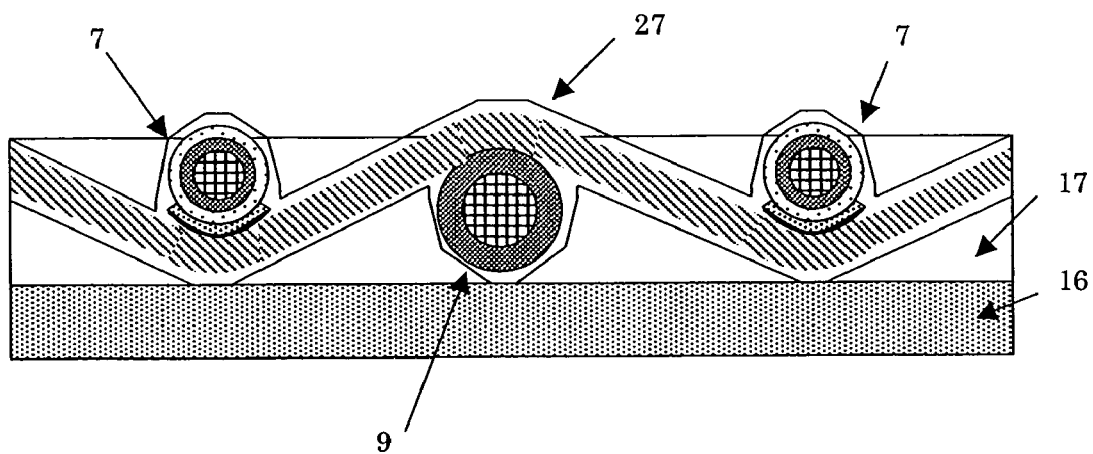
FIG. 25 is a cross-sectional view thereof as viewed along the plane XXV-XXV shown in FIG. 24.
Figure 26:
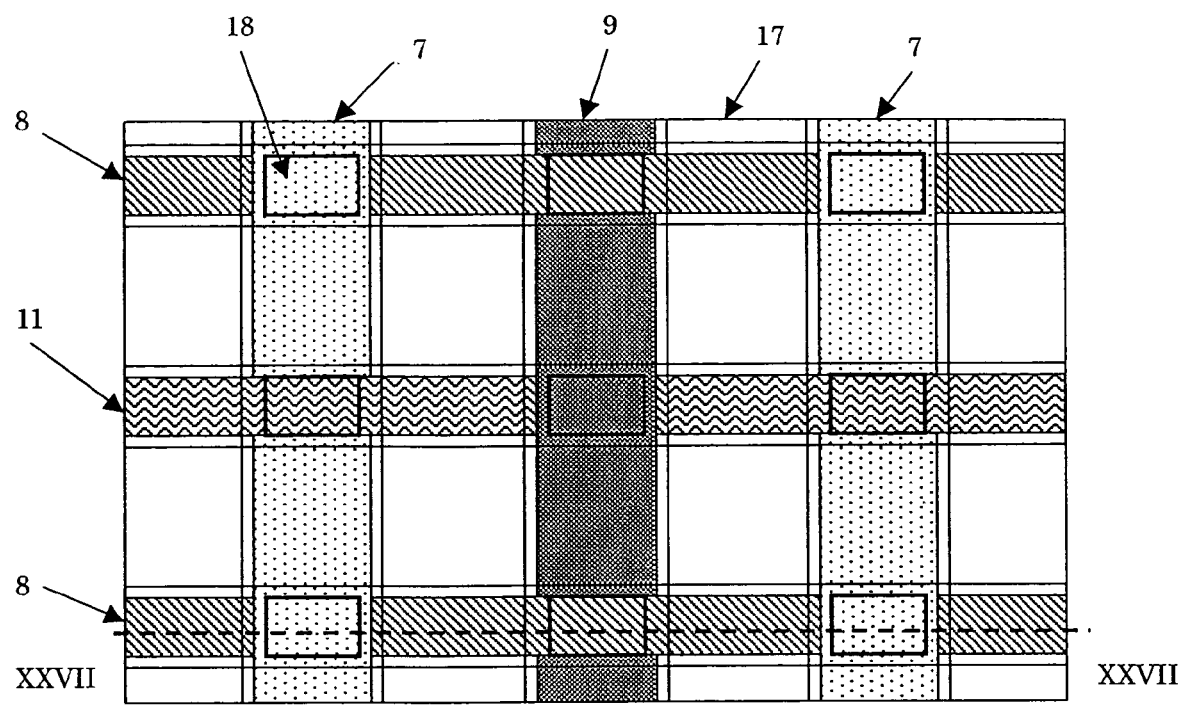
FIG. 26 is a plan view showing another processing step to make the modified example of the active-matrix substrate of the first preferred embodiment of the present invention.
Figure 27:
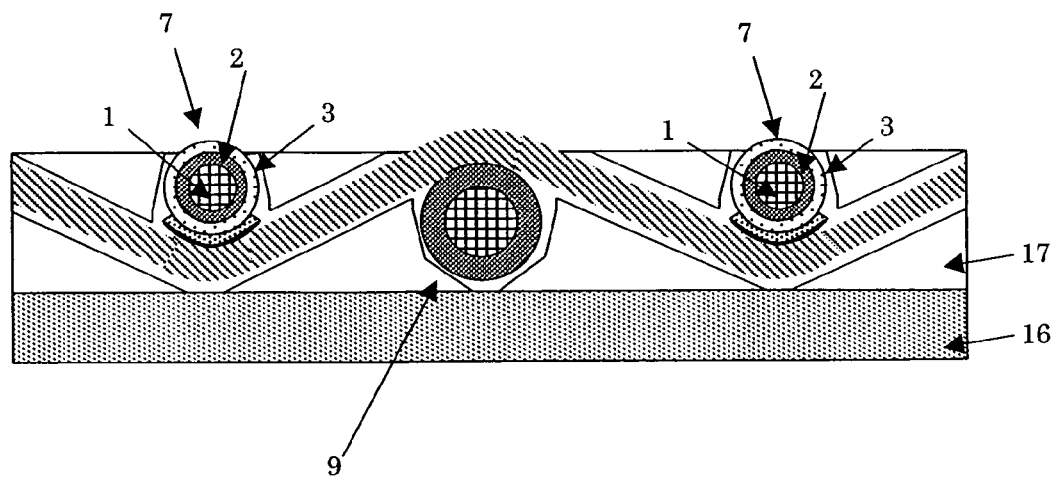
FIG. 27 is a cross-sectional view thereof as viewed along the plane XXVII-XXVII shown in FIG. 26.
Figure 28:
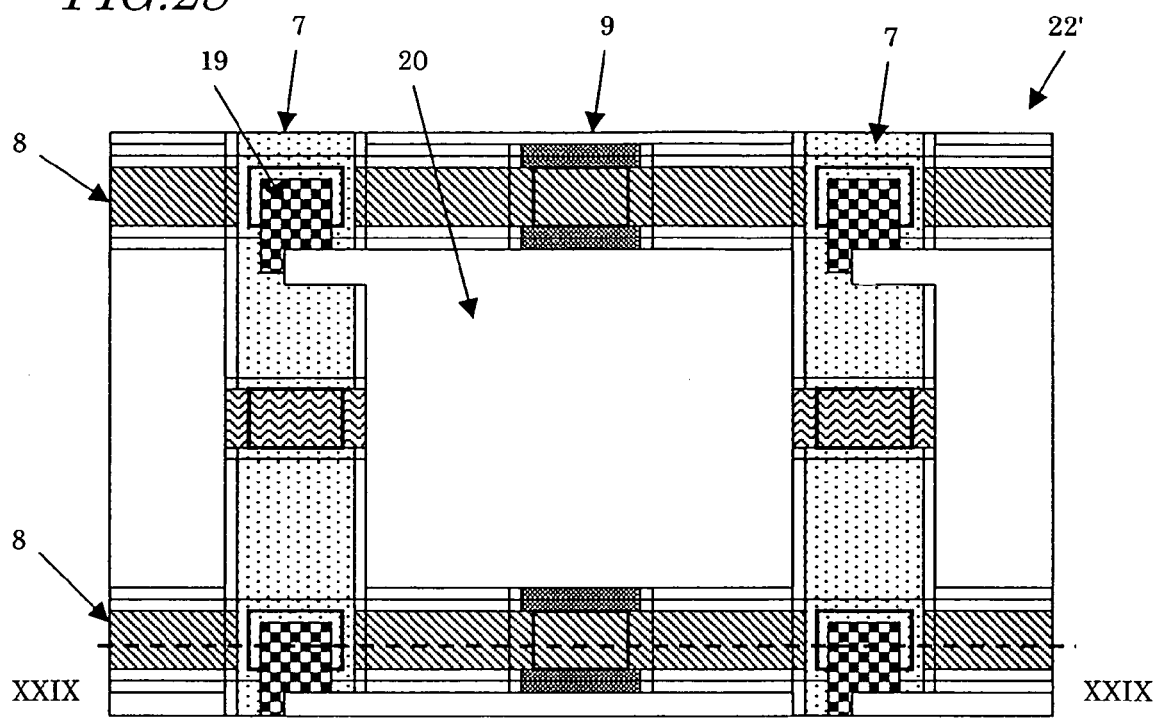
FIG. 28 is a plan view illustrating another modified example of the active-matrix substrate of the first preferred embodiment of the present invention.
Figure 29:
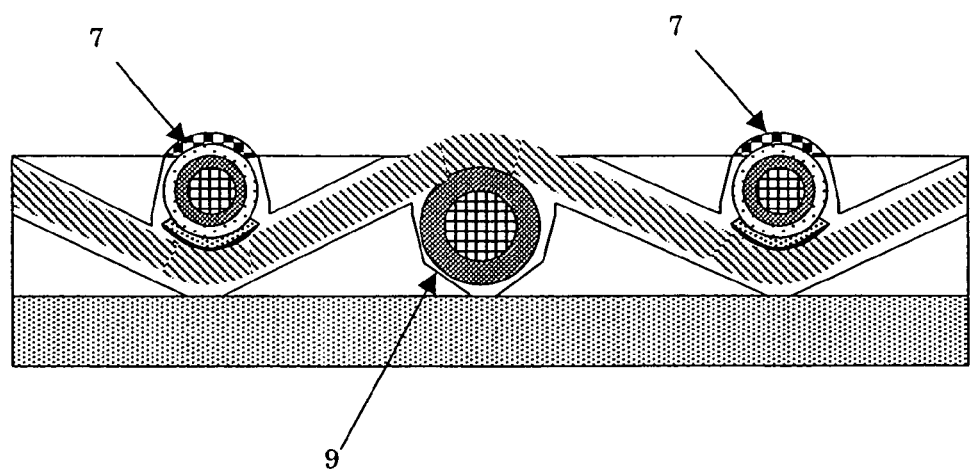
FIG. 29 is a cross-sectional view thereof as viewed along the plane XXIX-XXIX shown in FIG. 28.

Specifically, after the network structure 13 shown in FIG. 13 has been formed, as shown in FIGS. 22 and 23, the network structure 13 may be entirely covered with an opaque layer 27 made of a black resin. Next, as shown in FIGS. 24 and 25, the network structure 13 that is covered with the opaque layer 27 is fixed onto the substrate 16 with the planarizing layer 17. Thereafter, the opaque layer 27 and the planarizing layer 17 are partially etched away until the semiconductor layer 3 is exposed, thereby forming the openings 18 as shown in FIGS. 26 and 27. Finally, the second ohmic contact layer 19 and the pixel electrodes 20 are formed, thereby obtaining an active matrix substrate 22' including the opaque layer 27 as shown in FIGS. 28 and 29.

Figure 30:
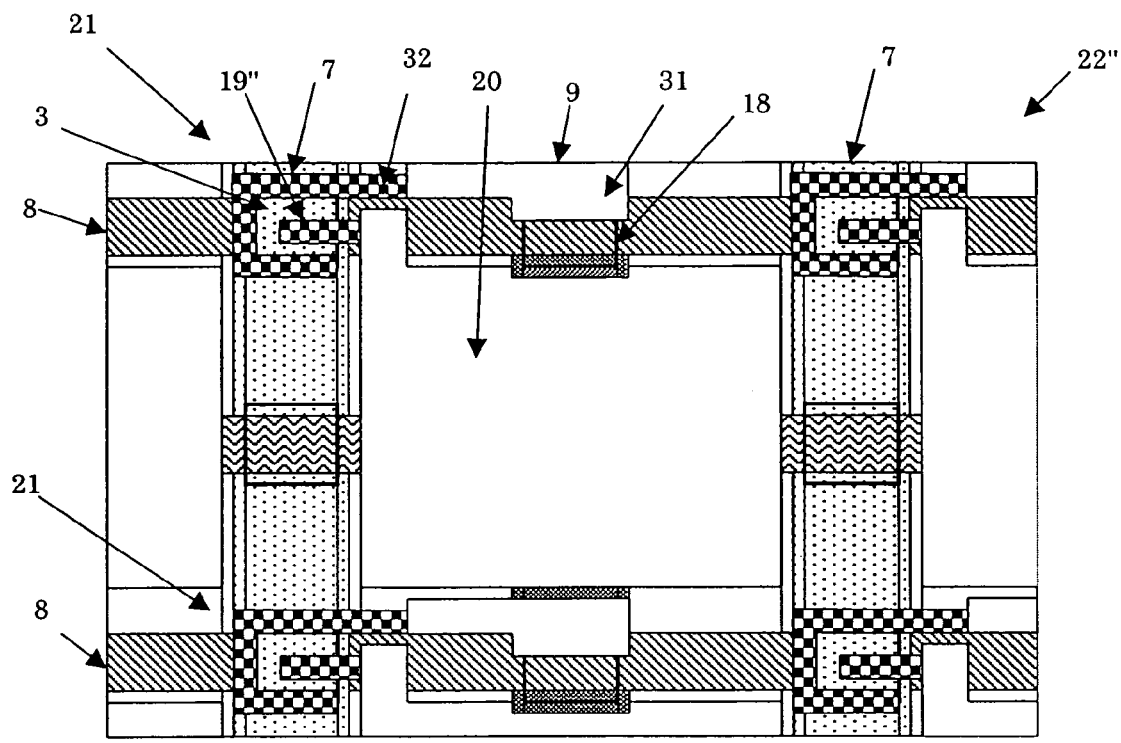
FIG. 30 is a plan view illustrating another modified example of the active-matrix substrate of the first preferred embodiment of the present invention.

In the preferred embodiment described above, the semiconductor layer 3 is continuous along the length of the function line 7. For that reason, if there is a short distance between two adjacent transistors 21, the two adjacent transistors 21 may interfere with each other. In that case, an alternative second ohmic contact layer 19", each portion of which is smaller than the opening 18, may be provided, and a third ohmic contact layer 32 may be provided such that each portion of the third ohmic contact layer 32 surrounds its associated portion of the second ohmic contact layer 19" as shown in FIG. 30. Additional openings 18 may preferably be provided at the intersections between the source lines 8 and the storage capacitor lines 9. In each of those additional openings 18, the third ohmic contact layer 32 is electrically connected to the source line 8 by way of an electrode 31 as also shown in FIG. 30. In such a structure, the third ohmic contact layer 32 can minimize the unwanted interference between two adjacent transistors 21.

Hereinafter, a second specific preferred embodiment of the present invention will be described. In the second preferred embodiment, the active-matrix substrate of the first preferred embodiment described above is applied to an "opposed-matrix" image display device. In the active-matrix substrate of the first preferred embodiment, the semiconductor layer surrounds each function line, and a number of transistors on the function line are joined together by way of the semiconductor layer. For that reason, the second ohmic contact layer of each transistor might be supplied with an unintentional leakage current from the source line of its adjacent transistor, not just the current flowing from its associated source line by way of the channel.

The amount of that leakage current would be negligible if the drain electrode of each transistor is sufficiently spaced apart from the source line of its adjacent transistor or if the channel of the semiconductor layer has a sufficiently high resistance. However, if a preferred embodiment of the present invention is applied to a high-definition image display device, the display quality could be seriously affected by that leakage current. An opposed-matrix image display device according to the present preferred embodiment of the present invention can be used effectively in such a situation.

Figure 31:
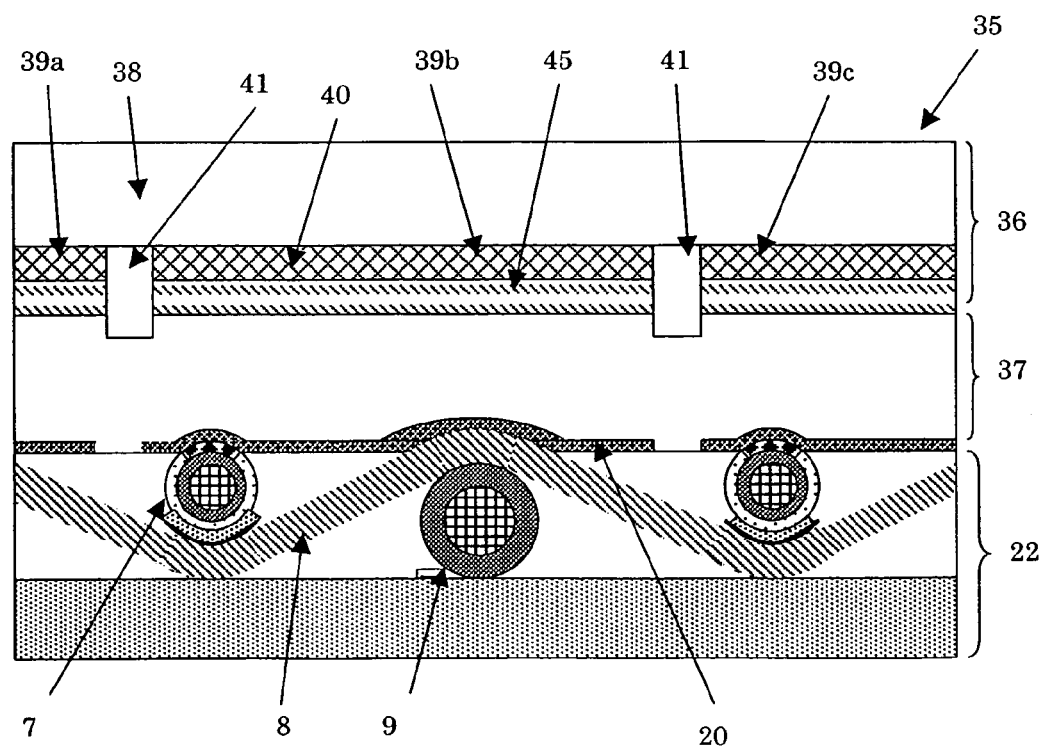
FIG. 31 is a cross-sectional view illustrating a display device according to a second specific preferred embodiment of the present invention.

FIG. 31 is a cross-sectional view schematically illustrating an opposed-matrix image display device 35 according to this preferred embodiment of the present invention. As shown in FIG. 31, the opposed-matrix image display device 35 includes the active-matrix substrate 22, a counter substrate 36 and a liquid crystal layer 37 that is sandwiched between the substrates 22 and 36. The active-matrix substrate 22 preferably has the same structure as the counterpart of the first preferred embodiment described above. In this second preferred embodiment, however, a reference potential is preferably applied to the source lines 8.

Figure 32:
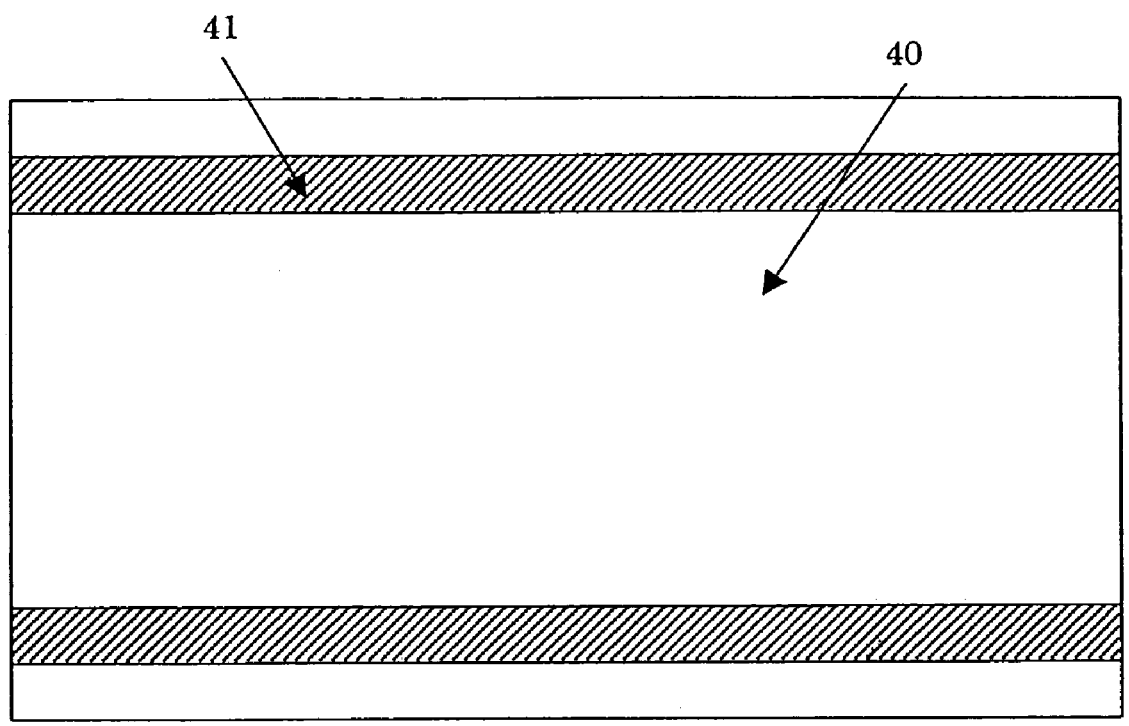
FIG. 32 is a plan view illustrating a counter substrate for use in the display device shown in FIG. 31.

As shown in FIGS. 31 and 32, the counter substrate 36 preferably includes a color filter layer 39 (including color filters 39a, 39b and 39a), transparent electrodes 40 preferably made of ITO, for example, and an opaque layer 50, which are stacked in this order on a transparent substrate 38. The transparent electrodes 40 on the counter substrate 36 extend substantially perpendicularly to the function lines 7 on the active-matrix substrate 22. Each of the transparent electrodes 40 functions as a data line to receive a data signal. In this opposed-matrix image display device, liquid crystal molecules of the liquid crystal layer 37 are driven by creating a potential difference between the transparent electrode 40 and the pixel electrode 20, thereby displaying an image thereon.

In this opposed-matrix image display device 35, the same signal is input to the respective pixel electrodes 20. Accordingly, even if the same semiconductor layer 3 is shared by multiple adjacent transistors on a function line 7, no leakage current will flow from one of the transistors into its adjacent transistor because the pixel electrodes 20 are at the same potential level. Thus, the image display device achieves a high definition and excellent image quality.

In the preferred embodiment described above, the function lines 7 cross the source lines 8, through which a reference potential is applied, substantially at right angles. However, the function lines 7 do not have to extend substantially perpendicularly to the source lines 8 but may extend substantially parallelly to the source lines 8.

A third specific preferred embodiment of the present invention will be described with reference to FIGS. 33 and 34.

Unlike the active-matrix substrate 22 of the first preferred embodiment described above, an active-matrix substrate 50 according to the third preferred embodiment of the present invention includes no storage capacitor lines 9 and no dummy lines 28.

Figure 33:
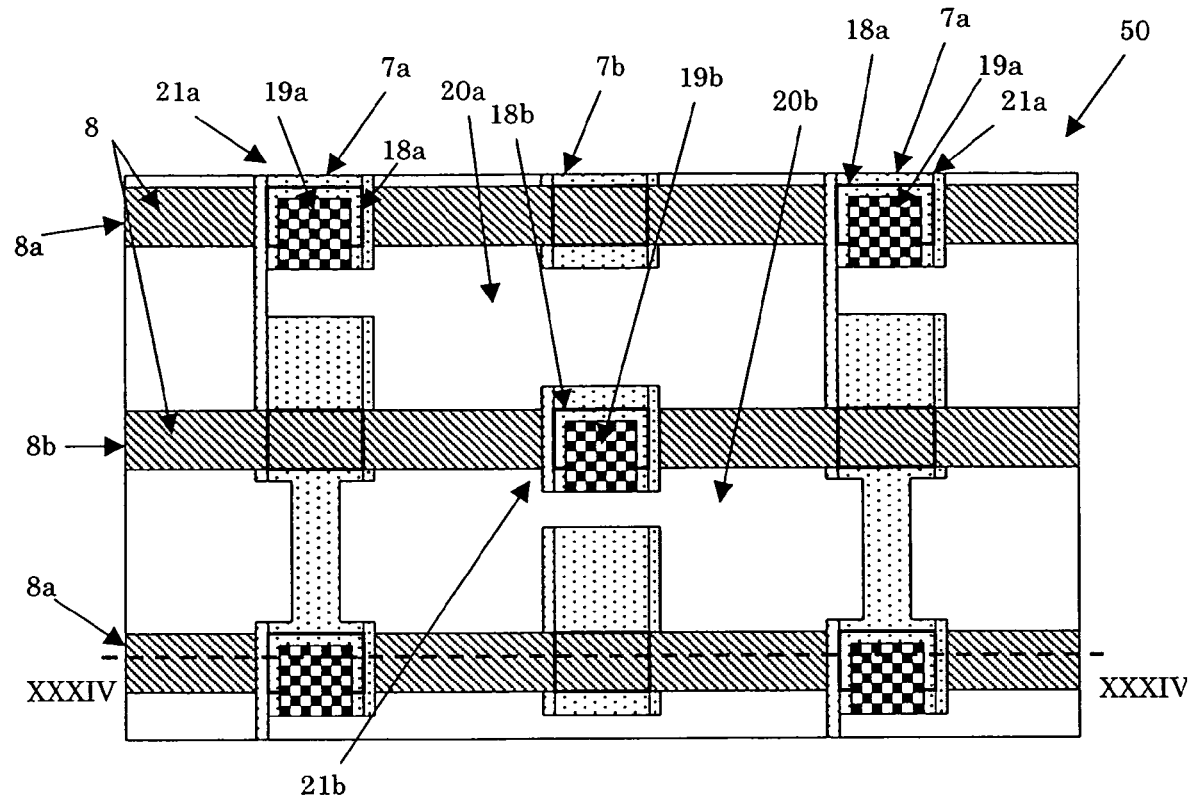
FIG. 33 is a plan view illustrating an active-matrix substrate according to a third specific preferred embodiment of the present invention.
Figure 34:
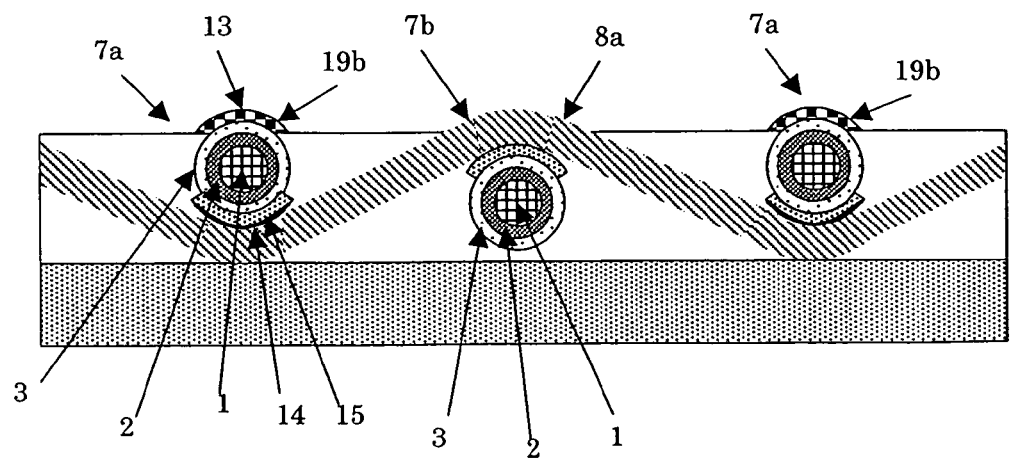
FIG. 34 is a cross-sectional view thereof as viewed along the plane XXXIV-XXXIV shown in FIG. 33.

As shown in FIGS. 33 and 34, the active-matrix substrate 50 includes a first group of function lines 7a, a second group of function lines 7b, a first group of source lines 8a, and a second group of source lines 8b. The first and second groups of function lines 7a and 7b are arranged alternately. Each of the function lines 7a and 7b in the first and second groups has the same structure as the function line 7 of the first preferred embodiment described above. The first and second groups of source lines 8a and 8b are also arranged alternately. Each of the source lines 8a and 8b in the first and second groups also has the same structure as the source line 8 of the first preferred embodiment described above.

As in the first preferred embodiment described above, the first and second groups of function lines 7a and 7b and the first and second groups of source lines 8a and 8b are also woven together by the plain weaving technique. In the plain weaving technique, the vertical level relationship between a pair of warp and woof threads at an intersection is opposite to the vertical level relationship between another pair of warp and woof threads at the next intersection. In this preferred embodiment, the first and second groups of function lines 7a and 7b are arranged alternately and the first and second groups of source lines 8a and 8b are also arranged alternately. Accordingly, at each intersection between a function line 7a in the first group and a source line 8a in the first group, the function line 7a is always located over the source line 8a. In the same way, at each intersection between a function line 7b in the second group and a source line 8b in the second group, the function line 7b is always located over the source line 8b.

An opening 18a is provided at each intersection between the function line 7a in the first group and the source line 8a in the first group so as to allow a second ohmic contact layer 19a to make an electrical contact with the semiconductor layer 3 of the function line 7a. In the same way, an opening 18b is provided at each intersection between the function line 7b in the second group and the source line 8b in the second group so as to allow a second ohmic contact layer 19b to make an electrical contact with the semiconductor layer 3 of the function line 7b. In this manner, a transistor 21a belonging to a first group is formed at each intersection between the function line 7a in the first group and the source line 8a in the first group, while a transistor 21b belonging to a second group is formed at each intersection between the function line 7b in the second group and the source line 8b in the second group. As a result, a transistor array, including the first group of transistors 21a and the second group of transistors 21b, is formed.

A pixel electrode 20a belonging to a first group is connected to the second ohmic contact layer 19a of each transistor 21a in the first group. On the other hand, a pixel electrode 20b belonging to a second group is connected to the second ohmic contact layer 19b of each transistor 21b in the second group. As shown in FIG. 33, each pair of pixel electrodes 20a and 20b in the first and second groups are provided in a region which is defined by a set of four adjacent transistors 21a in the first group and which corresponds to one pixel-electrode 20 of the first preferred embodiment described above.

On this active-matrix substrate 50, a column of pixel electrodes, which is an alternate arrangement of the pixel electrodes 20a in the first group and the pixel electrodes 20b in the second group, is driven by the core 1 of the function line 7a and the core 1 of the function line 7b. In such a structure, the transistors to be connected to the pixel electrodes may all be arranged on the recto (or the verso) of the network structure of the transistor array.

Figure 35:
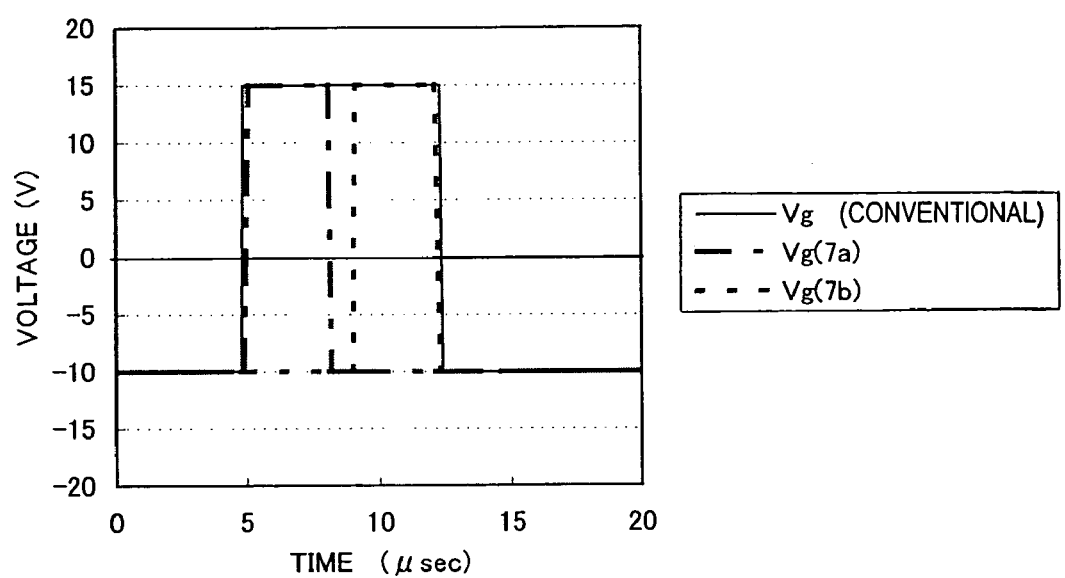
FIG. 35 shows the waveform of an exemplary gate signal to be applied to the active-matrix substrate shown in FIG. 33.

To drive the active-matrix substrate 50, the same gate signal may be supplied to the core 1 of each function line 7a in the first group and to the core 1 of associated function line 7b in the second group. Also, if the semiconductor layer 3 achieves a sufficiently high mobility and if the pixel electrodes can afford to be charged even when the ON-state period of each transistor is halved, a gate signal, of which the pulse width is half or less of that of the conventional gate signal for one pixel as shown in FIG. 35, may be separately applied to the core 1 of the function line 7a in the first group and to the core 1 of the function line 7b in the second group. Then, the amount of current leaking from a transistor to an adjacent transistor by way of the semiconductor layer 3 can be reduced.

As described above, according to this preferred embodiment, there is no need to provide any dummy lines. In the first preferred embodiment described above, one pixel is preferably defined by two vertical lines (i.e., a storage capacitor line and a function line) and two horizontal lines (i.e., a source line and a dummy line). On the other hand, in this third preferred embodiment, one pixel is preferably defined by two vertical lines (i.e., a pair of function lines) and two horizontal lines (i.e., source lines). Accordingly, when the network structure of the transistor array of this preferred embodiment has the same pitch as the network structure of the first preferred embodiment, the transistor array of this preferred embodiment can have a higher resolution. The rate at which the function lines are woven depends on the pitch of the transistor array. For that reason, when the transistor array of this preferred embodiment should have the same resolution as the counterpart of the first preferred embodiment described above, the former transistor array can be manufactured at a higher rate.

Optionally, as in the first preferred embodiment described above, the active-matrix substrate 50 of this preferred embodiment may also be provided with an opaque layer or an insulating layer, if necessary or desirable.

Hereinafter, a fourth specific preferred embodiment of the present invention will be described. An active-matrix substrate according to the fourth preferred embodiment has its network structure formed without weaving the function lines and source lines together.

Such an active-matrix substrate may be made in the following manner.

Figure 36:
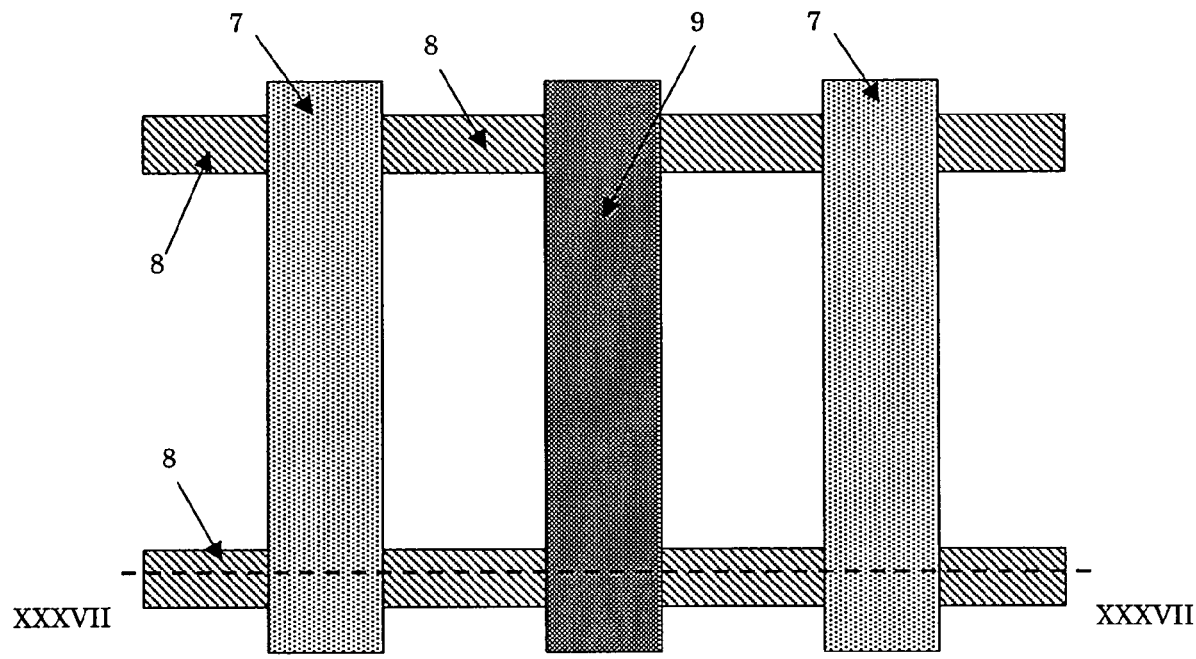
FIG. 36 is a plan view showing a processing step to make an active-matrix substrate according to a fourth specific preferred embodiment of the present invention.
Figure 37:
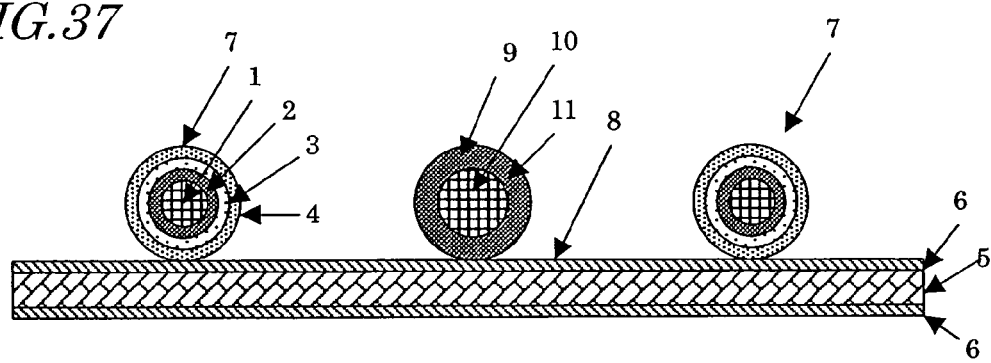
FIG. 37 is a cross-sectional view thereof as viewed along the plane XXXVII-XXXVII shown in FIG. 36.
Figure 38:
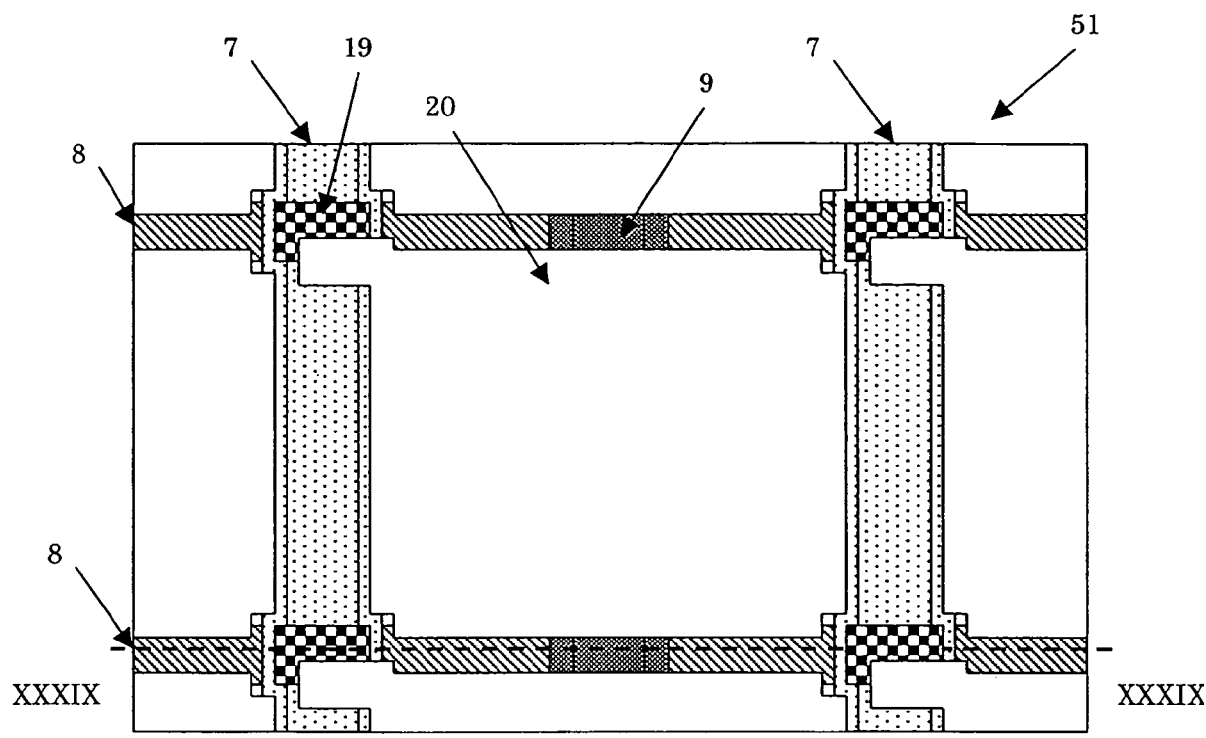
FIG. 38 is a plan view illustrating the active-matrix substrate of the fourth preferred embodiment of the present invention.
Figure 39:
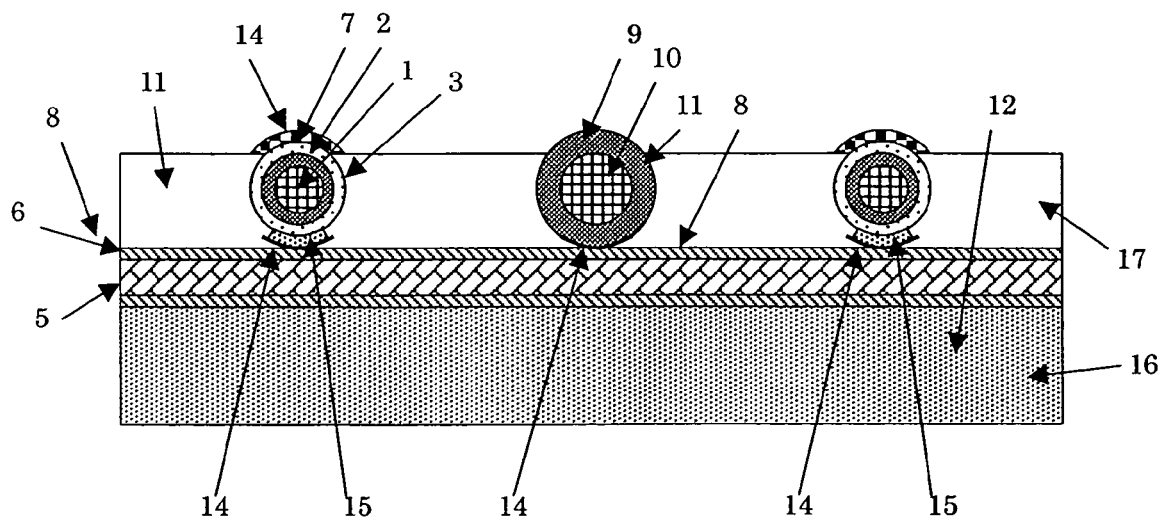
FIG. 39 is a cross-sectional view thereof as viewed along the plane XXXIX-XXXIX shown in FIG. 38.

First, the function lines 7, source lines 8 and storage capacitor lines 9 are prepared as described above with respect to the first preferred embodiment. More specifically, after the source lines 8 have been arranged substantially parallel to each other, the function lines 7 and storage capacitor lines 9 are arranged so as to cross the source lines 8 substantially at right angles and to contact with the source lines 8 as shown in FIG. 36. Thereafter, as already described for the first preferred embodiment, the conductor layer 6 on the surface of the source lines 8 is melted and solidified, thereby connecting the source lines 8 to the function lines 7 and the storage capacitor lines 9. As a result, the conductor layer 6 of the source lines 8 is melted to form the connecting portions 14 between the source lines 8 and the function lines 7 and between the source lines 8 and the storage capacitor lines 9, as shown in FIGS. 38 and 39. The connecting portions 14 provide a broader area of contact between the source lines 8 and the function lines 7 and between the source lines 8 and the storage capacitor lines 9, thereby connecting these pairs of lines even more firmly and securely both electrically and mechanically alike.

Subsequently, as described for the first preferred embodiment, the network structure that has been formed by connecting the source lines 8 to the function lines 7 and the storage capacitor lines 9 in this manner is subjected to an etching process, thereby selectively removing the ohmic contact layer 4 of the function lines 7 with the connecting portions 14 functioning as a mask. Then, the patterned network structure is fixed onto the substrate 16 with the planarizing layer 17. In this preferred embodiment, the function lines 7 and the source lines 8 are not woven together. Accordingly, a portion of the function line 7 that crosses the source line 8 and other portions of the function line 7 are located at the same vertical level. Accordingly, as the planarizing layer 17 is going to be etched away by a CMP process, for example, an opening is formed so as to expose a portion of the semiconductor layer 3 of the function line 7 continuously along the function line 7. Thereafter, the second ohmic contact layer 19 and the pixel electrodes 20 are formed as in the first preferred embodiment.

In the active-matrix substrate 51 that has been formed in this manner, the function lines 7 cross the source lines 8 at the same vertical level everywhere. Accordingly, there is no need to provide the dummy lines, which are used to adjust the vertical levels of the intersections in the first preferred embodiment described above, for the active-matrix substrate 51 of this fourth preferred embodiment. Thus, the source lines 8 may be arranged at a narrower pitch. As a result, a high-resolution image display device can be obtained with the pixel pitch reduced vertically to the source lines. Also, the storage capacitor lines 9 do not adjust the vertical levels of the function lines 7 at the intersections between the source lines 8 and the function lines 7. Therefore, if there is no need to increase the storage capacitance with the storage capacitor lines 9, the storage capacitor lines 9 may be omitted as well. In that case, the pixel pitch can also be reduced substantially parallel to the source lines. Thus, an image display device having an even higher resolution is realized.

Furthermore, according to this preferred embodiment, the function lines 7, source lines 8 and storage capacitor lines 9 do not have to be woven together. Thus, a transistor array having a network structure and an active-matrix substrate including such a transistor array can be obtained in a shorter time than the first preferred embodiment.

Hereinafter, a fifth specific preferred embodiment of the present invention will be described. The fifth preferred embodiment relates to a jig assembly for use to make the network structure of the active-matrix substrate of the fourth preferred embodiment without weaving the function lines 7, source lines 8 and storage capacitor lines 9 together.

Figure 41:
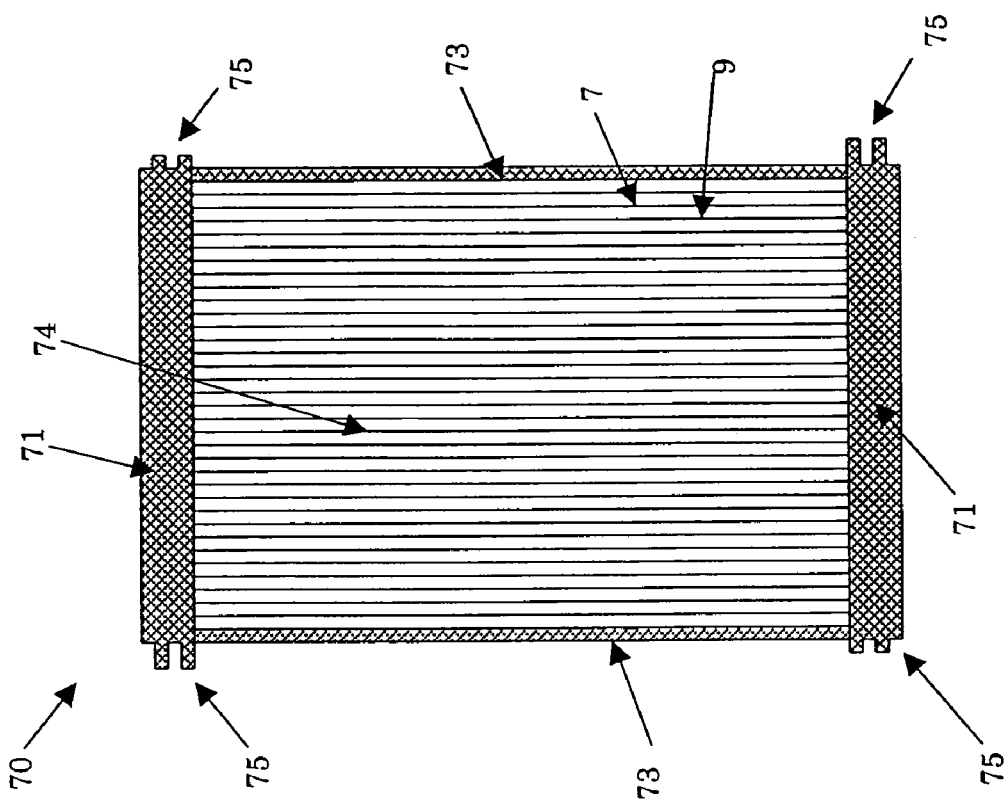
FIG. 41 is a plan view illustrating a second fixing jig according to the fifth preferred embodiment of the present invention.
Figure 40:
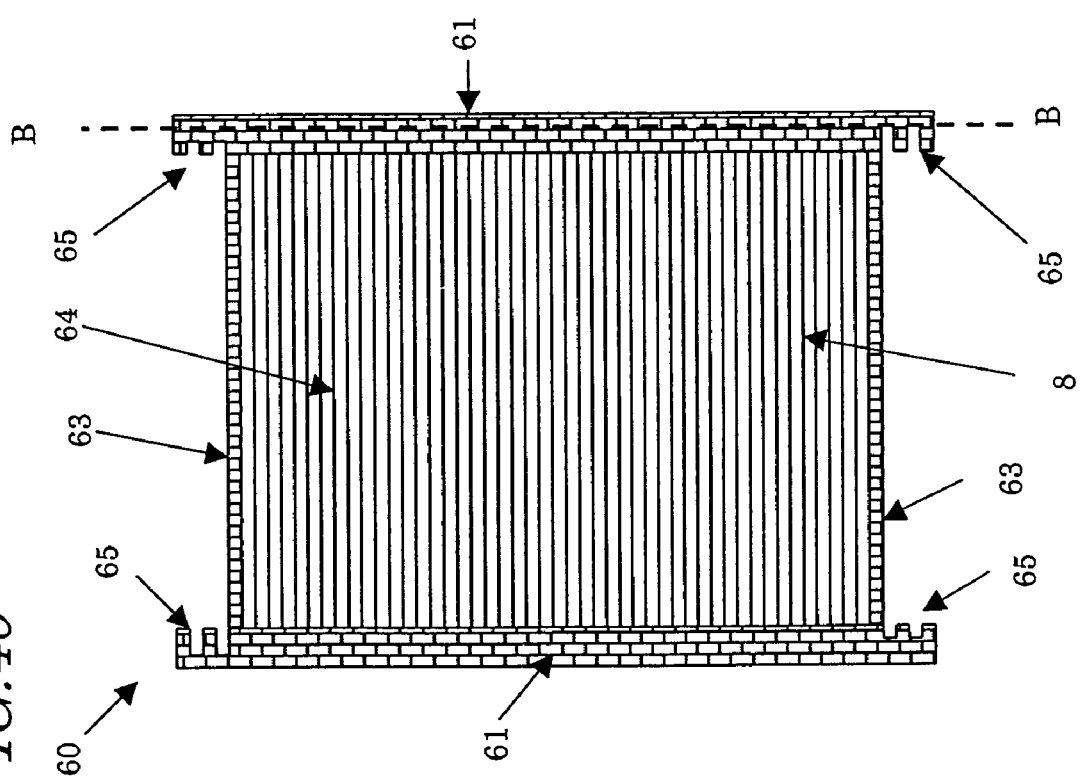
FIG. 40 is a plan view illustrating a first fixing jig according to a fifth specific preferred embodiment of the present invention.

FIG. 40 illustrates a first fixing jig 60 for use to fix the source lines 80 as fine wires. FIG. 41 illustrates a second fixing jig 70 for use to fix the function lines 7 and storage capacitor lines 9 as fine wires. As shown in FIG. 40, the first fixing jig 60 includes a pair of fixing portions 61 and a pair of auxiliary portions 63.

The fixing portions 61 are used to hold the source lines 8 by gripping them at both ends thereof. The auxiliary portions 63 are used to space the fixing portions 61 from each other and are combined with the fixing portions 61 to form a frame structure, which defines an inner space 64. Both ends of the fixing portions 61 include engaging portions 65 to engage with a third fixing jig 70 (see FIG. 45). The second fixing jig 70 also includes a pair of fixing portions 71, a pair of auxiliary portions 73 and engaging portions 75.

Figure 42:
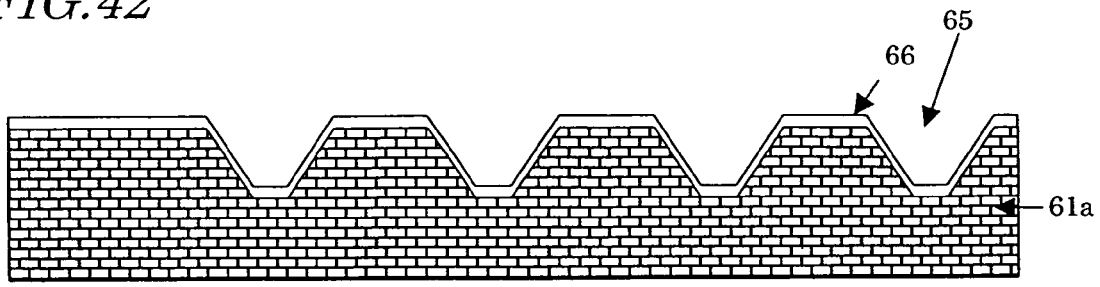
FIGS. 42, 43 and 44 are cross-sectional views showing respective processing steps to fix source lines with the first fixing jig.
Figure 43:
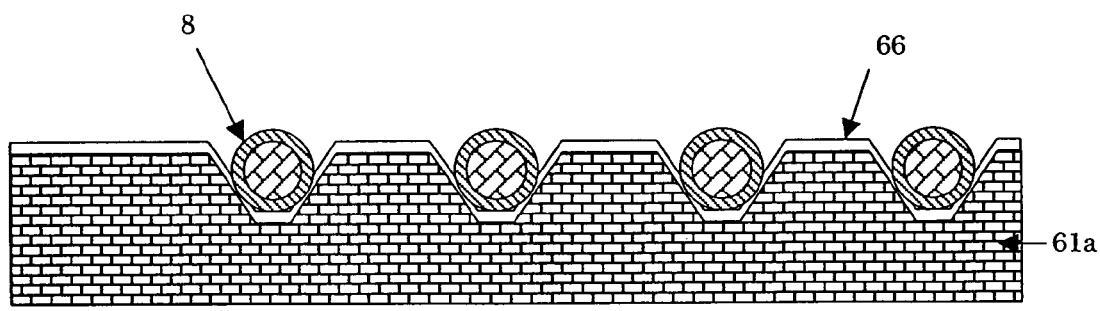
Figure 44:
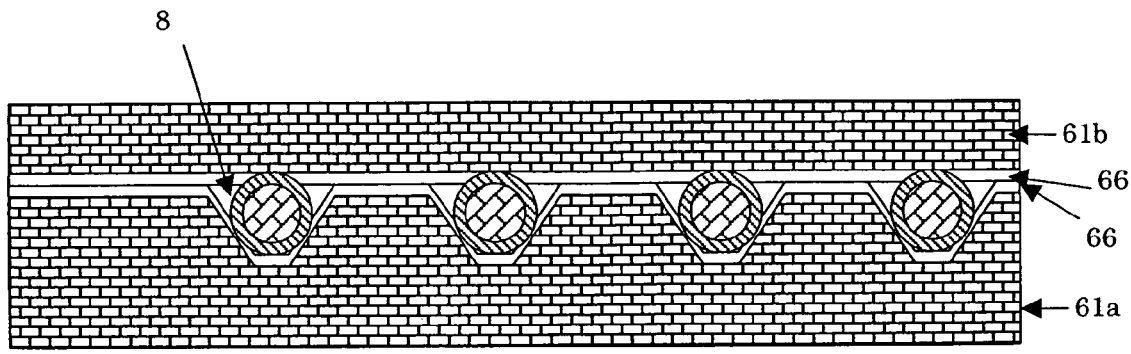

FIGS. 42, 43 and 44 are cross-sectional views of the first fixing jig 60 as viewed on the plane XLII-XLII shown in FIG. 40 and show how to fix the source lines 8 with the first fixing jig 60. As shown in FIGS. 42, 43 and 44, each of the fixing portions 61 includes a lower half 61a with multiple grooves 65 to receive the source lines 8 and an upper half 61b to press the source lines 8 onto the grooves 65. The number, depth and gap of the grooves 65 are optimized according to the diameter of the source lines 8 and the specifications of the active-matrix substrate 51 to be made. Also, the inner surfaces of the grooves 65 on the lower half 61a and the surface of the upper half 61b to be opposed to the lower half 61a are coated with a cushion layer 66 of a resin, for example, or an adhesive layer 66.

Figure 45:
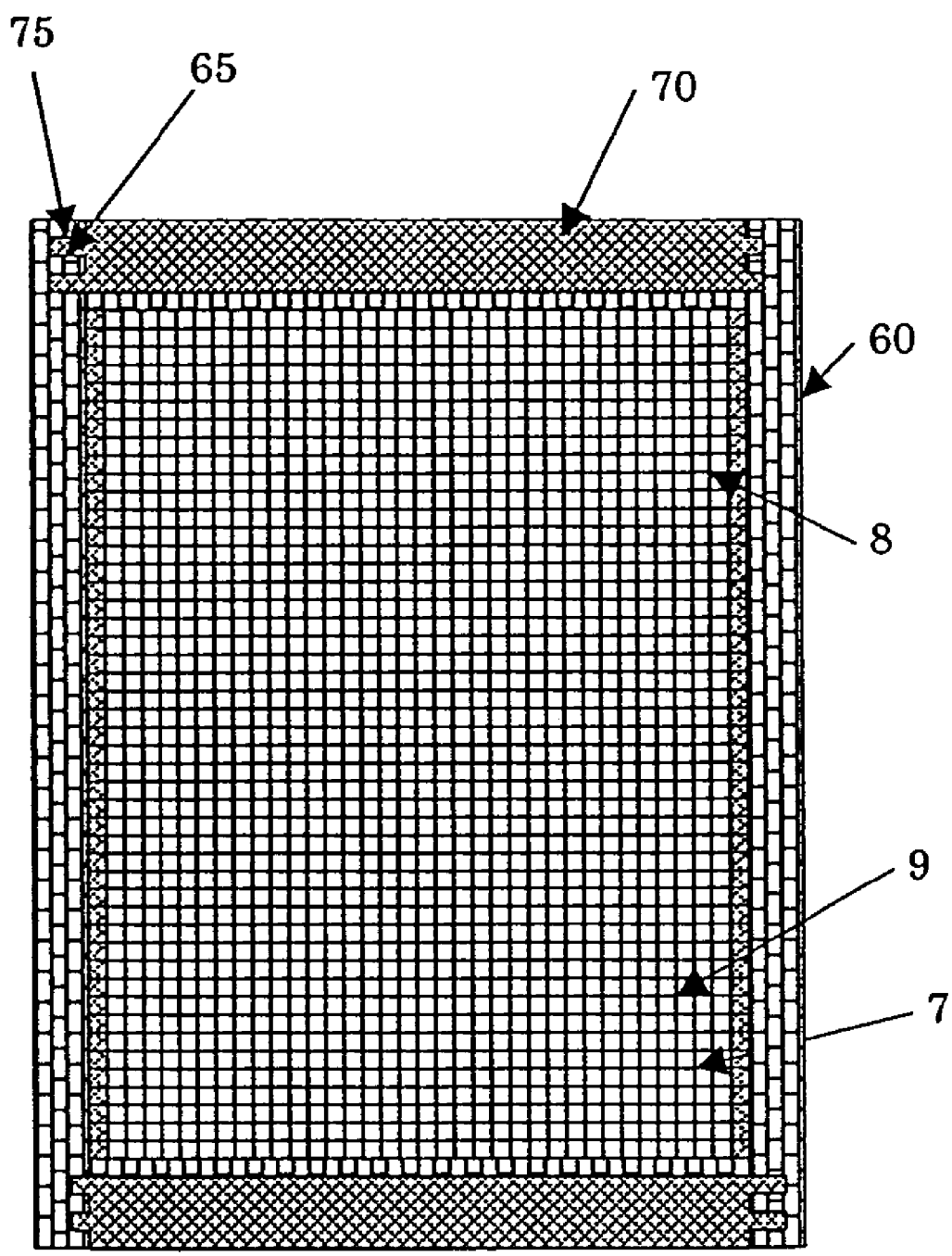
FIGS. 45 and 46 are respectively a plan view and a cross-sectional view illustrating a state where the source line, function line and storage capacitor line are arranged with the first and second fixing jigs.

As shown in FIGS. 44 and 45, while applying a tension thereto, the source lines 8 are placed onto the grooves 65 such that both ends thereof are located at the lower halves 61a. Then, the source lines 8 are sandwiched between the upper and lower halves 61b and 61a. Since the adhesive layers 66 are provided, the source lines 8 can be held by the fixing portions 61 while maintaining its tension and without loosening at all. In the same way, the function lines 7 and the storage capacitor lines 9 are fixed onto the second fixing jig 70 as shown in FIG. 41.

Figure 46:
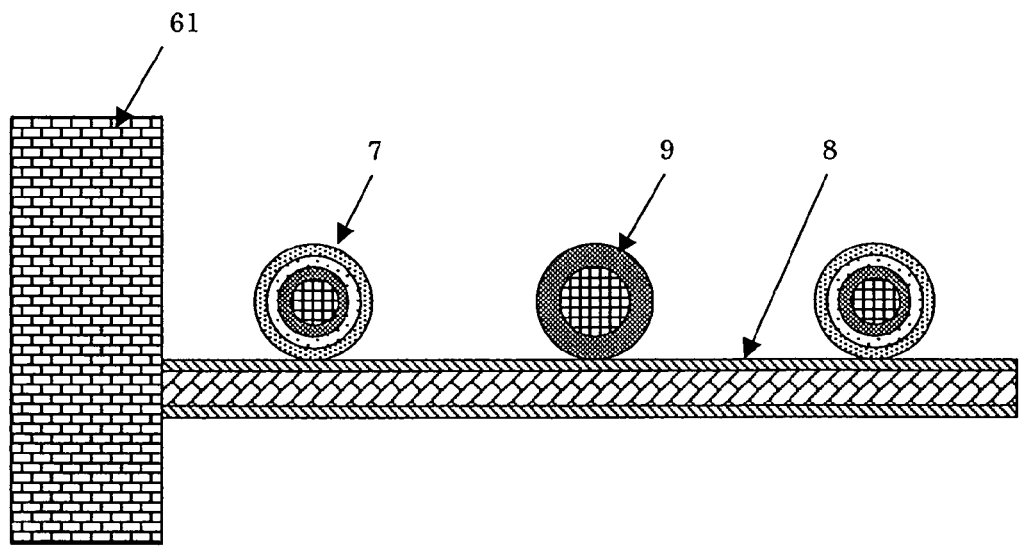

Next, as shown in FIG. 45, the first and second fixing jigs 60 and 70 are stacked one upon the other such that the engaging portions 65 of the first fixing jig 60 engage with the engaging portions 75 of the second fixing jig 70. When these engaging portions 65 and 75 engage with each other, the second fixing jig 70 is positioned relative to the first fixing jig 60 such that the source lines 8 cross the function lines 7 and storage capacitor lines 9 substantially at right angles and contact with these lines 7 and 9 as shown in FIG. 46.

Figure 47:
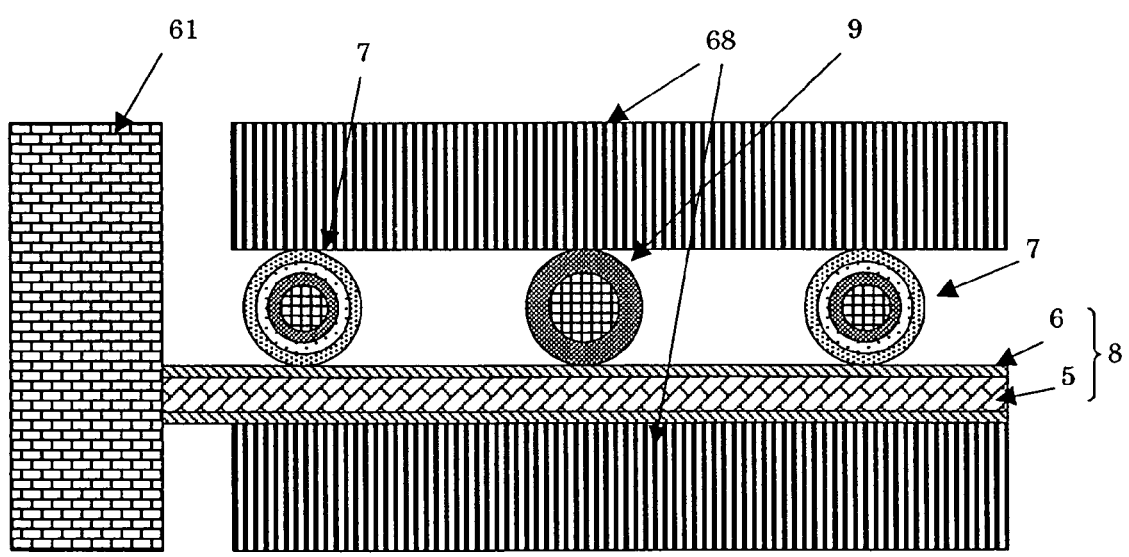
FIGS. 47, 48, 49, 50, 51 and 52 are cross-sectional views showing respective processing steps to make the active-matrix substrate of the fifth preferred embodiment of the present invention.
Figure 48:
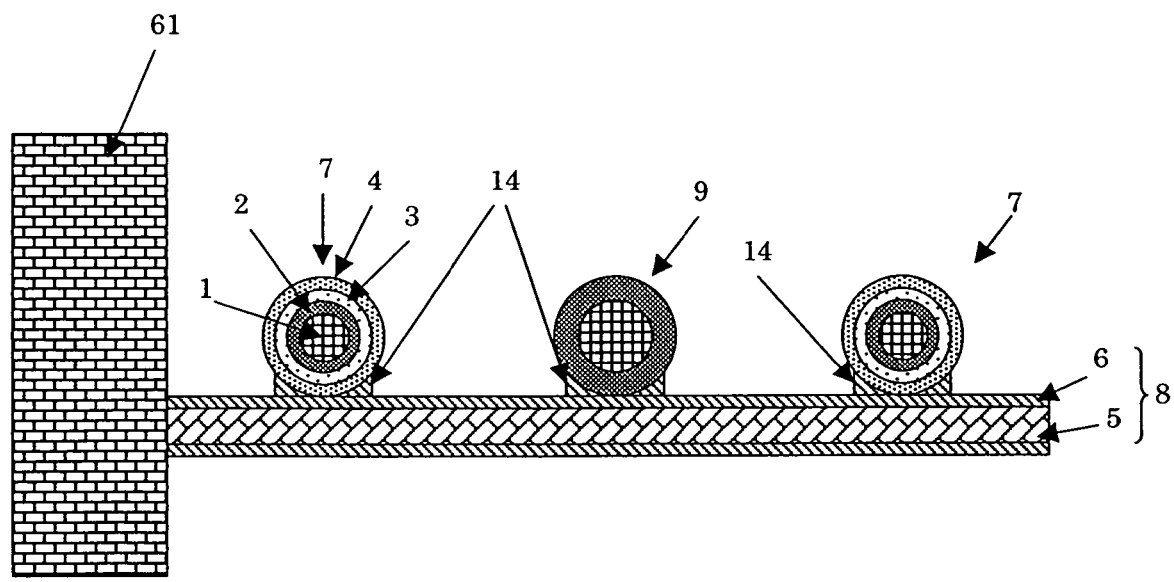

Subsequently, as shown in FIG. 47, the source lines 8, function lines 7 and storage capacitor lines 9 are sandwiched between, and heated by, a pair of heating/welding plates 68. As a result, the conductor layer 6 of the source lines 8 is melted to form bonding portions 14 between the source lines 8 and the function lines 7 and between the source lines 8 and the storage capacitor lines 9 as shown in FIG. 48. When the bonding portions 14 are formed, the source lines 8 are firmly and securely connected to the function lines 7 and storage capacitor lines 9 both electrically and mechanically alike. Thereafter, as already described for the first preferred embodiment, the ohmic contact layer 4 is selectively removed.

Figure 49:
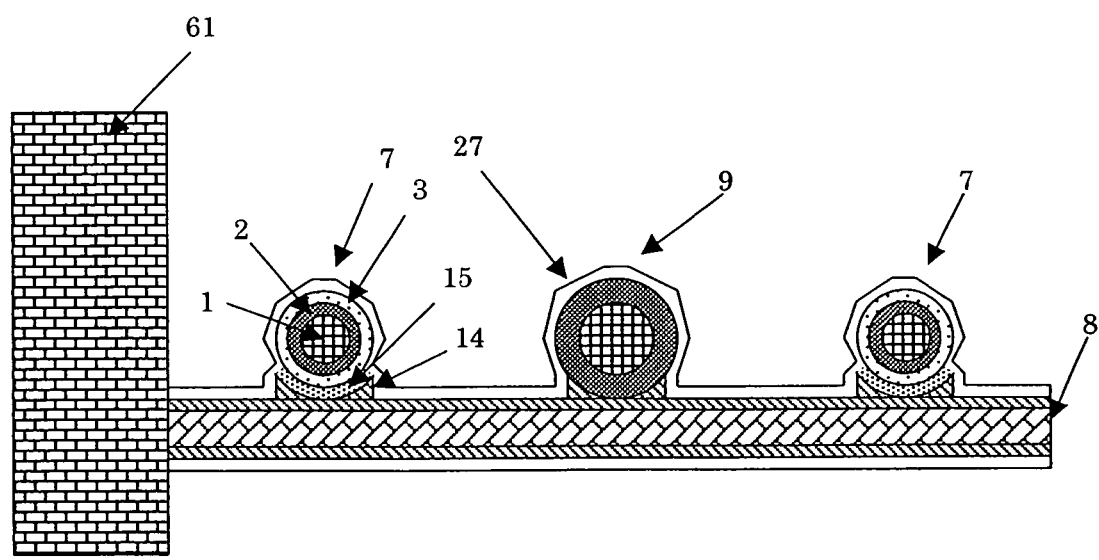
Figure 50:
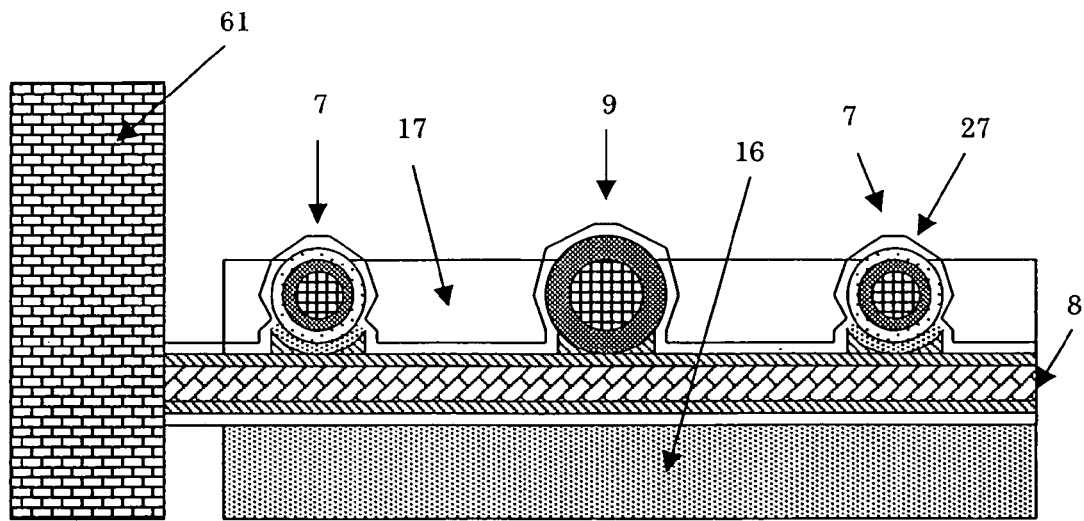
Figure 51:
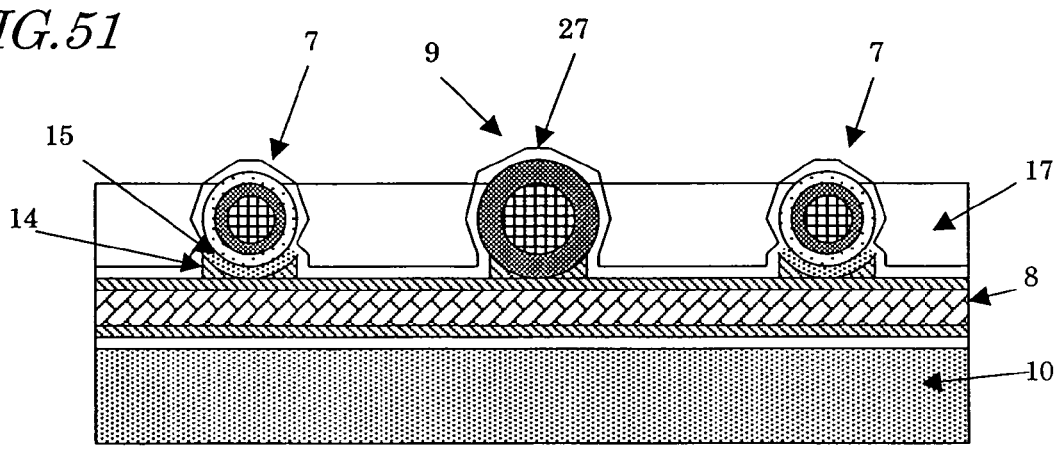
Figure 52:
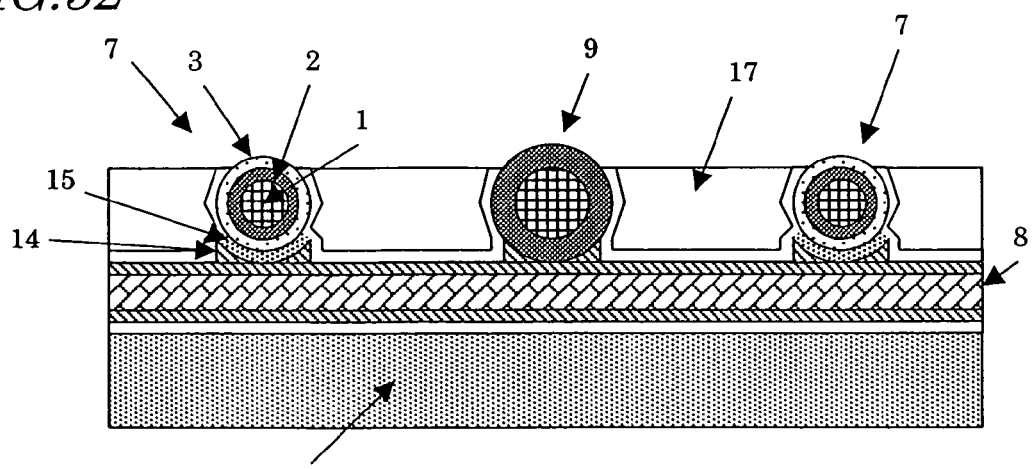

If necessary, the surface of the source lines 8, function lines 7 and storage capacitor lines 9 may be coated with an opaque layer 27 after that, as shown in FIG. 49. And then the network structure may be fixed onto the substrate 16 with the planarizing layer 17 as shown in FIG. 50. Alternatively, the opaque layer 27 may be replaced with a protective coating. As another alternative, both the opaque layer 27 and the protective coating may be provided. Thereafter, excessive portions of the source lines 8, function lines 7 and storage capacitor lines 9 are cut off along the outer periphery of the substrate 16 to obtain the structure shown in FIG. 51. Finally, the opaque layer 27 is selectively removed to expose the semiconductor layer 3 as shown in FIG. 52.

By using the fixing jigs of this preferred embodiment, the source lines 8, function lines 7 and storage capacitor lines 9 can be firmly held with a constant tension applied thereto. In addition, a huge number of source lines 8, function lines 7 or storage capacitor lines 9 can be handled easily. Thus, the yield can be increased in the manufacturing process of the active-matrix substrates.

Hereinafter, a sixth specific preferred embodiment of the present invention will be described. The sixth preferred embodiment relates to an active-matrix substrate that includes light-emitting or light-guiding illumination lines.

First, a light-emitting illumination line 80 will be described as an exemplary illumination line with reference to FIG. 53.

Figure 53:
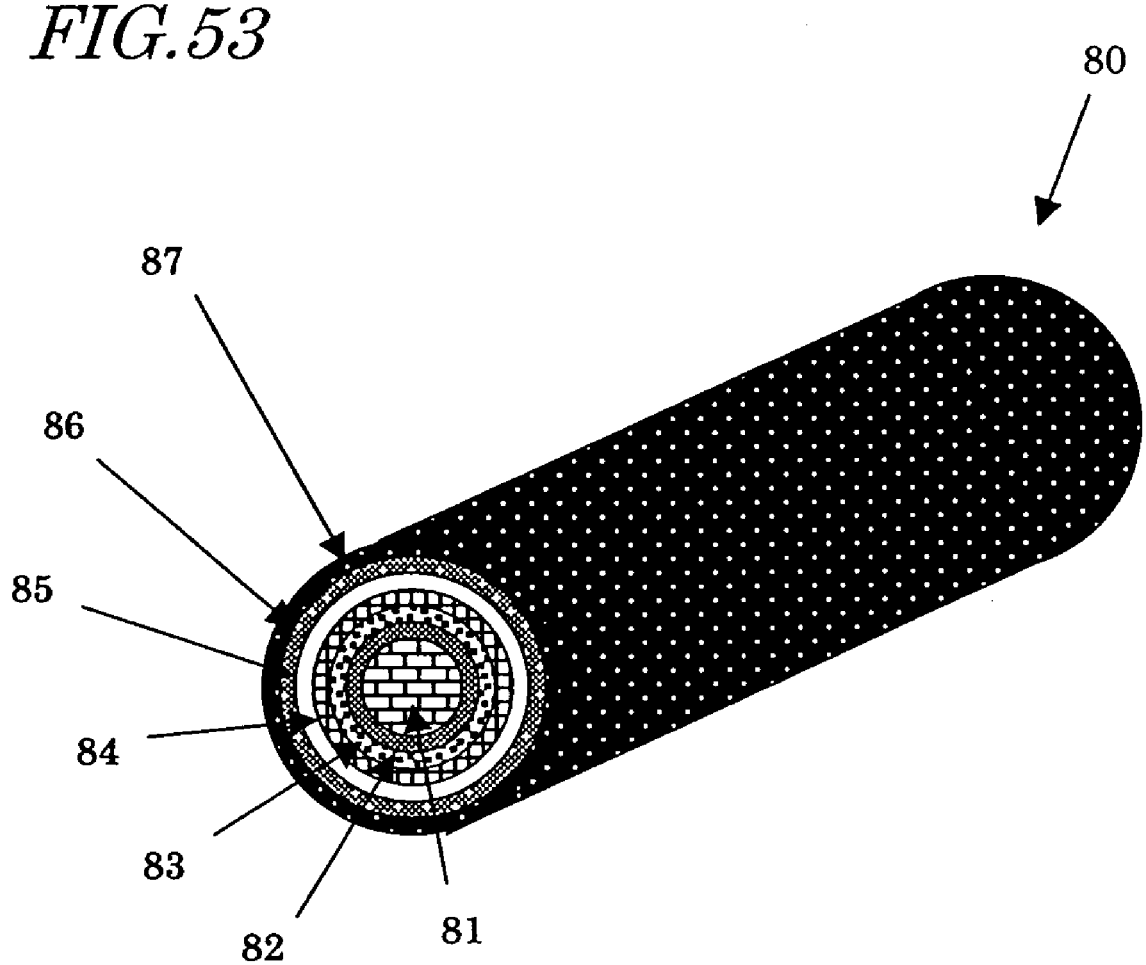
FIG. 53 is a perspective view illustrating the structure of an illumination line for use in a sixth specific preferred embodiment of the present invention.

As shown in FIG. 53, the illumination line 80 preferably includes a core 81, at least the surface of which is electrically conductive and which has a diameter of about 30 μm, for example, a hole transport layer 82 that covers the core 81, a light-emitting layer 83 that covers the hole transport layer 82, an electron transport layer 84 that covers the light-emitting layer 83, and a transparent electrode 85 that covers the electron transport layer 84.

The hole transport layer 82, light-emitting layer 83 and electron transport layer 84 may be made of known electroluminescent (EL) materials. Also, the hole transport layer 82 may be provided outside of the light-emitting layer 83 and the electron transport layer 84 may be provided inside of the light-emitting layer 83. When a voltage is created between the core 81 and the transparent electrode 85, light is emitted from the light-emitting layer 83 and then goes out through a side of the illumination line 80. As shown in FIG. 53, the transparent electrode 85 of the illumination line 80 is surrounded with an insulating layer 86, which is further surrounded with an electrically insulating melting adhesive layer 87. The melting adhesive layer 87 is preferably made of a material that exhibits an electrically insulating property and that melts at a temperature of about 100° C. to about 400° C.

Figure 54:
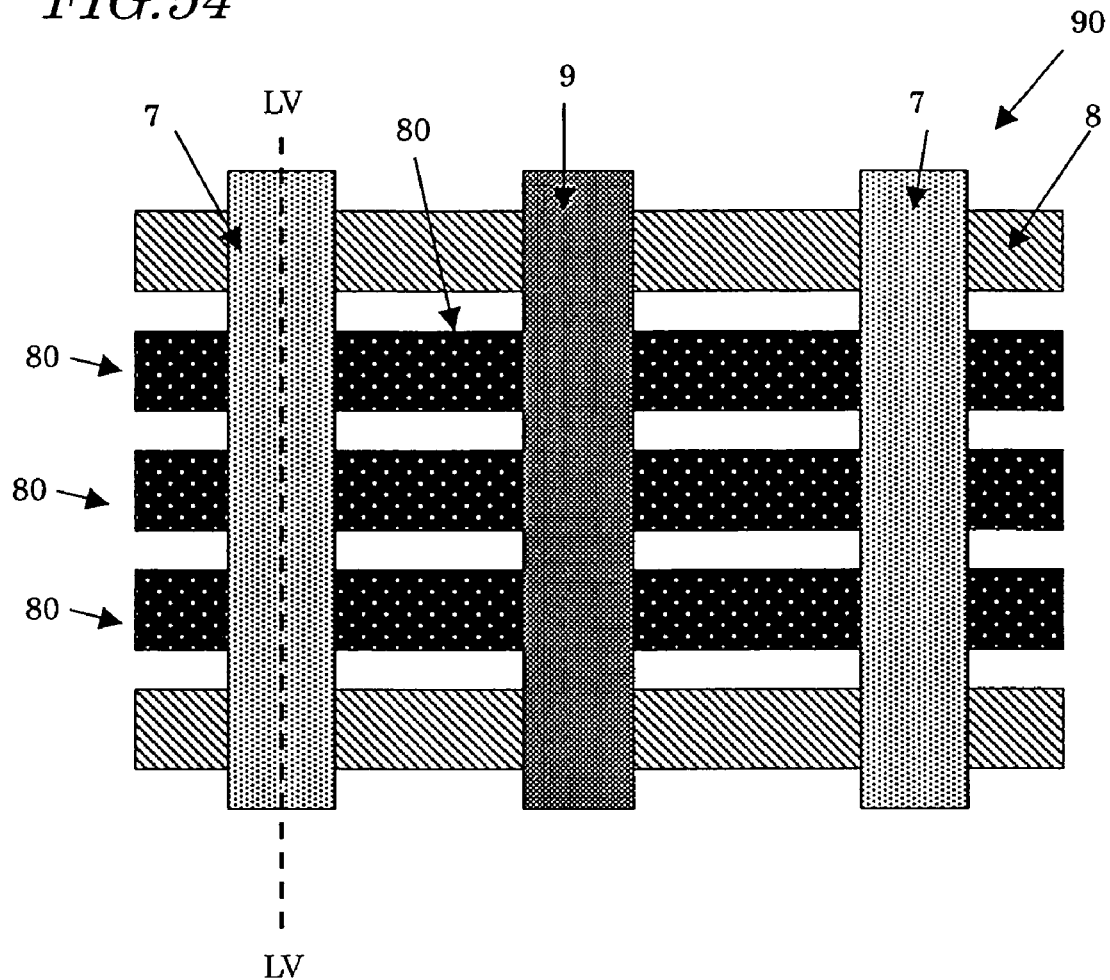
FIG. 54 is a plan view showing a processing step to make an active-matrix substrate according to the sixth preferred embodiment.
Figure 55:
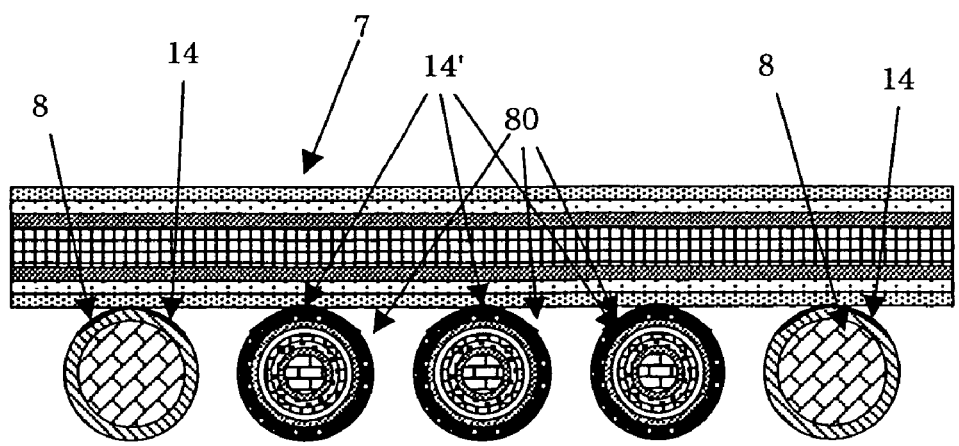
FIG. 55 is a cross-sectional view thereof as viewed along the plane LV-LV shown in FIG. 54.

As shown in FIGS. 54 and 55, one source line 8 is alternated with one or multiple illumination lines 80. In the example illustrated in FIG. 54, one source line 8 is alternated with three illumination lines 80. Then, the function lines 7 and the storage capacitor lines 9 are arranged so as to cross, and contact with, the source lines 8 and the illumination lines 80. Thereafter, this arrangement is heated, thereby melting portions of the conductor layer 6 of the source lines 8 and forming the connecting portions 14 such that the source lines 8 are connected to the function lines 7 and storage capacitor lines 9 both electrically and mechanically alike. At the same time, the electrically insulating melting adhesive layer 87 of the illumination lines 80 is also melted due to the heat to form connecting portions 14'. The connecting portions 14' mechanically connect the illumination line 80 to the function lines 7 and storage capacitor lines 9. In this manner, a network structure 90 is formed.

Figure 56:
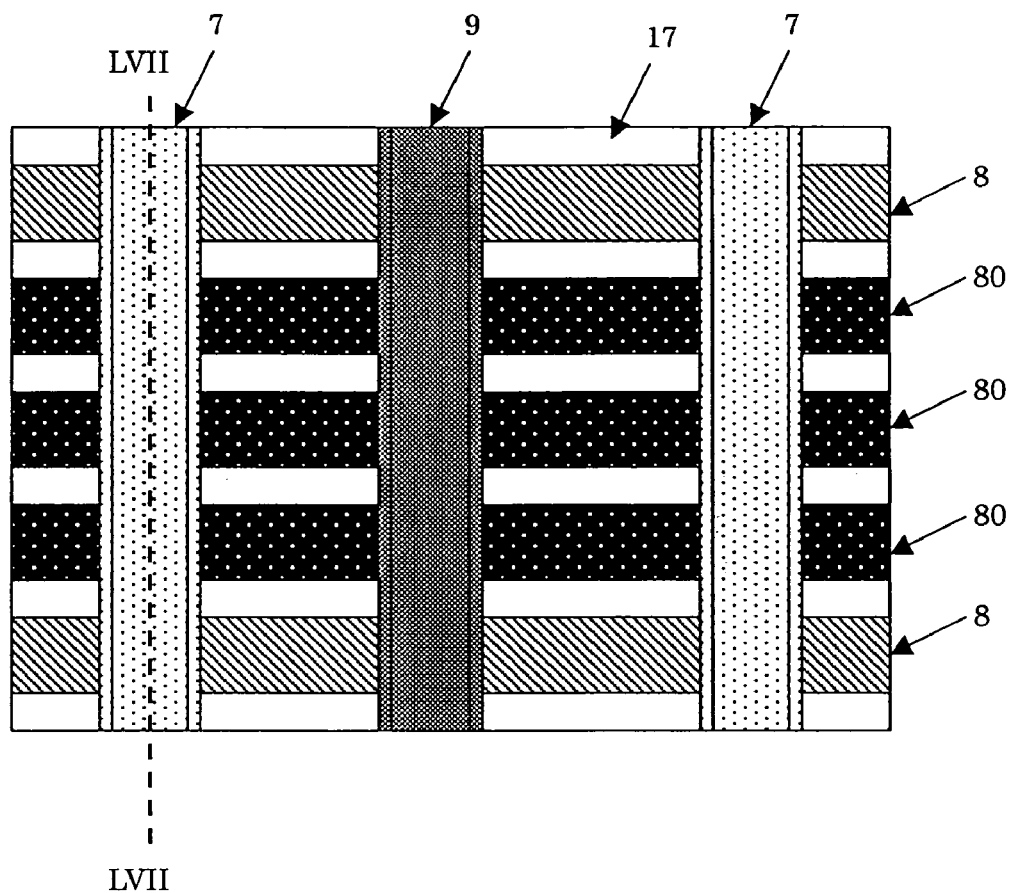
FIG. 56 is a plan view showing another processing step to make the active-matrix substrate of the sixth preferred embodiment of the present invention.
Figure 57:
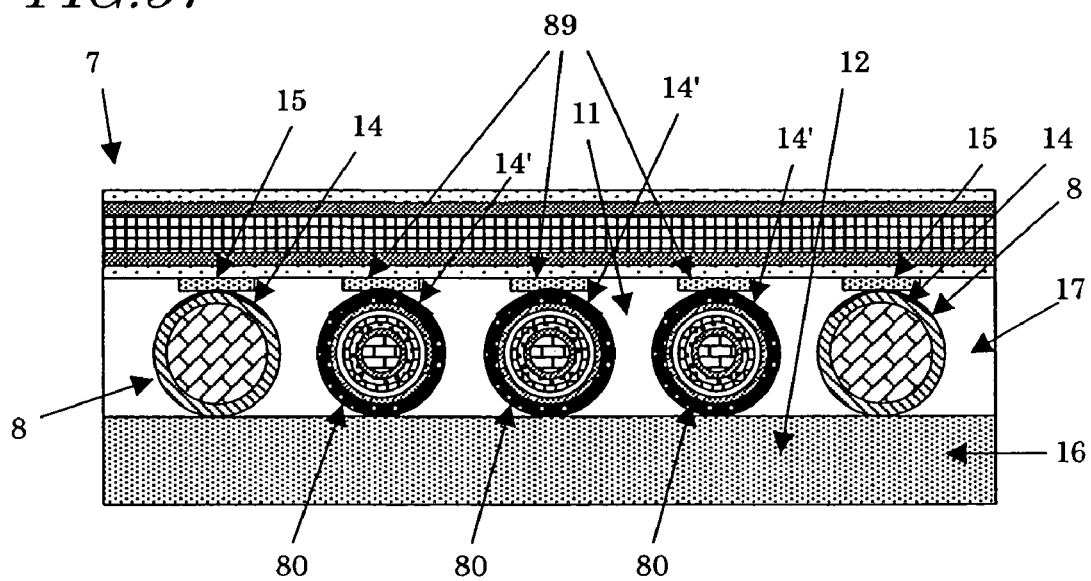
FIG. 57 is a cross-sectional view thereof as viewed along the plane LVII-LVII shown in FIG. 56.

Thereafter, the ohmic contact layer 4 of the function lines 7 is selectively etched away by subjecting the overall network structure 90 to a dry etching process, for example. In this processing step, the first ohmic contact layer 15 is formed by using the connecting portions 14 as a mask as shown in FIGS. 56 and 57. An ohmic contact layer 89 is also left in regions corresponding to the connecting portions 14'.

Figure 58:
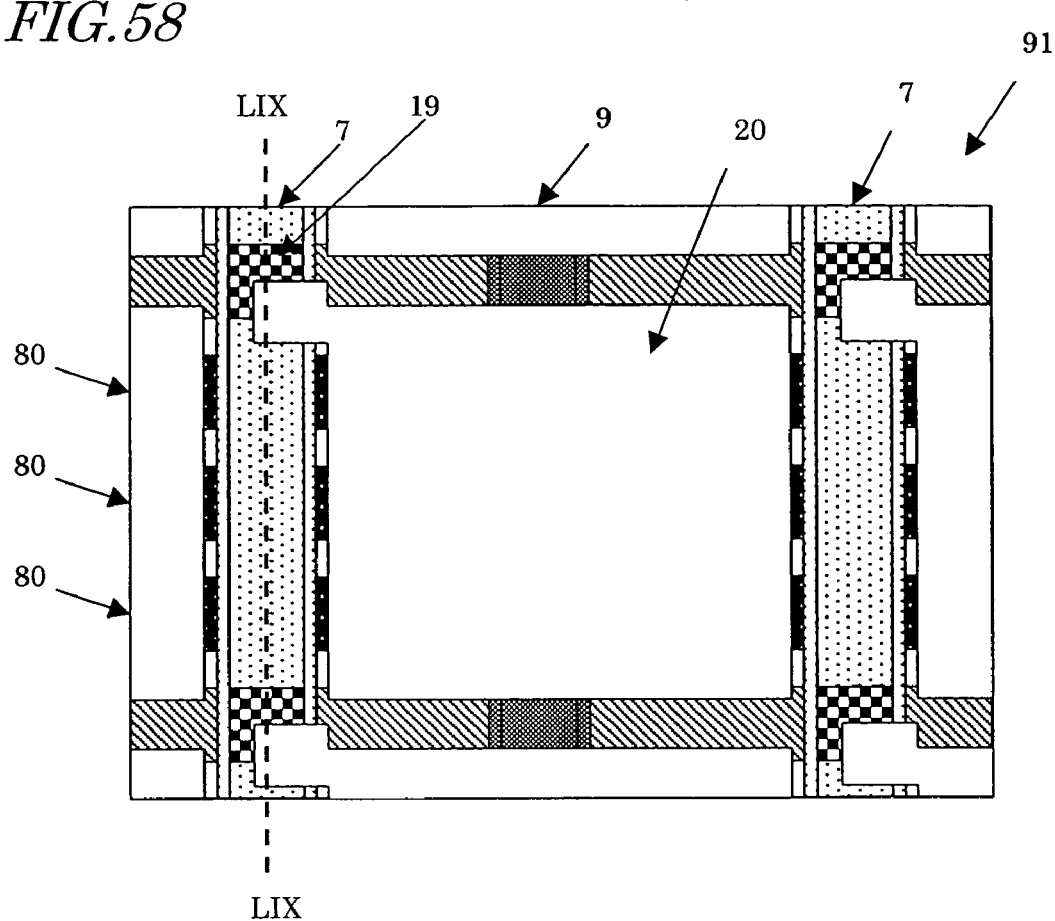
FIG. 58 is a plan view illustrating the active-matrix substrate of the sixth preferred embodiment of the present invention.

Subsequently, the network structure 90 is fixed onto the substrate 16 with the planarizing layer 17 and then the semiconductor layer 3 of the function lines 7 is exposed on the surface of the planarizing layer 17. Finally, the second ohmic contact layer 19 and the pixel electrodes 20 are further formed to obtain an active-matrix substrate 91 as shown in FIG. 58. Although not shown in FIG. 58, an opaque layer or a protective coating may also be provided on the surface of the function lines 7 if necessary.

Generally speaking, an image display device needs the three primary colors of red (R), green (G) and blue (B) to conduct a display operation in full colors. To form a color display device on the active-matrix substrate 91 of this preferred embodiment, at least three illumination lines 80 for red, green and blue (which will be referred to herein as "R illumination line", "G illumination line" and "B illumination line", respectively) need to be prepared by selecting the best combinations of hole transport layer 82, light-emitting layer 83 and electron transport layer 84 to emit light rays in the three primary colors. Thereafter, while the network structure 90 is formed by arranging the source lines 8, function lines 7 and storage capacitor lines 9, the illumination lines 80 that emit the light rays in the three primary colors need to be arranged appropriately. For example, if the source lines 8 have a diameter of about 50 μm and are arranged at a pitch of about 240 μm, then three illumination lines 80 having a diameter of about 50 μm may be arranged at a pitch of about 10 μm between a pair of source lines 8.

Figure 59:
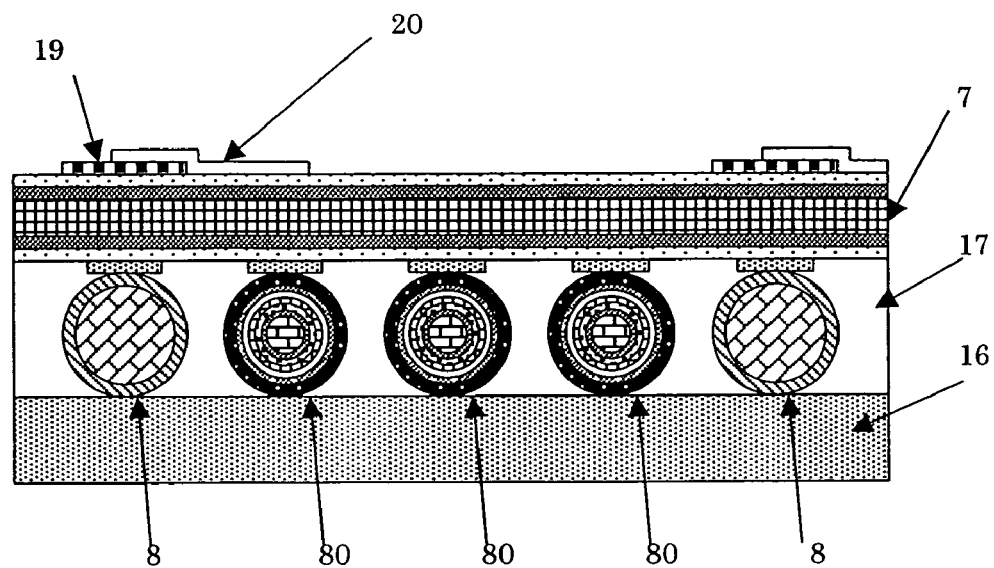
FIG. 59 is a cross-sectional view thereof as viewed along the plane LIX-LIX shown in FIG. 58.

When three groups of pixel electrodes are provided for the three color rays to be emitted, a number of illumination lines 80 to be arranged between a pair of source lines 8 may emit the same color. That is to say, the three illumination lines 80 of the active-matrix substrate 91 shown in FIGS. 58 and 59 may emit a red, green or blue ray in that case. Alternatively, as in a conventional field sequential image display device, three illumination lines 80 for emitting the red, green and blue rays may be arranged under a pixel electrode and the emission of the three color rays may be controlled time-sequentially.

The active-matrix substrate 91 obtained in this manner includes the illumination lines 80. Accordingly, even if the substrate 16 is made of an opaque material, a display device including such an active-matrix substrate 91 can display a bright image at as high a contrast ratio as a conventional transmissive display device. In addition, when EL elements are used as the illumination lines 80, the image display device can display an image with its contrast ratio further increased and with its power dissipation further reduced.

In the preferred embodiment described above, the illumination lines 80 are light-emitting. Alternatively, light-guiding illumination lines 80 may also be used. For example, transparent fine wires of glass or plastic may be prepared as the illumination lines 80. Each of these fine wires preferably has a structure so as to output in a sideward direction the light that was introduced through one end of the fine wire and that has been propagated through the line. For that purpose, the side surface of the fine wire may be roughened, for example. By arranging such illumination lines 80 on the active-matrix substrate 91 and by introducing, through one end of the lines 80, either a light ray in an arbitrary color or red, green and blue light rays that have been emitted from a light source, an excellent image display device is realized as described above.

Various preferred embodiments of the present invention described above, except the second specific preferred embodiment, relate to a transistor array and an active-matrix substrate including the transistor array. The transistor array and active-matrix substrate of any of these preferred embodiments can be used effectively in an image display device such as a liquid crystal display device or an organic EL display device, or other suitable display devices.

In the transistor array and active-matrix substrate according to any of various preferred embodiments of the present invention described above, the network structure including the function lines is fixed onto the substrate with the planarizing layer. However, if the planarizing layer can exhibit an appropriate mechanical strength or flexibility according to the specific application and can support both the network structure and various thin-film circuits thereon, then the transistor array and the active-matrix substrate may have no substrate.

Also, in the transistor array and active-matrix substrate according to any of various preferred embodiments of the present invention described above, the transistor preferably includes the first ohmic contact layer and the second ohmic contact layer. This is because these ohmic contact layers are used to electrically connect the semiconductor layer with the conductive line, the pixel electrode or the like with a low resistivity.

However, in the case where a semiconductor layer can be electrically connected directly to a conductive line or a pixel electrode with a low resistivity, the first ohmic contact layer and the second ohmic contact layer may be omitted. For example, a semiconductor layer made of ZnO can be electrically connected to a layer of Ti, TiO, or other suitable material having a low resistivity. In that case, the first and second ohmic contact layers are successfully omitted.

Figure 60:
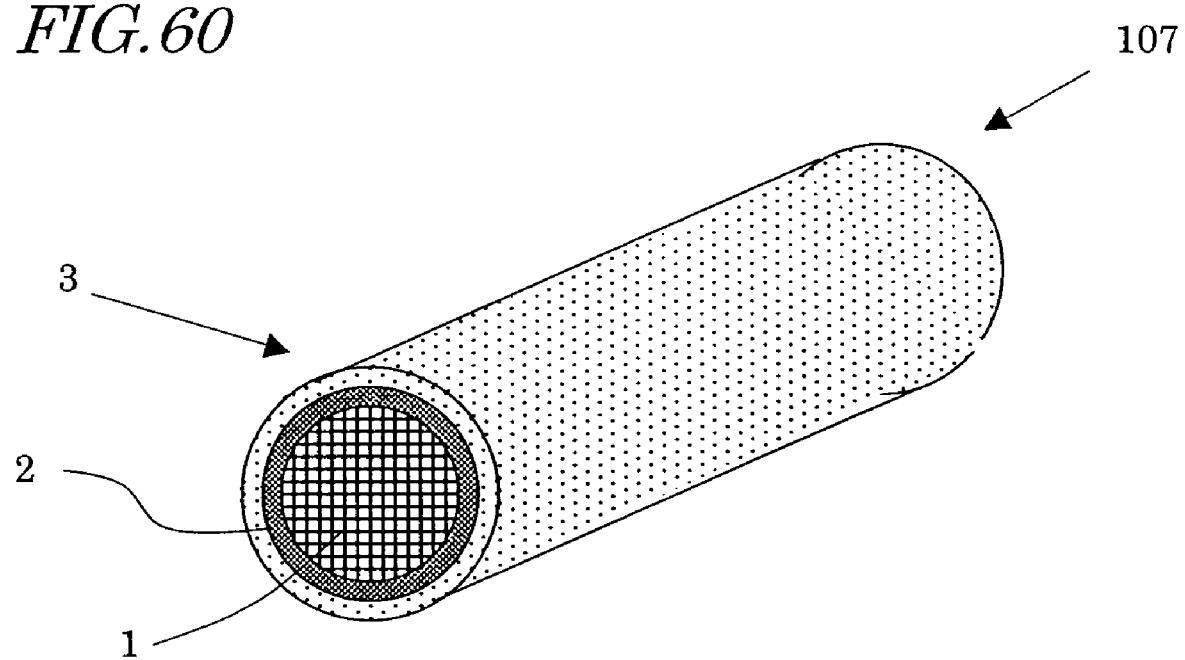
FIG. 60 is a perspective view illustrating the function line for use in yet another preferred embodiment of the present invention.

More specifically, as shown in FIG. 60, a function line 107 having a core 1, an insulating layer 2 and a semiconductor layer 3 is prepared. The semiconductor layer 3 is made of, for example, ZnO in accordance with the first preferred embodiment. Note that an ohmic contact layer 4 used in the first preferred embodiment is omitted in this preferred embodiment shown in FIG. 60. Also, a source line 8 which includes a conductive layer 6 made of, for example, Ti, is preferably prepared.

Figure 61:
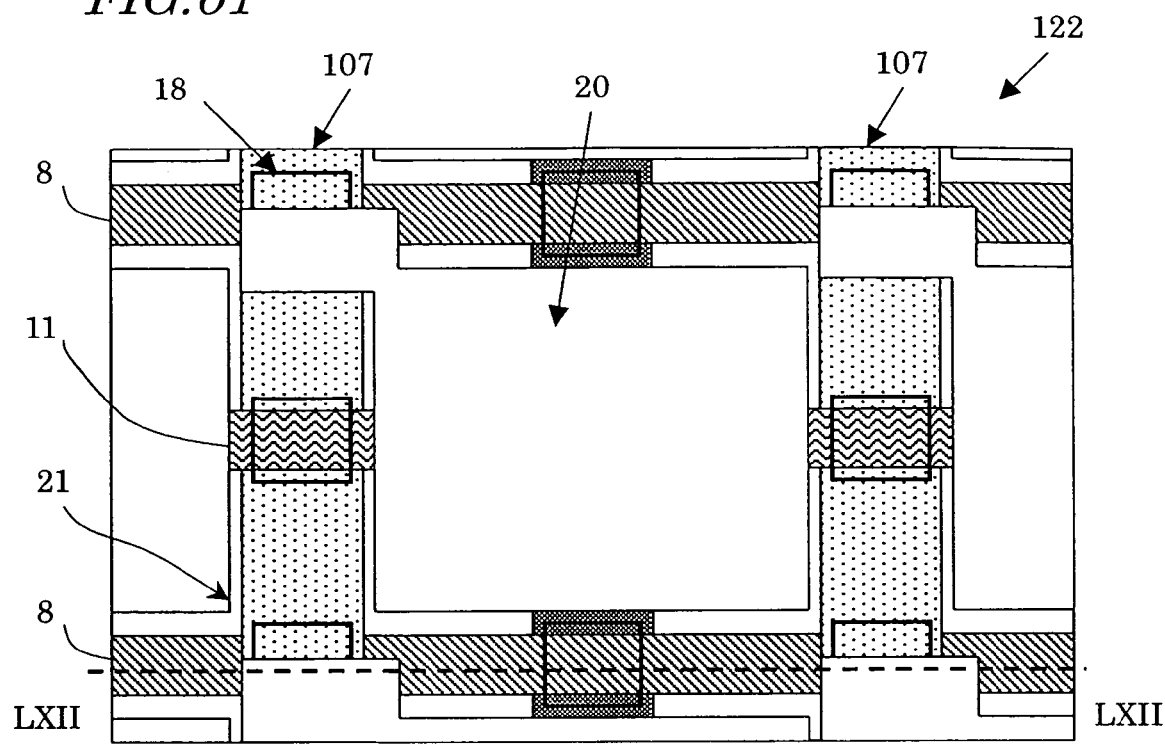
FIG. 61 is a plan view illustrating a modified example of the active-matrix substrate of preferred embodiments of the present invention.
Figure 62:
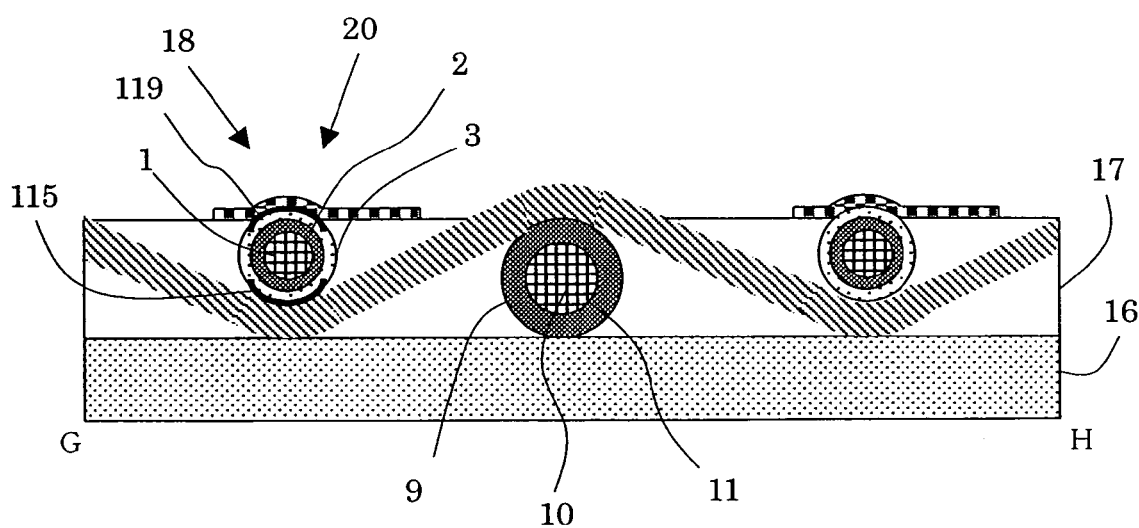
FIG. 62 is a cross-sectional view thereof as viewed along the plane LXII-LXII shown in FIG. 61.

As shown in FIGS. 61 and 62, an active-matrix substrate 122 is formed by using the function line 107 and the source line 8. In the active-matrix substrate 122, the region where the source line 8 crosses and contacts with the function line 107 is a first ohmic contact region 115. The current can flow between the source line 8 and the semiconductor layer 3 of the function line 107 through the first ohmic contact region 115. As mentioned above, the conductive layer 6 made of Ti and the semiconductor layer 3 made of ZnO make a good ohmic contact with a low resistivity. Therefore, a first ohmic contact layer is not required between the function line 107 and the source line 8. In this case, a portion of the conductive layer 6 which is located in the first ohmic contact region 115 acts as a source electrode.

Also, in the active-matrix substrate 122, a pixel electrode 20 is in contact with the semiconductor layer 3 of the function line 107 via the opening 18. The pixel electrode 20 is also preferably made of Ti and therefore, no second ohmic contact layer is necessary between the pixel electrode 20 and the semiconductor layer 3. The region where the pixel electrode 20 contacts with the function line 107 defines a second ohmic contact region 119. The current can flow between the pixel electrode 20 and the semiconductor layer 3 of the function line 107 through the second ohmic contact region 119. In this case, a portion of the pixel electrode 20 which is located in the second ohmic contact region 119 functions as a drain electrode. As explained in the first preferred embodiment, the channel region is defined by and between the first ohmic contact region 115 and the second ohmic contact region 119.

According to the active-matrix substrate 122, it is not necessary to deposit and include the first ohmic contact layer on the semiconductor layer 7 and the second ohmic contact layer on the surface of the substrate 16. Therefore, the active-matrix substrate 122 can be manufactured by a method having fewer production steps. Also, it is not necessary to pattern the second ohmic contact layer by a photolithography process which requires an alignment with respect to the substrate 16. Thus, it is possible to reduce the number of the alignment processes in the production of the active-matrix substrate 122, which can increase a production yield.

Furthermore, the transistor array according to any of various preferred embodiments of the present invention is applicable for use not just in an active-matrix substrate but also in numerous other types of semiconductor devices.

For example, the transistor array may be used as a cell amplifier for a CMOS image sensor. The transistor array according to any of various preferred embodiments of the present invention may also be used in any of numerous types of semiconductor devices including an array of transistors as either switching elements or amplifiers.

Furthermore, function lines functioning as solar cells or CCD sensors may also be formed. Thus, a brand new type of semiconductor device may be obtained by combining these function lines with the transistor array or active-matrix substrate according to any of various preferred embodiments of the present invention. For example, an image pickup device may be obtained by arranging function lines, functioning as CCD sensors, adjacent to an image display device that uses the active-matrix substrate according to a preferred embodiment of the present invention. Furthermore, driver circuits as described for the third preferred embodiment and function lines functioning as solar cells are arranged around the image display device and the image pickup device. A semiconductor device having such a structure realizes an image display and image pickup device that can operate for a long time without using any external batteries. It has been difficult to realize such a composite semiconductor device, having two totally different structures and using two completely different types of thin films (e.g., semiconductor layers, in particular), by the conventional process. However, such a composite semiconductor device is also easily realizable by using the function lines, transistor array and active-matrix substrate according to preferred embodiments of the present invention.

In the transistor array, active-matrix substrate and method for fabricating the transistor array according to various preferred embodiments of the present invention described above, a transistor including a highly electrically insulating layer and a semiconductor layer having a high electron mobility, which have been formed at high temperatures, may be provided on a substrate of which the highest resistible temperature is relatively low. Accordingly, by using a substrate of a plastic, for example, for the transistor array or active-matrix substrate, a flexible transistor array or active-matrix substrate is realizable.

In addition, one of the two ohmic contact layers for a transistor to be formed on a function line is formed by using a portion of a conductor line as a mask, and automatically and inherently aligned with a region in which the conductor line intersects with the function line. Thus, a transistor array, in which a huge number of transistors are arranged in a regular pattern, can be formed easily without causing any misalignment between the transistors and source lines.

Furthermore, the conductor lines and the function lines are supported by a network structure. Accordingly, even if the substrate has expanded or shrunk, the network structure is not significantly affected by such expansion or shrinkage. Thus, misalignment due to the expansion or shrinkage of the substrate is prevented.

Also, fixing jigs according to a preferred embodiment of the present invention can be used effectively to make the network structure by fixing the conductor lines and function lines with a substantially constant tension applied thereto.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A transistor comprising:
   a conductive core wire having at least a conductive surface;
   an insulating layer covering the conductive surface;
   a semiconductor layer covering the insulating layer; and
   a first ohmic contact region and a second ohmic contact region arranged so as to contact the semiconductor layer, the first ohmic contact region and the second ohmic contact region are arranged on the conductive core wire such that, in a radial cross-section view of the conductive wire, the first ohmic contact region and the second ohmic contact region are located on opposite sides of the conductive core wire; wherein
   the insulating layer covers the conductive core wire entirely and the semiconductor layer covers the insulating layer entirely; and
   the conductive core wire has a circular cross section.

2. The transistor of claim 1, wherein the first ohmic contact region and the second ohmic contact region define a channel region in the semiconductor layer therebetween.

3. The transistor of claim 1, wherein the conductive core wire has a diameter of about 10 μm to about 300 μm.

4. A transistor array comprising:
   a plurality of conductor lines, each of which has a conductive surface;
   a plurality of function lines, each of the function lines including a core, at least the surface of the core being electrically conductive, an insulating layer that covers the surface of the core, and a semiconductor layer that covers the surface of the insulating layer, each of the function lines contacting with, and crossing, the conductor lines; and
   a plurality of transistors; wherein
   each of the function lines has a circular cross section; and
   each of the transistors includes a first ohmic contact region, which is defined by a region where one of the conductor lines crosses a respective one of the function lines, a second ohmic contact region, and a channel region, which is defined in the semiconductor layer by the first and second ohmic contact regions, the first ohmic contact region and the second ohmic contact region are arranged on the function line such that, in a radial cross-section view of the function line, the first ohmic contact region and the second ohmic contact region are located on opposite sides of the conductive core wire.

5. A transistor array of claim 4, wherein the first ohmic contact region is self-aligned with the one of the conductor lines.

6. The transistor array of claim 4, further comprising a plurality of storage capacitor lines and a plurality of dummy lines, wherein the function lines and the storage capacitor lines are woven with at least one of the plurality of conductor lines and the plurality of dummy lines.

7. A display device comprising:
   an active-matrix substrate provided with a plurality of reference voltage lines and a plurality of function lines, each of the plurality of function lines including:
      a core, at least the surface of which is electrically conductive;
      an insulating layer that covers the surface of the core; and
      a semiconductor layer that covers the surface of the insulating layer, wherein the semiconductor layer is not patterned; and
   a counter substrate provided with signal lines; wherein
   the active-matrix substrate and the counter substrate are arranged such that the functional lines are substantially perpendicular to the reference voltage lines;
   at least the surfaces of the reference voltage lines are electrically conductive; and
   the function lines and the reference voltage lines are woven together such that:
      for each reference voltage line, some of the function lines contact a top portion of the reference voltage line and some of the function lines contact a bottom portion of the reference voltage line; and
      for each function line some of the reference voltage lines contact a top portion of the function line and some of the reference voltage lines contact a bottom portion of the function line.

8. The display device of claim 7, wherein the semiconductor layer is made of a material that is capable of forming an ohmic contact region when in contact with one of the reference voltage lines.

* * * * *

UNITED STATES PATENT AND TRADEMARK OFFICE
CERTIFICATE OF CORRECTION

PATENT NO. : 7,586,131 B2  Page 1 of 1
APPLICATION NO. : 11/042406
DATED : September 8, 2009
INVENTOR(S) : Nishiki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 401 days.

Signed and Sealed this

Fourteenth Day of September, 2010

David J. Kappos
*Director of the United States Patent and Trademark Office*